United States Patent
Aridomi et al.

(10) Patent No.: US 10,649,331 B2
(45) Date of Patent: May 12, 2020

(54) COMPOSITION FOR FORMING TOUCH PANEL ELECTRODE PROTECTIVE FILM, TRANSFER FILM, LAMINATE, PROTECTIVE FILM FOR TOUCH PANEL ELECTRODE AND METHOD FOR FORMING SAME, CAPACITIVE INPUT DEVICE, AND IMAGE DISPLAY DEVICE

(71) Applicant: FUJIFILM Corporation, Tokyo (JP)

(72) Inventors: Takashi Aridomi, Fujinomiya (JP); Kentaro Toyooka, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 291 days.

(21) Appl. No.: 15/427,132

(22) Filed: Feb. 8, 2017

(65) Prior Publication Data

US 2017/0146905 A1    May 25, 2017

Related U.S. Application Data

(63) Continuation of application No. PCT/JP2015/073344, filed on Aug. 20, 2015.

(30) Foreign Application Priority Data

Aug. 29, 2014  (JP) .................................. 2014-176553

(51) Int. Cl.
  *G03F 7/033*  (2006.01)
  *G06F 3/044*  (2006.01)
  (Continued)

(52) U.S. Cl.
  CPC ............... *G03F 7/033* (2013.01); *C09D 4/00* (2013.01); *G03F 7/027* (2013.01); *G03F 7/031* (2013.01);
  (Continued)

(58) Field of Classification Search
  CPC .......... G03F 7/027; G03F 7/031; G03F 7/033; G03F 7/028; G03F 7/032; G06F 3/041;
  (Continued)

(56) References Cited

U.S. PATENT DOCUMENTS

2014/0335350 A1  11/2014 Tanaka et al.
2014/0363767 A1  12/2014 Murakami et al.
2015/0251393 A1   9/2015 Kanna et al.

FOREIGN PATENT DOCUMENTS

JP    2006-095929 A  *  4/2006
JP    2007-018869 A  *  1/2007
(Continued)

OTHER PUBLICATIONS

Computer-generated translation of JP 2007-018869 (Jan. 2007). (Year: 2007).*
(Continued)

*Primary Examiner* — John A McPherson
(74) *Attorney, Agent, or Firm* — Sughrue Mion, PLLC

(57) ABSTRACT

The composition includes a compound represented by Formula 1, a binder polymer, and a photopolymerization initiator, in Formula 1, $Q^1$ and $Q^2$ each independently represent a (meth)acryloyloxy group or a (meth)acryloyloxyalkyl group; and $R^1$ represents a divalent hydrocarbon group.

$$Q^2\text{-}R^1\text{-}Q^1 \qquad (1)$$

22 Claims, 9 Drawing Sheets

(51) Int. Cl.

| | | |
|---|---|---|
| *C09D 4/00* | (2006.01) | |
| *G03F 7/027* | (2006.01) | |
| *G06F 3/041* | (2006.01) | |
| *G03F 7/032* | (2006.01) | |
| *G03F 7/031* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |

(52) U.S. Cl.
CPC ............ *G03F 7/032* (2013.01); *G03F 7/16* (2013.01); *G03F 7/2002* (2013.01); *G03F 7/327* (2013.01); *G03F 7/40* (2013.01); *G06F 3/041* (2013.01); *G06F 3/044* (2013.01); *G06F 3/0412* (2013.01); *G06F 2203/04103* (2013.01); *G06F 2203/04111* (2013.01)

(58) Field of Classification Search
CPC ............ G06F 3/0412; G06F 3/044; G06F 2203/04103; G06F 2203/04111
USPC ...................................................... 430/281.1
See application file for complete search history.

(56) References Cited

FOREIGN PATENT DOCUMENTS

| JP | 2009-217040 A | | 9/2009 |
|---|---|---|---|
| JP | 2009-237420 A | | 10/2009 |
| JP | 2012-226146 A | | 11/2012 |
| JP | 2013-076791 A | * | 4/2013 |
| JP | 2013-83996 A | | 5/2013 |
| JP | 2013-145284 A | | 7/2013 |
| JP | 5304973 B1 | | 10/2013 |
| JP | 2014 065850 A | * | 4/2014 |
| JP | 2014-108541 A | | 6/2014 |
| JP | 2014152197 A | | 8/2014 |
| JP | 5720395 B2 | | 5/2015 |
| WO | 2013/084883 A1 | | 6/2013 |
| WO | 2013084282 A1 | | 6/2013 |
| WO | 2014/084112 A1 | | 6/2014 |
| WO | 2014/123073 A1 | | 8/2014 |

OTHER PUBLICATIONS

Computer-generated translation of JP 2013-076791 (Apr. 2013). (Year: 2013).*
Computer-generated translation of JP 2006-095929 (Apr. 2006). (Year: 2006).*
Computer-generated translation of JP 2014-065850 (Apr. 2014). (Year: 2014).*
Written Opinion of the International Searching Authority of PCT/JP2015/073344 dated Nov. 17, 2015.
International Search Report of PCT/JP2015/073344 dated Nov. 17, 2015.
Communication dated Jun. 6, 2017 issued by the Japanese Patent Office in counterpart application No. 2015-160639.
Communication dated May 17, 2018 from State Intellectual Property Office of the P.R.C. in counterpart application No. 201580042870.8.
International Preliminary Report on Patentability and Written Opinion, dated Feb. 28, 2017, in corresponding International Application No. PCT/JP2015/073344, 18 pages in English and Japanese.
Communication dated Feb. 3, 2019 from the State Intellectual Property Office of the P.R.C. in application No. 201580042870.8.
Communication dated Nov. 29, 2018, from the Taiwan Patent Office in counterpart application No. 104127796.

* cited by examiner

COMPOSITION FOR FORMING TOUCH PANEL ELECTRODE PROTECTIVE FILM, TRANSFER FILM, LAMINATE, PROTECTIVE FILM FOR TOUCH PANEL ELECTRODE AND METHOD FOR FORMING SAME, CAPACITIVE INPUT DEVICE, AND IMAGE DISPLAY DEVICE

CROSS-REFERENCE TO RELATED APPLICATIONS

This application is a Continuation of PCT International Application No. PCT/JP2015/073344 filed on Aug. 20, 2015, which claims priority under 35 U.S.C § 119(a) to Japanese Patent Application No. 2014-176553 filed on Aug. 29, 2014. Each of the above application(s) is hereby expressly incorporated by reference, in its entirety, into the present application.

BACKGROUND OF THE INVENTION

1. Field of the Invention

The present invention relates to a composition for forming a touch panel electrode protective film, a transfer film, a laminate, a protective film for a touch panel electrode, a method for forming the protective film, a capacitive input device, and an image display device.

2. Description of the Related Art

In recent years, it has been suggested, in regard to capacitive input devices (touch panels), to form a transparent resin layer having a high refractive index on a transparent electrode pattern, in view of lowering visibility of the transparent electrode.

For example, the curable transparent resin layer described in JP2014-108541A is known.

Furthermore, it has been suggested to laminate a transfer material on a substrate at the time of producing a capacitive input device. For example, the transfer film and photosensitive sheet described in JP2014-108541A or JP5304973B are known.

Also, regarding an insulating material for a printed wiring board, or a curable composition used for forming a color filter or the like, the compositions described in JP2013-145284A, JP2009-217040A, and JP2009-237420A are known.

SUMMARY OF THE INVENTION

In regard to the formation of a protective layer for an electrode pattern for a touch panel, in order to suppress corrosion of copper wiring and the like, various methods for ameliorating the resistance to moist heat obtainable after salt water application (perspiration resistance) have been investigated. Investigations have been hitherto conducted on polymerizable functional groups or polymerization initiators; however, sufficient effects have not been obtained.

JP2014-108541A and JP5304973B disclose methods for forming an insulating layer, a protective layer or the like using a transfer film or a photosensitive sheet; however, disclosure concerning the hydrothermal resistance obtainable after salt water application is insufficient.

An object to be solved by the present invention is to provide a composition for forming a touch panel electrode protective film, the composition capable of providing a protective film for a touch panel electrode having excellent hydrothermal resistance obtainable after salt water application; a transfer film; a laminate; and a method for forming a protective film for a touch panel electrode.

Furthermore, another object to be solved by the invention is to provide a protective film for a touch panel electrode, which is produced using the composition for forming a touch panel electrode protective film, the transfer film, and the method for forming a protective film for a touch panel electrode; a capacitive input device; and an image display device comprising such a capacitive input device as a constituent element.

The inventors of the present invention conducted a thorough investigation, and as a result, the resistance to moist heat obtainable after salt water application could be further ameliorated by incorporating a compound represented by Formula 1, a binder polymer, and a photopolymerization initiator into the composition.

The objects of the invention described above have been addressed by the means described in the following items <1>, <6> or <8> to <13>. These means will be described below together with items <2> to <5> and <7>, which are preferred embodiments.

<1> A composition for forming a touch panel electrode protective film, comprising a compound represented by Formula 1 as Component A; a binder polymer as Component B; and a photopolymerization initiator as Component C:

$$Q^2\text{-}R^1\text{-}Q^1 \quad (1)$$

in Formula 1, $Q^1$ and $Q^2$ each independently represent a (meth)acryloyloyloxy group or a (meth)acryloyloxyalkyl group; $R^1$ represents a divalent hydrocarbon group.

<2> The composition for forming a touch panel electrode protective film according to <1>, in which the I/O value of Component A is 0.6 or less.

<3> The composition for forming a touch panel electrode protective film according to <1> or <2>, in which $R^1$ represents a hydrocarbon group having 1 to 12 carbon atoms.

<4> The composition for forming a touch panel electrode protective film according to any one of <1> to <3>, in which the content of Component A is 50% to 90% by mass with respect to the total mass of monomer components in the composition.

<5> The composition for forming a touch panel electrode protective film according to any one of <1> to <4>, in which the content of Component A is 55% to 80% by mass with respect to the total mass of monomer components in the composition.

<6> A transfer film comprising a temporary support; and a photosensitive transparent resin layer formed of the composition for forming a touch panel electrode protective film according to any one of <1> to <5>.

<7> The transfer film according to <6>, further comprising a second transparent resin layer on the photosensitive transparent resin layer, in which the refractive index of the second transparent resin layer is higher than the refractive index of the photosensitive transparent resin layer.

<8> A laminate comprising a base material; a touch panel electrode disposed on the base material; a second transparent resin layer disposed on the touch panel electrode; and a photosensitive transparent resin layer disposed on the second transparent resin layer, in which the photosensitive transparent resin layer is a layer obtained by curing the composition for forming a touch panel electrode protective film according to any one of <1> to <5>, and the refractive index of the second transparent resin layer is higher than the refractive index of the photosensitive transparent resin layer.

<9> A method for forming a protective film for a touch panel electrode, the method comprises providing a photosensitive transparent resin layer formed of the composition for forming a touch panel electrode protective film according to any one of <1> to <5> on a base material having a touch panel electrode; exposing at least a portion of the photosensitive transparent resin layer with active light rays; and developing the exposed photosensitive transparent resin layer, in this order.

<10> A method for forming a protective film for a touch panel electrode, the method comprises providing a photosensitive transparent resin layer using the transfer film according to <6> or <7> on a base material having a touch panel electrode; exposing at least a portion of the photosensitive transparent resin layer with active light rays; and developing the exposed photosensitive transparent resin layer, in this order.

<11> A protective film for a touch panel electrode, which is produced by the method for forming a protective film for a touch panel electrode according to <9> or <10>.

<12> A capacitive input device comprising the laminate according to <8>, or the protective film for a touch panel electrode according to <11>.

<13> An image display device comprising the capacitive input device according to <12> as a constituent element.

According to the invention, a composition for forming a touch panel electrode protective film, with which a protective film for a touch panel electrode having excellent resistance to moist heat obtainable after salt water application is obtained, a transfer film, a laminate, and a method for forming a protective film for a touch panel electrode can be provided.

Furthermore, according to the invention, a protective film for a touch panel electrode, the protective film being produced using the composition for forming a touch panel electrode protective film, the transfer film, and the method for forming a protective film for a touch panel electrode; a capacitive input device; and an image display device comprising such a capacitive input device as a constituent element, can be provided.

DESCRIPTION OF THE PREFERRED EMBODIMENTS

Figure 1A:
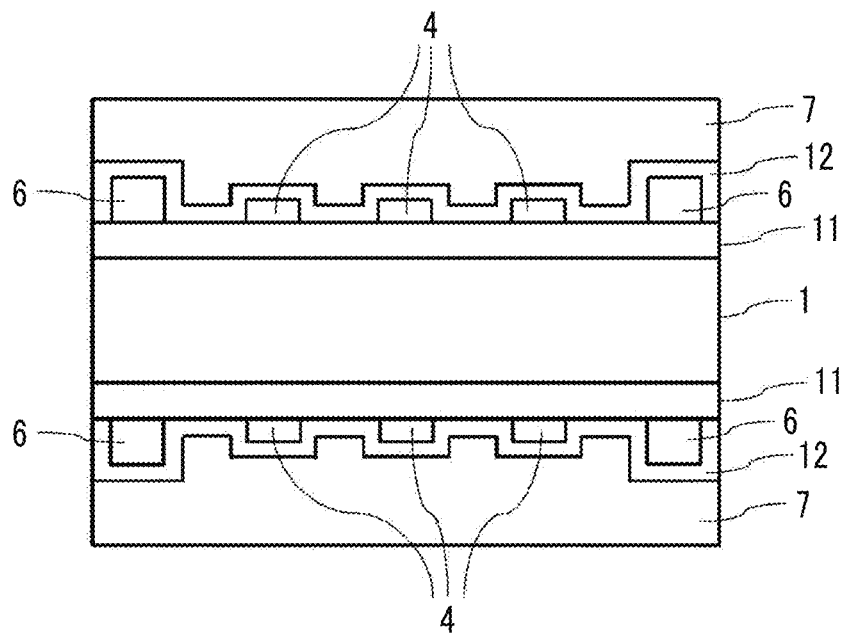
FIG. 1A is a schematic cross-sectional view illustrating an example of the configuration of a capacitive input device of the invention.

The subject matters of the invention will be described in detail below. Explanation of the configuration requirements described below is based on representative embodiments of the invention; however, the invention is not intended to be limited to those embodiments. The expression "to" as used in the present specification is used to mean to include the numerical values described before and after "to" as a lower limit and an upper limit, respectively. Also, an organic EL element according to the present invention refers to an organic electroluminescence element.

In regard to the description of a group (atomic group) according to the present specification, a description without the indication of being substituted or unsubstituted is meant to include a group that does not have a substituent as well as a group having a substituent. For example, the term "alkyl group" is to include an alkyl group having no substituent (unsubstituted alkyl group) as well as an alkyl group having a substituent (substituted alkyl group).

According to the present specification, the term "(meth) acrylate" represents acrylate and methacrylate; the term "(meth)acryl" represents acryl and methacryl; and the term "(meth)acryloyl" represents acryloyl and methacryloyl.

Furthermore, according to the invention, the units "% by mass" and "% by weight" have the same meaning, and the units "parts by mass" and "parts by weight" have the same meaning.

According to the invention, a combination of preferred embodiments is more preferred.

According to the invention, in regard to a polymer component, the molecular weight is a weight-average molecular weight that is measured by gel permeation chromatography (GPC) in the case of using tetrahydrofuran (THF) as a solvent, and calculated relative to polystyrene standards.

(Composition for Forming Touch Panel Electrode Protective Film)

The composition for forming a touch panel electrode protective film of the invention (hereinafter, may be simply referred to as "composition") includes a compound represented by Formula 1 as Component A; a binder polymer as Component B; and a photopolymerization initiator as Component C:

in Formula 1, $Q^1$ and $Q^2$ each independently represent a (meth)acryloyloxy group or a (meth)acryloyloxyalkyl group; and $R^1$ represents a divalent hydrocarbon group.

Component A: Compound Represented by Formula 1

The composition for forming a touch panel electrode protective film of the invention includes a compound represented by Formula 1 as Component A:

In Formula 1, $Q^1$ and $Q^2$ each independently represent a (meth)acryloyloxy group or a (meth)acryloyloxyalkyl group; and from the viewpoint of the ease of synthesis, it is preferable that $Q^1$ and $Q^2$ represent the same groups.

$R^1$ represents a divalent hydrocarbon group, preferably a hydrocarbon group having 1 to 20 carbon atoms, and more preferably a hydrocarbon group having 1 to 10 carbon atoms. The hydrocarbon group may be any one of a linear group, a branched group, a cyclic group, and a combination thereof, and the hydrocarbon group is preferably an alkylene group or an arylene group, and more preferably an alkylene group.

The I/O value of Component A is preferably 0.6 or less, and more preferably 0.5 or less.

The I/O value is a value that handles the polarity of various organic compounds in view of organic conception, while the value is also called (inorganicity value)/(organicity value), and the I/O value is one of functional group contribution methods that set parameters for each functional group. The details of the I/O value are explained in detail in documents such as Yuki Gainen-Zu (Organic Conception Diagram) (written by Yoshio Koda, Sankyo Shuppan Co., Ltd. (1984)); Kumamoto Pharmaceutical Bulletin, No. 1, pp. 1-16 (1954); Kagaku no Ryoiki (Realm of Chemistry), Vol. 11, No. 10, pp. 719-725 (1957); Fragrance Journal, No. 34, pp. 97-111 (1979); and Fragrance Journal, No. 50, pp. 79-82 (1981).

The I/O value represents a concept that divides the properties of a compound into organic groups representing covalent bonding properties, and inorganic groups representing ionic bonding properties, and evaluating all organic compounds at one point each on the Cartesian coordinates named an organic axis and an inorganic axis.

The inorganicity value is a value obtained by digitizing the extent of influence of various substituents or bonds carried by an organic compound on the boiling point, in terms of hydroxyl groups. Specifically, when the distance between the boiling point curve of straight-chained alcohols and the boiling point curve of linear paraffin is taken in the vicinity of a carbon number of 5, the distance is about 100° C. Therefore, the influence of one hydroxyl group is defined as a value of 100, and a value obtained by digitizing the influence of various substituents or various bonds on the boiling point on the boiling point, based on the value of influence, represents the inorganicity value of the substituent carried by an organic compound. For example, the inorganicity value of a —COOH group is 150, and the inorganicity value of a double bond is 2. Therefore, an inorganicity value of a certain kind of organic compound means the sum of the inorganicity values of various substituents or bonds carried by the compound.

The organicity value is determined on the basis of a methylene group in the molecule as a unit, and is determined based on the influence of the boiling point of the carbon atom representing the methylene group. That is, since the average value of an increase in boiling point caused by adding one carbon atom in the vicinity of a carbon number of 5 to 10 of a linear saturated hydrocarbon compound is 20° C. the organicity value of one carbon atom is defined as 20 based on the average value, and a value obtained by digitizing the influence of various substituents, bonds and the like on the boiling point, based on the organicity value of one carbon atom, represents the organicity value. For example, the organicity value of a nitro group (—NO₂) is 70.

As the I/O value is closer to zero (0), it is implied that the compound is a non-polar (hydrophobic, of high organicity) organic compound, and as the I/O value is larger, it is implied that the compound is a polar (hydrophilic, of high inorganicity) organic compound.

In the following description, the method for calculating the I/O value will be described by taking tricyclodecanedimethanol diacrylate as an example.

The I/O value of tricyclodecanedimethanol diacrylate can be determined by calculating the inorganicity value and the organicity value by the following method, and calculating the ratio (inorganicity value)/(organicity value).

Since tricyclodecanedimethanol diacrylate has 18 carbon atoms, the organicity value of tricyclodecanedimethanol diacrylate is calculated to be 20 (organicity value of a carbon atom)×18=360.

Since tricyclodecanedimethanol diacrylate has two ester bonds and two double bonds, the inorganicity value of tricyclodecanedimethanol diacrylate is calculated to be 60 (inorganicity value of an ester bond)×2+2 (inorganicity value of a double bond)×2=124.

From the above results, the I/O value of tricyclodecanedimethanol diacrylate is calculated to be 124/360=0.35.

The content of Component A is preferably 50% to 90% by mass, and more preferably 55% to 80% by mass, with respect to the total mass of monomer components in the composition.

A monomer component refers to a compound having a (weight-average) molecular weight of 10,000 or less and having a polymerizable group.

When the content of Component A is in the above-described range, shrinkage of the photosensitive transparent resin layer does not easily occur at the time of curing, and excellent adhesiveness is obtained, which is preferable.

Furthermore, the content of Component A is preferably 1% to 30% by mass, and more preferably 5% to 20% by mass, with respect to the total solid content in the composition. The total solid content in the composition represents the amount excluding volatile components such as a solvent.

Specific examples of Component A include 1,3-butanediol di(meth)acrylate, tetramethylene glycol di(meth)acrylate, neopentyl glycol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 1,10-decanediol di(meth)acrylate, 1,4-cyclohexanediol di(meth)acrylate, tricyclodecanedimethanol di(meth)acrylate, di(meth)acrylate of hydrogenated bisphenol A, and di(meth)acrylate of hydrogenated bisphenol F. The ester monomers described above can also be used as mixtures.

Among the compounds described above, tricyclodecanedimethanol di(meth)acrylate, 1,6-hexanediol di(meth)acrylate, 1,9-nonanediol di(meth)acrylate, 1,10-decanediol di(meth)acrylate, and neopentyl glycol di(meth)acrylate are preferably used.

Component A may be used singly, or two or more kinds thereof may be used in combination.

Component B: Binder Polymer

The composition for forming a touch panel electrode protective film of the invention includes a binder polymer as Component B.

The binder polymer is not particularly limited as long as there is no effect contradictory to the purport of the invention, and the binder polymer can be appropriately selected from known compounds. An alkali-soluble resin is preferred, and as the alkali-soluble resin, the polymers described in paragraph 0028 to paragraph 0070 of JP2008-146018A, paragraph 0025 of JP2011-95716A, and paragraphs 0033-0052 of JP2010-237589 can be used. Among them, an acrylic polymer having an acidic group is preferred.

Component B may be used singly, or two or more kinds thereof may be used in combination.

The content of Component B is preferably 30% to 90% by mass, and more preferably 40% to 90% by mass, with respect to the total solid content in the composition.

The weight-average molecular weight of Component B is preferably 10.000 or more.

Component C: Photopolymerization Initiator

The composition for forming a touch panel electrode protective film of the invention includes a photopolymerization initiator as Component C.

The photopolymerization initiator is preferably a photoradical polymerization initiator.

The photoradical polymerization initiator is not particularly limited, and any known agent can be used.

Regarding specific examples of the photoradical polymerization initiator, the photopolymerization initiators described in paragraphs 0031 to 0042 of JP2011-95716A can be used. For example, 1,2-octanedione, 1-[4-(phenylthio)-, 2-(O-benzoyloxime)] (trade name: IRGACURE OXE-01, manufactured by BASF SE), as well as ethanone, 1-[9-ethyl-6-(2-methylbenzoyl)-9H-carbazol-3-yl]-, 1-(O-acetyloxime) (trade name: IRGACURE OXE-02, manufactured by BASF SE), 2-(dimethylamino)-2-[(4-methylphenyl) methyl]-1-[4-(4-morpholinyl)phenyl]-1-butanone (trade name: IRGACURE 379EG, manufactured by BASF SE), 2-methyl-1-(4-methylthiophenyl)-2-morpholinopropan-1-one (trade name: IRGACURE 907, manufactured by BASF SE), 2-hydroxy-1-{4-[4-(2-hydroxy-2-methyl-propionyl)-benzyl]phenyl}-2-methyl-propan-1-one (trade name: IRGACURE 127, manufactured by BASF SE), 2-benzyl-2-dimethylamino-1-(4-morpholinophenyl)-butanone-1 (trade name: IRGACURE 369, manufactured by BASF SE), 2-hydroxy-2-methyl-1-phenyl-propan-1-one (trade name: IRGACURE 1173, manufactured by BASF SE), 1-hydroxy-cyclohexyl phenyl ketone (trade name: IRGACURE 184, manufactured by BASF SE), 2,2-dimethoxy-1,2-diphenylethan-1-one (trade name: IRGACURE 651, manufactured by BASF SE), and an oxime ester-based photoradical polymerization initiator (trade name: Lunar 6, manufactured by DKSH Japan K.K.) can be preferably used.

Component C may be used singly, or two or more kinds thereof may be used in combination.

The content of Component C is preferably 0.1% to 10% by mass, and more preferably 0.2% to 5% by mass, with respect to the total solid content in the composition.

Component D: Polymerizable Compound Having Three or More Polymerizable Groups

It is preferable that the composition for forming a touch panel electrode protective film of the invention includes a polymerizable compound having three or more polymerizable groups, as Component D.

Component D is preferably a radical polymerizable compound.

The polymerizable group is preferably a (meth)acryloyloxy group or a (meth)acrylyloxyalkyl group.

Preferred examples of Component D include the urethane (meth)acrylates described in JP1973-41708B (JP-S48-41708B) JP1975-6034B (JP-S50-6034B) and JP1976-37193A (JP-S51-37193A); the polyester (meth)acrylates described in JP1973-64183A (JP-S48-64183A), JP1974-43191B (JP-S49-43191B), and JP1977-30490B (JP-S52-30490B); and polyfunctional (meth)acrylates such as epoxy (meth)acrylates which are reaction products between epoxy resins and (meth)acrylic acid. Urethane acrylate is preferred.

The content of Component D is preferably 0.1% to 15% by mass, and more preferably 1% to 10% by mass, with respect to the total solid content in the composition.

The weight-average molecular weight of Component D is preferably 10,000 or less.

Component E: Solvent

It is preferable that the composition for forming a touch panel electrode protective film of the invention includes a solvent as Component E.

Regarding the solvent, any general organic solvent can be used without any particular limitations, and examples thereof include methyl ethyl ketone, propylene glycol monomethyl ether, propylene glycol monomethyl ether acetate, cyclohexanone, methyl isobutyl ketone, toluene, xylene, ethyl acetate, butyl acetate, ethyl lactate, methyl lactate, and caprolactam.

<Other Additives>

The composition for forming a touch panel electrode protective film of the invention may also use other additives. Examples of the additives mentioned above include the surfactants described in paragraph 0017 of JP4502784B and paragraphs 0060 to 0071 of JP2009-237362A; the thermal polymerization inhibitors described in paragraph 0018 of JP4502784B, and other additives described in paragraphs 0058 to 0071 of JP2000-310706A.

<Viscosity of Composition>

It is preferable that the viscosity of the composition for forming a touch panel electrode protective film as measured at 100° C. is in the range of 2,000 to 50,000 Pa·sec.

Here, the viscosity of the composition can be measured as follows. A measurement sample is produced by removing the solvent from a coating liquid for a transparent resin layer by drying under atmospheric pressure and reduced pressure. The viscosity is measured using, for example, a VIBRON (Model DD-III; manufactured by Toyo Baldwin Co., Ltd.) as an analyzer, under the conditions of a measurement initiation temperature of 50° C., a measurement completion temperature of 150° C., a rate of temperature increase of 5° C./min, and a frequency of vibration of 1 Hz/deg. The measurement value obtained at 100° C. can be used.

<Constitution of Composition>

The content of Component A in the composition for forming a touch panel electrode protective film of the invention is preferably 5% to 40% by mass, and more preferably 10% to 35% by mass, with respect to the total solid content in the composition, and the content of Component B is preferably 30% to 90% by mass, and more preferably 40% to 90% by mass, with respect to the total solid content in the composition. The content of Component C is preferably 0.1% to 10% by mass, and more preferably 0.2% to 5% by mass, with respect to the total solid content in the composition, and the content of Component D is preferably 0% to 20% by mass, and more preferably 5% to 20% by mass, with respect to the total solid content in the composition.

Furthermore, the total content of Component A to Component D is preferably 80% by mass or more, and more preferably 90% by mass or more, with respect to the total solid content in the composition.

(Transfer Film)

The transfer film of the invention has a temporary support; and a photosensitive transparent resin layer formed of the composition for forming a touch panel electrode protective film of the invention.

Furthermore, it is preferable that the transfer film of the invention further has a second transparent resin layer having a refractive index that is higher than the refractive index of the photosensitive transparent resin layer, on the temporary support and the photosensitive transparent resin layer. In this configuration, the photosensitive transparent resin layer is positioned between the temporary support and the second transparent resin layer. By adopting such a configuration as described above, a laminate having an effect of reducing the visibility of the transparent electrode pattern can be formed. Without being bound by any theory, when the difference between the refractive indices of the transparent electrode pattern (preferably, ITO) and the second transparent resin layer is made small, light reflection is reduced, and the transparent electrode pattern becomes not easily visible. Thus, visibility can be ameliorated. Furthermore, the transfer film of the invention may further have other layers.

In the following description, preferred embodiments of the transfer film of the invention will be explained. The transfer film of the invention is preferably intended for forming a touch panel electrode protective film, and more preferably intended for forming a transparent insulating layer or a transparent protective layer of a capacitive input device.

The "transparent resin layer" according to the invention implies that in a case in which a laminate is formed by transferring a resin layer onto a base material having a transmittance of 90% or higher, the transmittance of this laminate is 80% or higher. Regarding the transmittance, an arithmetic mean value of the values measured at a pitch of 10 nm in the wavelength range of 400 to 750 nm can be used.

<Temporary Support>

The transfer film of the invention has a temporary support.

A temporary support is a support that is peeled off after the photosensitive transparent resin layer and/or second transparent resin layer of the transfer film have been transferred.

Regarding the temporary support, a material which has flexibility and does not undergo significant deformation, shrinkage or elongation under pressure, or under pressure and heating, can be used. Examples of such a support include a polyethylene terephthalate film, a cellulose triacetate film, a polystyrene film, and a polycarbonate film. Among these, a biaxially stretched polyethylene terephthalate film is particularly preferred.

The thickness of the temporary support is not particularly limited, and the thickness is preferably in the range of 5 to 200 µm, and from the viewpoints of easy handleability and general-purpose usability, the thickness is particularly preferably in the range of 10 to 150 µm.

The temporary support may be transparent, and may contain a silicon oxide, an alumina sol, a chromium salt, a zirconium salt, or the like.

The temporary support can be imparted with electrical conductivity by the method described in JP2005-221726A, or the like.

<Photosensitive Transparent Resin Layer>

The transfer film of the invention has a photosensitive transparent resin layer. The photosensitive transparent resin layer is a layer formed of the composition for forming a touch panel electrode protective film of the invention.

It is preferable that the photosensitive transparent resin layer is formed by applying the composition for forming a touch panel electrode protective film of the invention on a temporary support.

The film thickness of the photosensitive transparent resin layer used for the invention in a transfer film is, as a dried film thickness, preferably 1 µm or more, more preferably 1 to 20 µm, even more preferably 1 to 15 µm, and particularly preferably 3 to 12 µm. When the film thickness of the photosensitive transparent resin layer is in the range described above, in a case in which a protective layer is produced using the composition of the invention, a protective layer having excellent protective properties is obtained, which is preferable.

<Second Transparent Resin Layer>

It is preferable that the transfer film of the invention has a second transparent resin layer. The second transparent resin layer is a layer having a refractive index that is higher than that of the photosensitive transparent resin layer, and is preferably a layer formed of a photocurable resin composition.

According to the present specification, the second transparent resin layer is meant to include both a layer before being cured, and a layer after being cured by light and/or heat.

(Refractive Index)

It is preferable that the transfer film of the invention satisfies the following Formula N1:

$$n_1 < n_2 \qquad \text{Formula N1:}$$

$n_1$ represents the refractive index of the photosensitive transparent resin layer, and $n_2$ represents the refractive index of the second transparent resin layer.

That is, the transfer film of the invention is such that the refractive index of the second transparent resin layer is higher than the refractive index of the photosensitive transparent resin layer. The value of $n_2 - n_1$ is preferably 0.03 to 0.30, and more preferably 0.05 to 0.20.

The refractive index n1 of the photosensitive transparent resin layer is preferably such that $1.45 \leq n_1 \leq 1.59$, more preferably $1.5 \leq n_1 \leq 1.53$, even more preferably $1.5 \leq n_1 \leq 1.52$, and particularly preferably $1.51 \leq n_1 \leq 1.52$.

The refractive index $n_2$ of the second transparent resin layer is preferably 1.60 or higher. On the other hand, the refractive index of the second transparent resin layer needs to be adjusted by the refractive index of the transparent electrode, and although the upper limit of the value is not particularly limited, the refractive index is preferably 2.1 or lower, and more preferably 1.78 or lower. The refractive index $n_2$ of the second transparent resin layer is preferably such that $1.60 \leq n_2 \leq 1.75$. The refractive index of the second transparent resin layer described above may also be 1.74 or lower.

In a case in which the refractive index of the transparent electrode pattern is more than 2.0 as in the case of an oxide of In and Zn (indium zinc oxide; IZO), the refractive index $n_2$ of the second transparent resin layer is preferably from 1.7 to 1.85.

<Refractive Index in Transfer Film, and Method for Measuring Dried Film Thickness>

According to the invention, the refractive index of the photosensitive transparent resin layer, the dried film thickness of the photosensitive transparent resin layer, and the refractive index of the second transparent resin layer that will be described below can be determined as follows, using a reflection spectroscopic thickness meter, FE-3000 (manufactured by Otsuka Electronics Co., Ltd.). The following measurement is carried out under the conditions of 25° C.

(1) A temporary support is prepared, and this is cut into a piece having a size of 10 cm in length×10 cm in width. A black polyethylene terephthalate (PET) material is contacted with one surface of the cut temporary support, with a transparent adhesive tape (OCA tape (Optically Clear Adhesive tape) 8171CL; manufactured by 3M Company) interposed therebetween, and thus a laminate (first laminate) is produced. The reflective spectrum (wavelength: 430 to 800 nm) of the first laminate is evaluated using a reflection spectroscopic thickness meter, FE-3000, and the refractive indices $n_0$ of the temporary support at various wavelengths are determined.

(2) A sample is prepared such that only a photosensitive transparent resin layer is formed on a temporary support, and this is cut into a piece having a size of 10 cm in length×10 cm in width. A laminate (second laminate) is produced in which a black PET material is contacted with the temporary support surface of the cut sample, with a transparent adhesive tape (OCA tape 8171CL; manufactured by 3M Company) interposed therebetween. The second laminate is subjected to a structural analysis using transmission electron microscopy (TEM). The dried film thickness of the photosensitive transparent resin layer is measured at 10 sites, the average value is determined, and a first prospective value $T_1(I)$ of the average value of dried film thickness of the photosensitive transparent resin layer is determined. The reflective spectrum (wavelength: 430 to 800 nm) of the second laminate is evaluated using a reflection spectroscopic thickness meter, FE-3000. The refractive indices $n_1$ of the photosensitive transparent resin layer at various wavelengths and a second prospective value $T_1(II)$ of the average value of dried film thicknesses of the photosensitive transparent resin layer are determined. At this time, in order to take account of the reflection at the interface between the photosensitive transparent resin layer and the temporary support, the refractive index $n_1$ and the second prospective value $T_1(II)$ are determined from the reflective spectrum of the second laminate by fitting based on simulation calculation, while having the value of the refractive index $n_0$ determined in section (1), and the first prospective value $T_1(I)$ inserted into the calculation formula.

(3) A transfer film is prepared by forming a photosensitive transparent resin layer and a second transparent resin layer on a temporary support, and this is cut into a piece having a size of 10 cm in length×10 cm in width (in a case in which the transfer film has a protective film, the protective film is peeled off). A sample piece (third laminate) is produced, in which a black PET material is contacted with the temporary support surface of the cut transfer film, with a transparent adhesive tape (OCA tape 8171CL; manufactured by 3M Company) interposed therebetween. The sample piece is subjected to a structural analysis using transmission electron microscopy (TEM). The dried film thickness of the photosensitive transparent resin layer is measured at 10 sites, the average value is determined, and a prospective value $T_2(I)$ of the average value of dried film thickness of the second transparent resin layer is determined. In regard to the sample piece, the reflective spectrum at 200 measurement points on a straight line in an arbitrary direction at an interval of 0.2 mm at a measurement spot: diameter $\phi$ 40 μm (that is, 4 cm in length) is evaluated using a reflection spectroscopic thickness meter, FE-3000. This is repeated in five rows at an interval of 1 cm in a direction orthogonal to the direction of the straight line described above, at 1,000 points in total. At this time, in order to take account of the reflection at the interface between the photosensitive transparent resin layer and the temporary support, and the interface between the second transparent resin layer and the photosensitive transparent resin layer, the refractive index $n_2$ of the second transparent resin layer, and the dried film thicknesses of the second transparent resin layer and the photosensitive transparent resin layer at the 1,000 measurement points are determined from the reflective spectrum of the third laminate by fitting based on simulation calculation, while having the refractive index no determined in section (1), the refractive index $n_1$ and the second prospective value $T_1(II)$ determined in section (2), and the first prospective value $T_1(I)$ inserted into the calculation formula. Furthermore, the average values, maximum values, minimum values and standard deviations of the dried film thicknesses of the second transparent resin layer and the photosensitive transparent resin layer are calculated, and $n_1$, $n_2$, $T_1$, $T_2$, $\sigma_2$ and $H_2$ are determined. $n_2$ represents the refractive index of the second transparent resin layer; $n_1$ represents the refractive index of the photosensitive transparent resin layer; $T_2$ represents the average dried film thickness of the second transparent resin layer; $T_1$ represents the average dried film thickness of the photosensitive transparent resin layer; $\sigma_2$ represents the standard deviation of the dried film thickness of the second transparent resin layer; and $H_2$ represents the difference between the maximum value and the minimum value of the dried film thickness of the second transparent resin layer.

In regard to the dried film thickness of the second transparent resin layer and the dried film thickness of the photosensitive transparent resin layer, the fitting accuracy of the simulation can be increased by inputting the prospective values obtained by performing a structural analysis by TEM, into the reflection spectroscopic thickness meter.

The refractive index of the second transparent resin layer used for the transfer film of the invention is preferably 1.55 or higher, and more preferably 1.60 or higher. The upper limit is not particularly limited; however, the refractive index is preferably 2.30 or lower.

The dried film thickness of the second transparent resin layer used for the transfer film of the invention is preferably 500 nm or less, and more preferably 150 nm or less. Furthermore, the film thickness of the second transparent resin layer is preferably 55 nm or more, more preferably 60 nm or more, and even more preferably 70 nm or more.

When the film thickness of the second transparent resin layer is in the range described above, in a case in which a protective layer is produced using the transfer film of the invention, a protective layer having excellent transparent electrode pattern concealability is obtained, which is preferable.

As long as the range of the refractive index such as described above is satisfied, the material for the second transparent resin layer is not particularly limited.

It is preferable that the second transparent resin layer is formed by applying a resin composition obtained by dissolving components such as a binder polymer, a polymerizable compound, and a polymerization initiator in a solvent (hereinafter, also referred to as "second resin composition") on the photosensitive transparent resin layer.

Furthermore, the second transparent resin layer may be a layer exhibiting water-insolubility; however, it is preferable that the second transparent resin layer is a layer exhibiting water-solubility.

According to the embodiment described above, after the photosensitive transparent resin layer is laminated on the temporary support, even if the second transparent resin layer is laminated without curing the photosensitive transparent resin layer, layer demarcation is achieved at a satisfactory level, and visibility of the transparent electrode pattern can be further ameliorated. Furthermore, after various layers have been transferred from the transfer film onto the transparent electrode pattern, developing into a desired pattern can be achieved by photolithography. If layer demarcation between the photosensitive transparent resin layer and second transparent resin layers is poorly achieved, the refractive index regulating effect is likely to become insufficient, and amelioration of the visibility of the transparent electrode pattern is likely to become insufficient.

A layer exhibiting water-solubility refers to a layer that completely dissolves and/or disperses, in a case in which the layer is immersed in water at 25° C., in an immersion time of 10 minutes/μm or less per unit film thickness.

Furthermore, a layer exhibiting water-insolubility refers to a layer that does not completely dissolve and/or disperse, in a case in which the layer is immersed in water at 25° C., in an immersion time of 10 minutes/μm or less per unit film thickness.

According to the invention, in a case in which the transparent resin layers have curing properties, the measurement by means of immersion in water is carried out using the transparent resin layers before being cured.

[Solvent]

In a case in which the second transparent resin layer is a layer exhibiting water-insolubility, the second resin composition can include general organic solvents, and examples thereof include methyl ethyl ketone, propylene glycol monomethyl ether, propylene glycol monomethyl ether acetate, cyclohexanone, methyl isobutyl ketone, toluene, xylene, ethyl acetate, butyl acetate, ethyl lactate, methyl lactate, and caprolactam.

In a case in which the second transparent resin layer is a layer exhibiting water-solubility, it is preferable that the second resin composition uses water or a mixed solvent of water and a lower alcohol having 1 to 3 carbon atoms, as a water-based solvent. In regard to the transfer film of the invention, it is preferable that the layer exhibiting water-solubility is formed by applying water or a mixed solvent of water and a lower alcohol having 1 to 3 carbon atoms, and it is more preferable that the layer exhibiting water-solubility is formed by applying a coating liquid including water or a mixed solvent at a content ratio of water/alcohol having 1 to 3 carbon atoms as a mass ratio of 20/80 to 100/0. The content ratio of water/alcohol having 1 to 3 carbon atoms is particularly preferably in the range of 30/70 to 80/20 as a mass ratio, and most preferably 35/65 to 65/35.

The water-based solvent is preferably water, a mixed solvent of water and methanol, or a mixed solvent of water and ethanol, and from the viewpoints of drying and coatability, a mixed solvent of water and methanol is more preferred.

[Metal Oxide Particles]

It is preferable that the second resin composition includes metal oxide particles, for the purpose of regulating the refractive index or light transmittance. Since metal oxide particles are highly transparent and have light transmittance, a resin composition having a high refractive index and excellent transparency is obtained. The composition for forming a touch panel electrode protective film may include metal oxide particles for the purpose of regulating the refractive index or light transmittance.

It is preferable that the metal oxide particles have a higher refractive index than the refractive index of the resin composition including materials excluding the metal oxide particles. Specifically, regarding the metal oxide particles used for the second transparent resin layer, particles having a refractive index for light having a wavelength of 400 to 750 nm of 1.70 or higher are more preferred; particles having a refractive index of 1.80 or higher are even more preferred; and particles having a refractive index of 1.90 or higher are particularly preferred. Furthermore, regarding the metal oxide particles used for the composition for forming a touch panel electrode protective film, particles having a refractive index for light having a wavelength of 400 to 750 nm of 1.50 or higher are more preferred; particles having a refractive index of 1.80 or higher are even more preferred; and particles having a refractive index of 1.90 or higher are particularly preferred.

Here, when it is said that the refractive index for light having a wavelength of 400 to 750 nm is 1.50 or higher, it is implied that the average refractive index for light having a wavelength in the above-mentioned range is 1.50 or higher, and it is not necessary that the refractive index for all light rays having wavelengths in the above-mentioned range is 1.50 or higher. Furthermore, the average refractive index is a value obtained by dividing the sum total of measured values of refractive index for various light rays having wavelengths in the above-mentioned range, by the number of measurement points.

It should be noted that the metals for the metal oxide particles also include semi-metals such as B, Si, Ge, As, Sb and Te.

Regarding the metal oxide particles that are light-transmissible and have a high refractive index, oxide particles containing atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi and Te are preferred; titanium oxide particles, titanium composite oxide particles, zinc oxide particles, zirconium oxide particles, indium/tin oxide particles, and antimony/tin oxide particles are more preferred; titanium oxide particles, titanium composite oxide particles, and zirconium oxide particles are even more preferred; and titanium oxide particles, zirconium oxide particles, and tin oxide particles are particularly preferred. From the viewpoint that the particles are chemically and physically stable and that a fine particle dispersion liquid is readily available, zirconium oxide particles are most preferred. These metal oxide particles may also have the surface treated with an organic material, for the purpose of imparting dispersion stability to the particles.

From the viewpoint of transparency of the resin composition, the average primary particle size of the metal oxide particles is preferably 1 to 200 nm, and particularly preferably 3 to 80 nm. Here, the average primary particle size of particles refers to a value obtained by measuring the particle sizes of any 200 arbitrary particles by electron microscopy, and calculating the arithmetic mean value thereof. In a case in which the shape of the particles is not spherical, the maximum diameter among the external diameters of a particle is designated as the particle size.

Regarding the metal oxide particles, one kind of particles may be used alone, or two or more kinds of particles may be used in combination. The content of the metal oxide particles in the resin composition described above may be appropriately determined in consideration of the refractive index, light transmittance and the like required from an optical member obtainable from the resin composition. However, it is preferable to adjust the content of the metal oxide particles to 5% to 80% by mass, and more preferably to 10% to 70% by mass, with respect to the total solid content of the resin composition.

In regard to the transfer film of the invention, it is preferable that the second transparent resin layer has at least one of $ZrO_2$ particles or $TiO_2$ particles from the viewpoint of controlling the refractive index to the range of the refractive index of the second transparent resin layer, and it is more preferable that the second transparent resin layer has $ZrO_2$ particles.

[Binder Polymer]

It is preferable that the second resin composition includes a binder polymer. The binder polymer is not particularly limited as long as there is no effect contradictory to the purport of the invention, and can be appropriately selected from among known binder polymers. An alkali-soluble resin is preferred, and regarding the alkali-soluble resin described above, the polymers described in paragraph 0025 of JP2011-95716A and paragraphs 0033 to 0052 of JP2010-237589A can be used. Among them, an acrylic polymer having an acidic group is preferred.

Also, in a case in which the second transparent resin layer is a layer exhibiting water-solubility, a polymer having solubility in the water-based solvent described above is used as the binder polymer.

The polymer having solubility in a water-based solvent is not particularly limited as long as there is no effect contradictory to the purport of the invention, and can be appropriately selected from among known polymers. Examples include the aforementioned acrylic polymer having an acidic group; the polyvinyl ether/maleic anhydride polymer described in JP1971-2121A (JP-S46-2121A) and JP1981-40824B (JP-S56-40824B); water-soluble salts of carboxyalkyl celluloses, water-soluble cellulose ethers, water-soluble salts of carboxyalkyl starches; polyvinyl alcohol derivatives such as polyvinyl alcohol, water-soluble polyvinyl butyral, and water-soluble polyvinyl acetal; polyvinylpyrrolidone, various polyacrylamides, various water-soluble polyamides, water-soluble salts of polyacrylic acid, gelatin, an ethylene oxide polymer, water-soluble salts of a family of various starches and analogues thereof, a styrene/maleic acid copolymer, and a maleate resin.

The binder polymer can be incorporated into the second resin composition in the form of a polymer solution having the polymer dissolved in a solvent. The solvent is not particularly limited, and a solvent that is usually used for dissolving a polymer is used. Examples thereof include 1-methoxy-2-propyl acetate, 1-methoxy-2-propanol, and methyl ethyl ketone.

The polymer having solubility in a water-based solvent is preferably an acrylic polymer having an acidic group, or a polyvinyl alcohol derivative, and particularly preferred examples include an acrylic polymer having an acidic group, polyvinyl butyral, polyvinyl acetal, fully saponified polyvinyl alcohol, and a polyvinyl alcohol obtained by partially saponifying polyvinyl acetate.

[Polymerizable Compound]

It is preferable that the resin compositions used for the photosensitive transparent resin layer and the second transparent resin layer each contain a polymerizable compound.

The polymerizable compound is preferably a radical polymerizable compound.

Examples of the polymerizable compound to be used for the photosensitive transparent resin layer and the second transparent resin layer include monofunctional acrylates or monofunctional methacrylates, such as polyethylene glycol mono(meth)acrylate, polypropylene glycol mono(meth)acrylate, and phenoxyethyl (meth)acrylate; polyethylene glycol di(meth)acrylate, polypropylene glycol di(meth)acrylate, trimethylolethane triacrylate, trimethylolpropane triacrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyoxyethyl) isocyanurate, tri(acryloyloxyethyl) cyanurate, and glycerin tri(meth)acrylate; and polyfunctional acrylates or polyfunctional methacrylates, such as products obtained by adding ethylene oxide or propylene oxide to polyfunctional alcohols such as trimethylolpropane and glycerin, and then (meth)acrylating the adducts.

Further examples include the urethane acrylates described in JP1973-41708B (JP-S48-41708B), JP1975-6034B (JP-S50-6034B), and JP1976-37193A (JP-S51-37193A); the polyester acrylates described in JP1973-64183A (JP-S48-64183A), JP1974-43191B (JP-S49-43191B), and JP1977-30490B (JP-S52-30490B); and polyfunctional acrylates or methacrylates, such as epoxy acrylates which are reaction products between epoxy resins and (meth)acrylic acid. Furthermore, acrylamide monomers can also be suitably used. Among the polymerizable compounds described above, polyfunctional acrylates, urethane acrylates, and acrylamide monomers are preferred.

Regarding the polymerizable compound to be used in a case in which the photosensitive transparent resin layer and/or the second transparent resin layer is a layer exhibiting water-solubility, examples also include a monomer having a hydroxyl group, and a monomer having ethylene oxide or polypropylene oxide and a phosphoric acid in the molecule, in addition to the polymerizable compounds described above.

[Polymerization Initiator]

It is preferable that the resin composition to be used for the second transparent resin layer includes a polymerization initiator.

The polymerization initiator to be used for the second transparent resin layer is preferably a photopolymerization initiator, and a photoradical polymerization initiator is preferred.

In a case in which the second transparent resin layer is a water-soluble layer, it is preferable to use a photopolymerization initiator having solubility in a water-based solvent, and preferred examples include IRGACURE 2959 (manufactured by BASF SE) and a polymerization initiator represented by the following formula 2.

Formula (2)

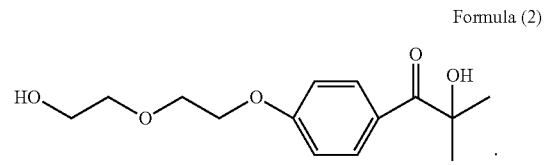 [SMILES: CC(C)(O)C(=O)c1ccc(OCCOCCO)cc1]

On the other hand, regarding the photopolymerization initiator or polymerization initiator to be used in the case of a layer exhibiting water-insolubility, the photopolymerization initiators described in paragraphs 0031 to 0042 of JP2011-95716A can be used. Examples that can be preferably used include 1,2-octanedione, 1-[4-(phenylthio)-, 2-(O-benzoyloxime)] (trade name: IRGACURE OXE-01, manufactured by BASF SE), as well as ethanone, 1-[9-ethyl-6-(2-methylbenzoyl)-9H-carbazol-3-yl]-, 1-(O-acetyloxime) (trade name: IRGACURE OXE-02, manufactured by BASF SE), 2-(dimethylamino)-2-[(4-methylphenyl)methyl]-1-[4-(4-morpholinyl)phenyl]-1-butanone (trade name: IRGACURE 379EG, manufactured by BASF SE), 2-methyl-1-(4-methylthiophenyl)-2-morpholinopropan-1-one (trade name: IRGACURE 907, manufactured by BASF SE), 2-hydroxy-1-{4-[4-(2-hydroxy-2-methylpropionyl)-benzyl]phenyl}-2-methyl-propan-1-one (trade name: IRGACURE 127, manufactured by BASF SE), 2-benzyl-2-dimethylamino-1-(4-morpholinophenyl)-butanone-1 (trade name: IRGACURE 369, manufactured by BASF SE), 2-hydroxy-2-methyl-1-phenyl-propan-1-one (trade name: IRGACURE 1173, manufactured by BASF SE), 1-hydroxy-cyclohexyl-phenyl-ketone (trade name: IRGACURE 184, manufactured by BASF SE), 2,2-dimethoxy-1,2-diphenylethan-1-one (trade name: IRGACURE 651, manufactured by BASF SE), and an oxime ester-based photopolymerization initiator or polymerization initiator (trade name: Lunar 6, manufactured by DKSH Japan K.K.).

[Polymer Latex]

Furthermore, in a case in which the resin composition for the second transparent resin layer includes a water-based solvent, the resin composition to be used for the second transparent resin layer may include polymer latex. Here, the polymer latex as used herein is a product in which fine particles of a water-insoluble polymer are dispersed in water. In regard to the polymer latex, details are described in, for example, Muroi Soichi, "Kobunshi Latekkusu no Kagaku (Chemistry of Polymer Latexes) (published by Kobunshi Kankokai (1973))".

Regarding the polymer particles that can be used, polymer particles formed of acrylic, vinyl acetate-based, rubber-based (for example, styrene-butadiene-based and chloroprene-based), olefin-based, polyester-based, polyurethane-based, and polystyrene-based polymers, and copolymers of these polymers, are preferred. It is preferable to strengthen the mutual bonding force between the polymer chains that constitute the polymer particles. Regarding the means for strengthening the mutual bonding force between polymer chains, a method of utilizing an interaction based on hydrogen bonding, and a method of producing covalent bonds may be used. Regarding the means for imparting hydrogen bonding force, it is preferable to introduce a monomer having a polar group into a polymer chain by performing copolymerization or graft polymerization. Examples of the polar group include a carboxyl group (contained in acrylic acid, methacrylic acid, itaconic acid, fumaric acid, maleic acid, crotonic acid, partially esterified maleic acid, and the like), primary, secondary and tertiary amino groups, an ammonium salt group, and a sulfonic acid group (styrene-sulfonic acid). A carboxyl group and a sulfonic acid group are particularly preferred. A preferred range for the copolymerization ratio of such a monomer having a polar group is 5% to 35% by mass, more preferably 5% to 20% by mass, and even more preferably in the range of 15% to 20% by mass, with respect to 100% by mass of the polymer. On the other hand, regarding the means for producing covalent bonds, a method of reacting a hydroxyl group, a carboxyl group, a primary amino group, a secondary amino group, an acetoacetyl group, sulfonic acid or the like, with an epoxy compound, a blocked isocyanate, an isocyanate, a vinylsulfone compound, an aldehyde compound, a methylol compound, a carboxylic acid anhydride or the like, may be used.

Among the polymers obtained by utilizing these reactions, a polyurethane derivative obtainable by a reaction between a polyol and a polyisocyanate compound is preferred, and it is more preferable to use a polyvalent amine as a chain extending agent in combination with the polymer. It is particularly preferable to introduce the polar groups described above into the polymer chain to obtain an ionomer type polymer.

The weight-average molecular weight of the polymer is preferably 10,000 or more, and more preferably 20,000 to 100,000. As a polymer suitable for the invention, an ethylene ionomer which is a copolymer between ethylene and methacrylic acid, and a polyurethane ionomer may be mentioned.

The polymer latex that can be used for the invention may be a product obtainable by emulsion polymerization, or may be a product obtainable by emulsification. The methods for producing these polymer latexes are described in, for example, "Emarujon-Ratekkusu Handobukku (Handbook of Emulsions and Latexes)" (edited by Editorial Committee for Handbook of Emulsions and Latexes, published by Taisei-sha. Ltd. (1975)). Examples of the polymer latex that can be used for the invention include an aqueous dispersion of a polyethylene ionomer (trade name: CHEMIPEARL S120, manufactured by Mitsui Chemicals, Inc., solid content 27%), (trade name: CHEMIPEARL S100, manufactured by Mitsui Chemicals, Inc., solid content 27%), (trade name: CHEMIPEARL S111, manufactured by Mitsui Chemicals, Inc., solid content 27%), (trade name: CHEMIPEARL S200, manufactured by Mitsui Chemicals Inc. solid content 27%), (trade name: CHEMIPEARL S300, by Mitsui Chemicals, Inc., solid content 27%), (trade name: CHEMIPEARL S300, manufactured by Mitsui Chemicals, Inc., solid content 35%), (trade name: CHEMIPEARL S650, manufactured by Mitsui Chemicals, Inc., solid content 27%), or (trade name: CHEMIPEARL S75N, manufactured by Mitsui Chemicals, Inc., solid content 24%); an aqueous dispersion of a polyether-based polyurethane (trade name: HYDRAN WLS-201, manufactured by DIC Corporation, solid content 35%, Tg: −50° C.), (trade name: HYDRAN WLS-202, manufactured by DIC Corporation, solid content 35%, Tg: −50° C.), (trade name: WLS-221, manufactured by DIC Corporation, solid content 35%, Tg: −30° C.), (trade name: HYDRAN WLS-210, manufactured by DIC Corporation, solid content 35%, Tg: −15° C.), (trade name: HYDRAN WLS-213, manufactured by DIC Corporation, solid content 35%, Tg: −15° C.), (trade name: HYDRAN WLI-602, manufactured by DIC Corporation, solid content 39.5%, Tg: −50° C.), or (trade name: HYDRAN WLI-611, manufactured by DIC Corporation, solid content 39.5%, Tg: −15° C.); and products obtained by subjecting an acrylic acid alkyl copolymer ammonium (trade name: JURYMER AT-210, manufactured by Nihon Junyaku Co., Ltd.), an acrylic acid alkyl copolymer ammonium (trade name: JURYMER ET-410, manufactured by Nihon Junyaku Co., Ltd.), an acrylic acid alkyl copolymer ammonium (trade name: JURYMER AT-510, manufactured by Nihon Junyaku Co., Ltd.), and polyacrylic acid (trade name: JURYMER AC-10L, manufactured by Nihon Junyaku Co., Ltd.), to neutralization with ammonia and emulsification.

[Other Additives]

In the second transparent resin layer, additives may also be used. Examples of the additives described above include the surfactants described in paragraph 0017 of JP4502784B and paragraphs 0060 to 0071 of JP2009-237362A; the thermal polymerization inhibitors described in paragraph 0018 of JP4502784B; and the other additives described in paragraphs 0058 to 0071 of JP2000-310706A.

<Protective Film>

It is preferable that the transfer film of the invention has a protective film adjacently on the photosensitive transparent resin layer.

The protective films described in paragraphs 0083 to 0087 and 0093 of JP2006-259138A can be used as appropriate.

The protective film can be formed by pressure-bonding a sheet formed of the material described above, onto a film on which the photosensitive transparent resin layer and the like have been formed.

Regarding the pressure-bonding method, any known method can be used without any particular limitations.

<Other Layers>

The transfer film of the invention may also have other layers according to the purpose. Examples of the other layers include a thermoplastic resin layer that is provided between the temporary support and the photosensitive transparent resin layer; an interlayer that is provided between the photosensitive transparent resin layer and the thermoplastic resin layer; a hard coat layer that is provided between the photosensitive transparent resin layer and the temporary support in order to impart physical durability to the surface of the photosensitive transparent resin layer after transfer; and a release layer that is provided between the temporary support and the photosensitive transparent resin layer in order to facilitate peeling of the temporary support at the time of transfer.

[Thermoplastic Resin Layer]

It is preferable that the transfer film of the invention has a thermoplastic resin layer between the temporary support and the photosensitive transparent resin layer. When a laminate is formed by transferring a photosensitive transparent resin layer and a second transparent resin layer using a transfer film having the thermoplastic resin layer, air bubbles are not easily generated in the various elements formed by being transferred, image unevenness is not likely to be produced in the image display device, and excellent display characteristics can be obtained.

It is preferable that the thermoplastic resin layer is alkali-soluble. The thermoplastic resin layer plays the role as a cushion material so as to absorb the surface unevenness of the undercoat surface (also including the surface unevenness caused by images that have already been formed, or the like), and has a property of changing the shape in conformity with the surface unevenness of the object surface.

In regard to the thermoplastic resin layer, an embodiment including the organic polymer materials described in JP1993-72724A (JP-H05-72724A) as components is preferred, and an embodiment including at least one selected from organic polymer materials having a softening point of about 80° C. or lower as measured by the Vicat method [specifically, the polymer softening point measuring method according to ASTM D1235 of the American Materials Testing Methods] is particularly preferred.

Specific examples thereof include organic polymers, such as polyolefins such as polyethylene and polypropylene; an ethylene copolymer of ethylene and vinyl acetate or a saponification product thereof, a copolymer of ethylene and an acrylic acid ester or a saponification product thereof, polyvinyl chloride or a vinyl chloride copolymer of vinyl chloride and vinyl acetate or a saponification product thereof; polyvinylidene chloride, a vinylidene chloride copolymer; polystyrene, a styrene copolymer of styrene and a (meth)acrylic acid ester or a saponification product thereof; polyvinyltoluene, a vinyltoluene copolymer of vinyltoluene and a (meth)acrylic acid ester or a saponification product thereof; poly(meth)acrylic acid ester, a (meth)acrylic acid ester copolymer of butyl (meth)acrylate and vinyl acetate or the like; a vinyl acetate copolymer; and polyamide resins such as nylon, copolymerized nylon, N-alkoxymethylated nylon, and N-dimethylaminated nylon.

The layer thickness of the thermoplastic resin layer is preferably 3 to 30 μm. In a case in which the layer thickness of the thermoplastic resin layer is less than 3 μm, the shape conformity at the time of laminating is insufficient, and the thermoplastic resin layer may not perfectly absorb the surface unevenness of the undercoat surface. Furthermore, in a case in which the layer thickness is more than 30 μm, drying (solvent removal) may be performed under load at the time of forming the thermoplastic resin layer on the temporary support, or time may be required for developing of the thermoplastic resin layer, which deteriorates the process suitability. The layer thickness of the thermoplastic resin layer is more preferably 4 to 25 μm, and particularly preferably 5 to 20 μm.

The thermoplastic resin layer can be formed by applying a liquid preparation containing a thermoplastic organic polymer or the like, and the liquid preparation used at the time of application or the like can be produced using a solvent. The solvent is not particularly limited as long as the solvent can dissolve the polymer component that constitutes the above-described layer, and examples thereof include methyl ethyl ketone, cyclohexanone, propylene glycol monomethyl ether acetate, n-propanol, and 2-propanol.

—Viscosity of Thermoplastic Resin Layer and Photocurable Resin Layer—

It is preferable that the viscosity of the composition used for forming the thermoplastic resin layer as measured at 100° C. is in the range of 1,000 to 10,000 Pa·sec, and it is more preferable that the viscosity of the composition for forming a touch panel electrode protective film of the invention as measured at 100° C. is in the range of 2,000 to 50,000 Pa·sec, and the following Expression A is satisfied.

Viscosity of composition used for forming thermoplastic resin layer<viscosity of composition used for forming photosensitive transparent resin layer     Expression A:

[Interlayer]

It is preferable that the transfer film of the invention further includes an interlayer between the photosensitive transparent resin layer and the thermoplastic resin layer, from the viewpoint of preventing mixing of components when multiple layers are formed by application and are stored after application. Regarding the interlayer is preferably an oxygen barrier film having an oxygen barrier function, which is described as a "separating layer" in JP1993-72724A (JP-H05-72724A), and sensitivity at the time of exposure increases, the time burden of exposure machine can be reduced, and productivity is increased.

Regarding the interlayer, those described in paragraphs 0083 to 0087 and 0093 of JP2006-259138A can be appropriately used.

Figure 12:
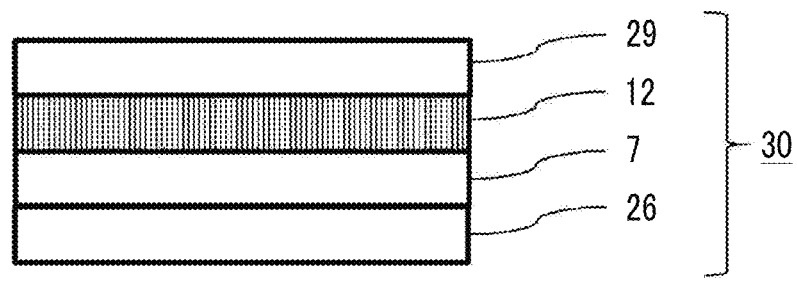
FIG. 12 is a schematic cross-sectional view illustrating an example of the configuration of the transfer film of the invention.

FIG. 12 illustrates an example of a preferable configuration of the transfer film of the invention. FIG. 12 is a schematic view of the transfer film 30 of the present invention, in which a temporary support 26, a photosensitive transparent resin layer 7, a second transparent resin layer 12, and a protective release layer (protective film) 29 are laminated adjacently to each other in this layer configuration.

(Method for Producing Transfer Film)

The transfer film of the invention can be produced according to the method for producing a photosensitive transfer material described in paragraphs 0094 to 0098 of JP2006-259138A. Above all, it is preferable that the transfer film of the invention is produced according to the following method for producing a transfer film of the invention.

The method for producing a transfer film of the invention is not particularly limited; however, it is preferable that the method includes a step of forming a photosensitive transparent resin layer on a temporary support, as Step A; and it is more preferable that the method further includes a step of forming a second transparent resin layer on the photosensitive transparent resin layer, as Step B, after Step A.

Preferred embodiments of the temporary support, the photosensitive transparent resin layer, and the second transparent resin layer according to the method for producing the transfer film of the invention are similar to the preferred embodiments of these elements for the transfer film of the invention described above.

<Step of Forming Photosensitive Transparent Resin Layer on Temporary Support>

The method for producing a transfer film of the invention includes, as Step A, a step of forming a photosensitive transparent resin layer on a temporary support.

In regard to the method for forming a photosensitive transparent resin layer, it is preferable that the photosensitive transparent resin layer is formed by applying the composition for forming a touch panel electrode protective film of the transfer film of the invention, which includes a polymerizable compound, a photopolymerization initiator, and a coating solvent, on a temporary support.

Regarding the method for applying the composition for forming a touch panel electrode protective film, any known method can be used without particular limitations; however, for example, a method of forming the photosensitive transparent resin layer by performing application and drying using a coating machine such as a spinner, a whirler, a roll coater, a curtain coater, a knife coater, a wire bar coater, or an extruder, can be preferably mentioned.

<Step of Forming Second Transparent Resin Layer on Photosensitive Transparent Resin Layer>

It is preferable that the method for producing a transfer film of the invention further includes, as Step B, a step of forming a second transparent resin layer on the photosensitive transparent resin layer that has been produced on the temporary support.

Regarding the method for forming a second transparent resin layer, it is preferable that the second transparent resin layer is formed by applying a second resin composition which includes a metal oxide and has a refractive index after drying of 1.60, on the photosensitive transparent resin layer.

Regarding the method for applying the resin composition, any known method can be used without particular limitations, and a method of forming the second transparent resin layer by performing application and drying using a coating machine such as a spinner, a whirler, a roll coater, a curtain coater, a knife coater, a wire bar coater, or an extruder, may be preferably used.

In a case in which the method includes Step B, a second transparent resin layer is formed on the photosensitive transparent resin layer formed by Step A as described above.

In regard to the method for producing a transfer film of the invention, it is preferable that the resin composition for any one between the photosensitive transparent resin layer and the second transparent resin layer is such that the content of water and an alcohol having 1 to 3 carbon atoms in the coating solvent is 70% by mass in total, and the other resin composition is such that the content of water and an alcohol having 1 to 3 carbon atoms in the coating solvent is 20% by mass or less in total. It is more preferable that the content of water and an alcohol having 1 to 3 carbon atoms in the coating solvent of the composition for forming a touch panel electrode protective film is 70% by mass or more in total, and the content of water and an alcohol having 1 to 3 carbon atoms in the coating solvent of the second resin composition is 20% by mass or less in total.

As a result of such a configuration, after the photosensitive transparent resin layer is laminated, even if the second transparent resin layer is laminated without curing the photosensitive transparent resin layer, layer demarcation is achieved at a satisfactory level, and the refractive indices of the two layers are maintained. Thus, visibility of the transparent electrode pattern may be ameliorated (becoming not easily visible) as intended. In this case, since the transfer film is produced while having the photosensitive transparent resin layer and the second transparent resin layer in an uncured state, a desired pattern can be produced by photolithography after various layers have been transferred onto the transparent electrode pattern.

On the contrary, in a case in which the second transparent resin layer is laminated on the photosensitive transparent resin layer without involving the configuration such as described above, since the two layers are mixed, and an intended refractive index is not maintained, the effect of ameliorating visibility of the transparent electrode pattern is not obtained. In this case, in a case in which the photosensitive transparent resin layer has been cured before the second transparent resin layer is laminated, layer demarcation of the two layers is easily achieved; however, in a transfer film produced as such, the photosensitive transparent resin layer has already been cured, patterning by photolithography cannot be performed.

It is preferable that the method for producing a transfer film of the invention includes a step of further forming a thermoplastic resin layer before the photosensitive transparent resin layer is formed on the temporary support.

It is preferable that the method for forming a transfer film of the invention includes, after the step of forming the thermoplastic resin layer, a step of forming an interlayer between the thermoplastic resin layer and the photosensitive transparent resin layer.

In a case in which a transfer film having an interlayer is formed, the transfer film can be suitably produced by applying a solution prepared by dissolving a thermoplastic organic polymer together with additives (coating liquid for a thermoplastic resin layer) on a temporary support, drying the solution to provide a thermoplastic resin layer, and then laminating an interlayer by applying a liquid preparation prepared by adding a resin or additives to a solvent that does not dissolve the thermoplastic resin layer (coating liquid for an interlayer) on this thermoplastic resin layer, and drying the liquid preparation.

(Laminate)

The laminate of the invention has a base material; a touch panel electrode (hereinafter, also referred to as "transparent electrode pattern") disposed on the base material; a second transparent resin layer disposed on the touch panel electrode; and a photosensitive transparent resin layer disposed on the second transparent resin layer, in which the photosensitive transparent resin layer is a layer obtained by curing the composition for forming a touch panel electrode protective film of the invention, and the refractive index of the second transparent resin layer is higher than the refractive index of the photosensitive transparent resin layer.

Furthermore, the laminate of the invention is preferably a transparent laminate. A transparent laminate means a laminate that is at least partially transparent, and it is preferable that a partial region including the transparent electrode pattern that will be described below is transparent. When it is said that a laminate is transparent, it means that the transmittance of the laminate is 80% or higher. For the transmittance, an arithmetic mean value of the values measured in the wavelength range of 400 to 750 nm at a pitch of 10 nm can be used.

According to the embodiment described above, visibility of the transparent electrode pattern can be reduced.

Preferred embodiments of the second transparent resin layer and the photosensitive transparent resin layer for the laminate of the invention are similar to the preferred embodiments of these elements for the transfer film of the invention described above.

(Refractive Index)

It is preferable that the laminate of the invention satisfies the following Formula N2:

$$n_1 < n_2 \quad \text{Formula N2}$$

$n_1$ represents the refractive index of the photosensitive transparent resin layer, and $n_2$ represents the refractive index of the second transparent resin layer.

That is, the laminate of the invention is such that the refractive index of the second transparent resin layer is higher than the refractive index of the photosensitive transparent resin layer. The value of $n_2-n_1$ is preferably 0.03 to 0.30, and more preferably 0.05 to 0.20.

The refractive index n1 of the photosensitive transparent resin layer is preferably such that $1.45 \leq n_1 \leq 1.59$, more preferably $1.5 \leq n_1 \leq 1.53$, even more preferably $1.5 \leq n_1 \leq 1.52$, and particularly preferably $1.51 \leq n_1 \leq 1.52$.

The refractive index of the second transparent resin layer $n_2$ is preferably 1.60 or higher. On the other hand, the refractive index of the second transparent resin layer needs to be adjusted by the refractive index of the transparent electrode, and although there are no particular limitations on the upper limit of the value, the refractive index of the second transparent resin layer is preferably 2.1 or lower, and more preferably 1.78 or lower. The refractive index n2 of the second transparent resin layer is preferably such that $1.60 \leq n2 \leq 1.75$. The refractive index of the second transparent resin layer described above may also be 1.74 or lower.

In a case in which the refractive index of the transparent electrode pattern exceeds 2.0 as in the case of an oxide of In and Zn (indium zinc oxide; IZO), the refractive index $n_2$ of the second transparent resin layer is preferably from 1.7 to 1.85.

<Refractive Index in Laminate, and Method for Measuring Dried Film Thickness>

$n_1$, $n_2$, $T_2$, $\sigma_1$ and $H_1$ for the transparent laminate thus obtained can be determined using a reflection spectroscopic thickness meter, FE-3000 (manufactured by Otsuka Electronics Co., Ltd.), by repeating, for each layer, a method similar to the calculation of $n_1$, $n_2$, $T_2$, $\sigma_1$ and $H_1$ for the transfer film. An outline thereof will be described below. The following measurement is performed under the conditions of 25° C.

In a case in which a transparent base material (hereinafter, also referred to as "transparent substrate") is used as the base material, the refractive index can be measured as follows. A transparent base material means a base material in which the transmittance of the base material is 80% or higher. Regarding the transmittance, an arithmetic mean value of the values measured in a wavelength range of 400 to 750 nm at a pitch of 10 nm can be used. Also, a base material having a transmittance of less than 80% is referred to as a base material that is not transparent.

(1) In regard to a transparent laminate, for a sample obtained by laminating a transparent substrate, a transparent film and a transparent electrode pattern in this order, or a sample obtained by laminating a transparent substrate, a transparent film, a transparent electrode pattern and a second transparent resin layer in this order, the refractive indices of the various layers and the prospective values of the dried film thicknesses of the various layers are measured in advance.

(2) From the transparent laminate, a portion having a five-layer configuration of transparent substrate/transparent film/transparent electrode pattern/second transparent resin layer/photosensitive transparent resin layer is cut out into a piece having a size of 10 cm in length×10 cm in width. On the cut transparent laminate, a black PET material is contacted, with a transparent adhesive tape (OCA tape 8171CL; manufactured by 3M Company) interposed therebetween, and thus a sample piece is produced. The sample piece is subjected to a structural analysis using transmission electron microscopy (TEM), and the prospective values of the dried film thicknesses of the various layers are determined. In regard to the sample piece, the reflective spectrum at 100 measurement points on a straight line in an arbitrary direction at an interval of 0.2 mm at a measurement spot: diameter ϕ 40 μm is evaluated using FE-3000 (manufactured by Otsuka Electronics Co., Ltd.). At this time, in order to take account of the interface between the second transparent resin layer and the transparent electrode pattern, and the interface between the photosensitive transparent resin layer and the second transparent resin layer, while the refractive indices of the second transparent resin layer, the transparent substrate, the transparent film and the transparent electrode pattern, the prospective value of the average value of dried film thickness of the photosensitive transparent resin layer, and the prospective value of the average value of dried film thickness of the second transparent resin layer are inserted into the calculation formula, the refractive index $n_1$ of the photosensitive transparent resin layer, the refractive index $n_2$ of the second transparent resin layer, and the dried film thicknesses of the photosensitive transparent resin layer and the second transparent resin layer at 100 measurement points are determined by fitting based on simulation calculation from the reflective spectrum of the portion of the five-layer configuration of transparent substrate/transparent film/transparent electrode pattern/second transparent resin layer/photosensitive transparent resin layer. Furthermore, the average values, maximum values, minimum values and standard deviations of the dried film thicknesses of the photosensitive transparent resin layer and the second transparent resin layer are calculated, and $n_1$, $n_2$, $T_1$, $T_2$, $\sigma_1$ and $H_1$ are calculated. In the present specification, an arbitrary direction is arranged as a direction parallel to one side of the sample piece, and 100 measurement points (that is, 2 cm in length) are arranged evenly at an interval of 1 cm from the center of one side of the sample piece.

In the case of using a base material that is not transparent, a sample piece having a black PET material attached on the back surface of the base material is produced in advance, with a transparent adhesive tape interposed there between. The reflective spectrum (wavelength: 430 to 800 nm) of the laminate of the base material and the black PET material is evaluated using a reflection spectroscopic thickness meter, FE-3000, and thus the refractive indices n, the dried film thicknesses T, and the extinction coefficients k at various wavelengths are determined. At the time of simulation calculation for the five-layer configuration sample, the refractive index n, the dried film thickness T, and the extinction coefficient k are inserted into the calculation as the characteristics of the base material, and thereby the refractive indices and dried film thicknesses of the photosensitive transparent resin layer and the second transparent resin layer can be determined by fitting.

The laminate of the invention may further have a transparent film having a refractive index of 1.60 to 1.78 and a film thickness of 55 to 110 nm (hereinafter, also simply referred to as "transparent film") or a known hard coat layer, on the transparent electrode pattern on the side opposite to the side where the second transparent resin layer has been formed. Particularly, it is preferable that the laminate further has a transparent film having a refractive index of 1.60 to 1.78 and a film thickness of 55 to 110 nm, from the viewpoint of further ameliorating visibility of the transparent electrode pattern. According to the present specification, unless particularly stated otherwise, in a case in which the term "transparent film" is described, it refers to "a transparent film having a refractive index of 1.60 to 1.78 and a film thickness of 55 to 110 nm".

It is preferable that the laminate of the invention further has a transparent substrate on the transparent film having a refractive index of 1.60 to 1.78 and a film thickness of 55 to 110 nm, on the side opposite to the side where the transparent electrode pattern has been formed. The transparent substrate is preferably a transparent film substrate. In this case, it is preferable that the transparent film is disposed between the transparent electrode pattern and the transparent film substrate.

Furthermore, in regard to the laminate of the invention, it is preferable that the transparent electrode pattern is a transparent electrode pattern formed on a transparent film substrate.

Figure 9:
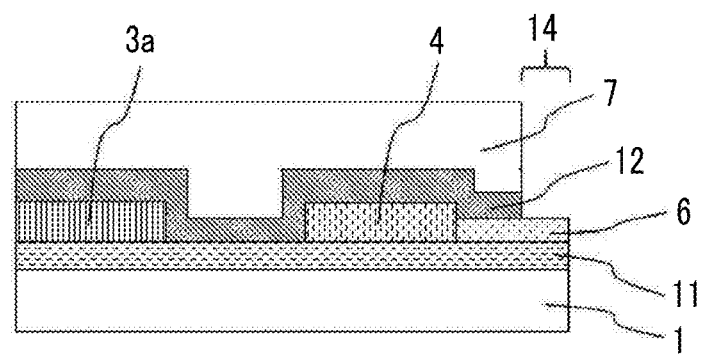
FIG. 9 is a schematic cross-sectional view illustrating another example of the laminate of the invention.

FIG. 9 illustrates an exemplary embodiment of the laminate of the invention.

The laminate shown in FIG. 9 is a transparent laminate.

In FIG. 9, the laminate has a transparent substrate 1 and a transparent film 11 having a refractive index of 1.60 to 1.78 and a film thickness of 55 to 110 nm, and a transparent electrode pattern 4, a pad part 3a that will be described below, a metal wiring section 6, a second transparent resin layer 12, and a photosensitive transparent resin layer 7 are laminated in this layer configuration.

Furthermore, in a partial region 14 on the metal wiring section 6, the second transparent resin layer 12 and the photosensitive transparent resin layer 7 have been removed by patterning.

Figure 11:
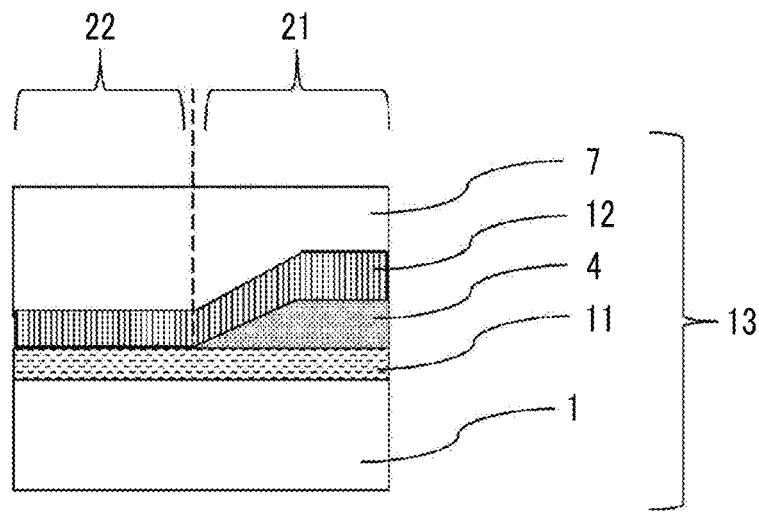
FIG. 11 is a schematic cross-sectional view illustrating an example of the configuration of the laminate of the invention.

FIG. 11 illustrates an exemplary configuration of the laminate of the invention.

In FIG. 11, the laminate has a transparent substrate 1 and a transparent film 11 having a refractive index of 1.60 to 1.78 and a film thickness of 55 to 110 nm, and has a region 21 in plane, in which a transparent electrode pattern 4, a second transparent resin layer 12 and a photosensitive transparent resin layer 7 are laminated in this layer configuration.

The term "in plane" means a direction that is approximately parallel to the plane that is parallel to the transparent substrate 1 of the laminate. When it is said that a region in which a transparent electrode pattern 4, a second transparent resin layer 12 and a photosensitive transparent resin layer 7 are laminated in this order is included in plane, it is implied that orthographic projection for a region in which the transparent electrode pattern 4, the second transparent resin layer 12 and the photosensitive transparent resin layer 7 are laminated in this order, onto a plane that is parallel to the transparent substrate of the laminate, exists in the plane that is parallel to the transparent substrate of the laminate.

Here, in a case in which the laminate of the invention is used for a capacitive input device that will be described below, the transparent electrode pattern may be provided as a first transparent electrode pattern and a second transparent electrode pattern respectively in two directions that are approximately orthogonal, namely, a transverse direction and a longitudinal direction. For example, in the configuration of FIG. 3, the transparent electrode pattern of the laminate of the invention may be a second transparent electrode pattern 4, or may be a pad part 3a of the first transparent electrode pattern 3. In other words, in the following explanation for the laminate of the invention, the reference numeral for the transparent electrode pattern may be representatively indicated by "4"; however, the transparent electrode pattern in the laminate of the invention is not intended to be limited to the use as the second transparent electrode pattern 4 in the capacitive input device of the invention, and may also be used as, for example, a pad part 3a of the first transparent electrode pattern 3.

It is preferable that the laminate of the invention includes a non-patterned region in which the transparent electrode pattern is not formed. In the present specification, a non-patterned region means a region in which the transparent electrode pattern 4 is not formed.

FIG. 11 illustrates an embodiment in which the laminate of the invention includes the non-patterned region 22.

In regard to the laminate of the invention, it is preferable that a region in which the transparent substrate, the transparent film, and the photosensitive transparent resin layer are laminated in this layer configuration, is included in plane in at least a portion of the non-patterned region 22 in which the transparent electrode pattern 4 is not formed.

In regard to the laminate of the invention, it is preferable that in the region in which the transparent substrate, the transparent film, and the photosensitive transparent resin layer are laminated in this layer configuration, the transparent film and the photosensitive transparent resin layer are adjacent to each other.

However, in regions other than the non-patterned region 22, as long as there is no effect contradictory to the purport of the invention, other members may be disposed at any arbitrary positions. For example, in a case in which the laminate of the invention is used in a capacitive input device that will be described below, a mask layer 2, an insulating layer 5, a metal wiring section 6 and the like can be laminated thereon.

In regard to the laminate of the invention, it is preferable that the transparent substrate and the transparent film are adjacent to each other.

FIG. 11 illustrates an embodiment in which the transparent film 11 is laminated on the transparent substrate 1 adjacently thereto.

However, as long as there is no effect contradictory to the purport of the invention, a third transparent film may be laminated between the transparent substrate and the transparent film. For example, it is preferable that a third transparent film having a refractive index of 1.5 to 1.52 (not shown in FIG. 11) is included between the transparent substrate and the transparent film.

In regard to the laminate of the invention, it is preferable that the transparent film and the transparent electrode pattern are adjacent to each other.

FIG. 11 illustrates an embodiment in which the transparent electrode pattern 4 is adjacently laminated on a partial region of the transparent film 11.

As illustrated in FIG. 11, the shape of the edge of the transparent electrode pattern 4 is not particularly limited: however, the edge may have a tapered shape, and for example, the edge may have a tapered shape in which the plane on the transparent substrate side is larger than the plane on the side opposite to the transparent substrate.

Here, when the edge of the transparent electrode pattern has a tapered shape, the angle of the edge of the transparent electrode pattern (hereinafter, also referred to as "taper angle") is preferably 30° or less, more preferably 0.1° to 15°, and particularly preferably 0.5° to 5°.

In regard to the method for measuring the taper angle according to the present specification, the taper angle can be determined by taking a microscopic photograph of an edge of the transparent electrode pattern, approximating the taper part in the microscopic photograph to a triangle, and directly measuring the taper angle.

Figure 10:
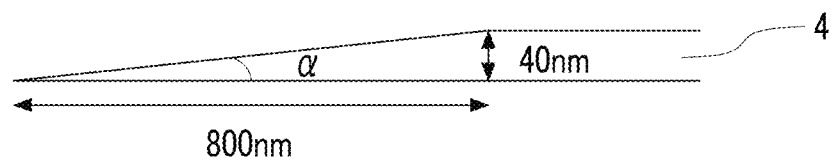
FIG. 10 is an explanatory diagram illustrating an example of a tapered shape of an edge of a transparent electrode pattern.

FIG. 10 illustrates an example of the case in which an edge of the transparent electrode pattern has a tapered shape. The triangle approximating the taper part in FIG. 10 has an underside of 800 nm and a height (film thickness at the upper base part that is approximately parallel to the underside) of 40 nm, and the taper angle α at this time is about 3°. The underside of the triangle approximating the taper part is preferably 10 to 3,000 nm, more preferably 100 to 1,500 nm, and particularly preferably 300 to 1,000 nm. A preferred range of the height of the triangle approximating the taper part is similar to the preferred range of the film thickness of the transparent electrode pattern.

It is preferable that the laminate of the invention includes a region in plane, in which the transparent electrode pattern and the photosensitive transparent resin layer are adjacent to each other.

FIG. 11 illustrates an embodiment in which, in the region 21 in which the transparent electrode pattern, the second transparent resin layer and the photosensitive transparent resin layer are laminated in this layer configuration, the transparent electrode pattern, the photosensitive transparent resin layer, and the second transparent resin layer are adjacent to each other.

In regard to the laminate of the invention, it is preferable that, in the region where the transparent electrode pattern is to be formed, both the transparent electrode pattern and the non-patterned region 22 in which the transparent electrode pattern is not formed are continuously covered, directly or with another layer interposed therebetween, by the transparent film and the photosensitive transparent resin layer.

Here, the term "continuously" means that the transparent film and the photosensitive transparent resin layer are not patterned films but are continuous films. That is, it is preferable that the transparent film and the photosensitive transparent resin layer do not have openings on the region where the transparent electrode pattern is formed, from the viewpoint of making the transparent electrode pattern not easily visually recognizable.

Furthermore, it is preferable that the transparent electrode pattern and the non-patterned region 22 are directly covered by the transparent film and the photosensitive transparent resin layer, rather than being covered with another layer interposed therebetween. The "other layer" in the case in which the transparent electrode pattern and the non-patterned region are covered with another layer interposed therebetween, may be an insulating layer 5 that is included in the capacitive input device of the invention that will be described below, and in a case in which two or more layers of transparent electrode patterns are included as in the case of the capacitive input device of the invention that will be described below, the "other layer" may be the second layer transparent electrode pattern.

FIG. 11 illustrates an embodiment in which the second transparent resin layer 12 is laminated over the region in which the transparent electrode pattern 4 is not laminated on the transparent film 11 and over the transparent electrode pattern 4, the two being adjacent to each other.

Furthermore, in a case in which the edge of the transparent electrode pattern 4 has a tapered shape, it is preferable that the second transparent resin layer 12 is laminated along the tapered shape (at the same gradient as the taper angle).

FIG. 11 illustrates an embodiment in which the photosensitive transparent resin layer 7 is laminated on the surface of the second transparent resin layer 12 on the side opposite to the surface on which the transparent electrode pattern has been formed.

<Transparent Electrode Pattern>

The laminate of the invention includes a transparent electrode pattern.

It is preferable that the transparent electrode pattern is a transparent electrode pattern that is disposed on a base material, and it is more preferable that the transparent electrode pattern is a transparent electrode pattern formed on a transparent film substrate.

The refractive index of the transparent electrode pattern is preferably 1.75 to 2.1.

The material for the transparent electrode pattern is not particularly limited, and any known material can be used. For example, the transparent electrode pattern can be produced from a light-transmissive conductive metal oxide film such as indium tin oxide (ITO) or indium zinc oxide (IZO). A transparent conductive film containing oxide of Zn (IZO) or these as a main component is attracting more attention depending on the applications, since the transparent conductive film has a higher etching rate than an ITO film does. Examples of such a conductive film include an ITO film; metal films of Al, Zn, Cu, Fe, Ni, Cr, and Mo; and metal oxide films of $SiO_2$.

The film thickness of the transparent electrode pattern is preferably 10 to 200 nm. Furthermore, in order to convert an amorphous ITO film into a polycrystalline ITO film through calcination, the electrical resistance may be reduced.

In addition to that, in a case in which a first conductive pattern or the like is formed using ITO or the like, reference may be made to paragraphs 0014 to 0016 of JP4506785B and the like. Above all, the transparent electrode pattern is preferably an ITO film or an IZO film, and particularly preferably an ITO film.

It is preferable that the transparent electrode pattern for the laminate of the invention is an ITO film having a refractive index of 1.75 to 2.1.

<Metal Wiring Section Electrically Connected to Transparent Electrode Pattern>

It is preferable that the laminate of the invention includes a metal wiring section that is electrically connected to the transparent electrode pattern.

Regarding the metal wiring section, for example, copper, gold, silver, aluminum, or alloys containing the aforementioned metals are used. In consideration of the balance between electrical conductivity and cost, a wiring using copper or an alloy containing copper is preferred.

The method for forming conduction between the metal wiring section and the transparent electrode pattern is not particularly limited, and it is acceptable as long as the two are electrically connected.

It is preferable that the photosensitive transparent resin layer and/or the second transparent resin layer are patterned, and it is more preferable that the photosensitive transparent resin layer and the second transparent resin layer are both patterned. It is even more preferable that the photosensitive transparent resin layer and the second transparent resin layer in the above-described region on the metal wiring section are both patterned.

When it is said that a layer is patterned, it means that a portion of the layer is intentionally removed, and thereby, a region in which the layer exists in the in-plane direction and a region in which the layer does not exist are formed. Regarding the patterning method, a method based on exposure and developing that will be described below may be preferably used.

According to the embodiment described above, connection between the metal wiring section and another flexible wiring is facilitated. An example of the laminate of the embodiment is the embodiment illustrated in FIG. 9.

According to the invention, when the protective film has superior resistance to moist heat and perspiration resistance, corrosion of the metal wiring section can be suppressed.

<Base Material>

The laminate of the invention includes a base material.

The base material is preferably a transparent substrate.

The transparent substrate may be a transparent glass substrate, or may be a transparent film substrate; however, the transparent substrate is preferably a transparent film substrate having a refractive index of 1.50 to 1.55. Furthermore, the refractive index of the transparent substrate is preferably 1.5 to 1.52, and a transparent film substrate having a refractive index of 1.50 to 1.52 is preferred.

In a case in which the transparent substrate is a transparent glass substrate (also referred to as light-transmissive substrate of glass), toughened glass represented by GORILLA GLASS of Corning. Inc. or the like can be used. Regarding the transparent substrate, the materials used in JP2010-86684A, JP2010-152809A and JP2010-257492A can be preferably used, the disclosures of which are incorporated herein.

In a case in which the transparent substrate is a transparent film substrate, the transparent film substrate is preferably a transparent resin film. Examples of the resin material that forms the transparent resin film include a poly(meth)acrylic resin, a cellulose triacetate (TAC)-based resin, a polyethylene terephthalate (PET)-based resin, a polycarbonate-based resin, and a cycloolefin-based resin. Among these, from the viewpoint of general-purpose usability, a cellulose triacetate (TAC)-based resin, a polyethylene terephthalate (PET)-based resin, and a cycloolefin-based resin are preferred. The dried film thickness of the transparent resin film is preferably in the range of 2 to 200 μm, and more preferably in the range of 2 to 100 μm. When the dried film thickness is 2 μm or more, sufficient mechanical strength of the film substrate is obtained, and handling operation of the roll is made easy. On the other hand, when the dried film thickness is 200 μm or less, bending characteristics are enhanced, and handling operation of the roll is made easy.

<Transparent Film>

It is preferable that the laminate of the invention further has a transparent film for reducing interfacial reflection between the transparent electrode pattern and the transparent film substrate. The refractive index of the transparent film is preferably 1.60 to 1.78, and more preferably 1.65 to 1.74. Furthermore, the film thickness of the transparent film is preferably 55 to 110 nm, more preferably 60 to 110 nm, and even more preferably 70 to 110 nm.

Here, the transparent film may have a single-layer structure, or may have a laminated structure of two or more layers. In a case in which the transparent film has a laminated structure of two or more layers, the refractive index of the transparent film means the refractive index of the layers as a whole, and the film thickness of the transparent film means the total film thickness of the layers as a whole. As long as such a range of refractive index is satisfied, the material for the transparent film is not particularly limited.

A preferred range of the material for the transparent film and preferred ranges of the physical properties such as refractive index are similar to the preferred ranges of the material and the properties of the photosensitive transparent resin layer.

The laminate of the invention is preferably such that the transparent film is a transparent resin film. There are no particular limitations on the metal oxide particles, binder polymer, and other additives that are used for the transparent resin film as long as there is no effect contradictory to the purport of the invention, and the resins or other additives that are used for the photosensitive transparent resin for the transparent film of the invention can be preferably used.

Regarding the laminate of the invention, the transparent film may also be an inorganic film.

Regarding the inorganic film, the inorganic films used in JP2010-86684A, JP2010-152809A, JP2010-257492A and the like can be used, and it is preferable to use an inorganic film having a laminated structure of a low refractive index material and a high refractive index material as described in these patent literatures, or an inorganic film of a mixed film of a low refractive index material and a high refractive index material, from the viewpoint of controlling the refractive index. Regarding the low refractive index material and the high refractive index material, the materials used in JP2010-86684A, JP2010-152809A and JP2010-257492A can be preferably used, the disclosures of which are incorporated herein.

The inorganic film may be a mixed film of $SiO_2$ and $Nb_2O_5$, and in that case, it is more preferable that the inorganic film is a mixed film of $SiO_2$ and $Nb_2O_5$ formed by sputtering.

<Additional Transparent Film>

The laminate of the invention may further include an additional transparent film.

It is preferable that the additional transparent film is included between a base material and a transparent film, and it is more preferable that the additional transparent film is included between a transparent substrate and a transparent film.

The refractive index of the additional transparent film should be close to the refractive index of the base material. From the viewpoint of ameliorating visibility of the transparent electrode pattern, the refractive index is preferably 1.50 to 1.55, and more preferably 1.50 to 1.52.

<Hard Coat Layer>

Between the base material and the transparent electrode pattern, a hard coat layer may be introduced instead of the above-mentioned transparent film having a refractive index of 1.60 to 1.78 and a film thickness of 55 to 110 nm. The hard coat layer may be formed by a dry process such as a vacuum vapor deposition method, a sputtering method or an ion plating method: or by a wet method (coating method). Regarding the wet method (coating method), a coating method using a roll coater, a reverse roll coater, a gravure coater, a microgravure coater, a knife coater, a bar coater, a wire bar coater, a die coater, or a dip coater can be used.

The hard coat layer is introduced from the viewpoint of easy sliding properties or from the viewpoint of enhancing hardness, and is formed by, for example, a cured product obtained by curing a reactive silicon compound such as tetraethoxysilane, or a curable composition having a polyfunctional (meth)acrylate or the like by means of heat, ultraviolet radiation (UV) or ionizing radiation. Inorganic fine particles such as colloidal silica may also be added thereto, and the refractive index of the hard coat layer is adjusted to be about 1.45 to 1.55.

<Formation of Transparent Electrode Pattern on Both Surfaces of Base Material>

The transparent electrode pattern may be formed only on one surface of the base material, or may be formed on both surfaces. The base material is preferably a transparent substrate, and more preferably a transparent film substrate. In a case in which the electrode pattern is formed on both surfaces of the base material, the hard coat layer and the optical adjustment layer formed between the transparent substrate and the transparent electrode pattern may be formed symmetrically on both surfaces, or may be formed asymmetrically, in terms of dried film thickness or layer configuration. In a case in which the transparent electrode pattern is formed on both surfaces of the base material, it is preferable that the photosensitive transparent resin layer and the second transparent resin layer included in the transfer film of the invention are transferred to both surfaces.

That is, it is preferable that the laminate of the invention has the transparent electrode pattern, the photosensitive transparent resin layer and the second transparent resin layer on each of the two surfaces of a transparent film substrate. An example of the configuration of the laminate in this case is the embodiment illustrated in FIG. 1A that will be described below.

(Method for Forming Protective Film for Touch Panel Electrode)

One embodiment of the method for forming a protective film for a touch panel electrode of the invention includes an arrangement step of providing a photosensitive transparent resin layer formed of the composition for forming a touch panel electrode protective film of the invention, on a base material having a touch panel electrode; an exposure step of exposing at least a portion of the photosensitive transparent resin layer to active light rays; and a developing step of developing the exposed photosensitive transparent resin layer, in this order.

Furthermore, another embodiment of the method for forming a protective film for a touch panel electrode includes an arrangement step of providing a photosensitive transparent resin layer on a base material having a touch panel electrode, using the transfer film of the invention; an exposure step of exposing at least a portion of the photosensitive transparent resin layer to active light rays; and a developing step of developing the exposed photosensitive transparent resin layer, in this order.

In a case in which the laminate of the invention further has a second transparent resin layer, the photosensitive transparent resin layer and the second transparent resin layer can be transferred at the same time, and a laminate that is free from the problem that the transparent electrode pattern is visually recognized can be produced easily with high productivity.

Furthermore, the touch panel electrode is preferably a transparent electrode pattern formed on a transparent film substrate.

<Arrangement Step>

It is preferable that the method for forming a protective film for a touch panel electrode of the invention includes an arrangement step of providing a photosensitive transparent resin layer formed of the composition for forming a touch panel electrode protective film of the invention.

In regard to the arrangement step, it is preferable that the photosensitive transparent resin layer is formed by applying the composition for forming a touch panel electrode protective film of the invention on a touch panel electrode.

Regarding the method for applying the composition for forming a touch panel electrode protective film of the invention, any known method can be used without any particular limitations, and for example, a method of forming a film by applying the composition using a coating machine such as a spinner, a whirler, a roll coater, a curtain coater, a knife coater, a wire bar coater or an extruder, and drying the composition, may be preferably used.

Furthermore, in regard to the arrangement step, it is preferable that a second transparent resin layer is further formed by applying a second resin composition on a touch panel electrode.

The second resin composition has the same meaning as the second resin composition explained in connection with the transfer film, and preferred range thereof is also similar.

Regarding the method of applying the second resin composition, any known method can be used without any particular limitations, and for example, a method of forming a layer by applying the composition using a coating machine such as a spinner, a whirler, a roll coater, a curtain coater, a knife coater, a wire bar coater or an extruder, and drying the composition, may be preferably used.

In the case of forming a second transparent resin layer, the photosensitive transparent resin layer is applied on the second transparent resin layer.

In regard to the arrangement step, it is also preferable to provide a photosensitive transparent resin layer using the transfer film of the invention.

The arrangement step of providing a photosensitive transparent resin layer using the transfer film of the invention is a step of laminating (bonding) the photosensitive transparent resin layer of the transfer film of the invention on a transparent electrode pattern. At this time, in a case in which the transfer film has the above-mentioned protective film, it is preferable to have the protective film removed before lamination.

It is also preferable that the transfer film includes a second transparent resin layer.

Lamination of the photosensitive transparent resin layer (and second transparent resin layer) onto the surface of a transparent electrode pattern is carried out by superposing the photosensitive transparent resin layer (and second transparent resin layer) on the surface of a transparent electrode pattern, and pressing and heating the assembly. For the bonding process, a known laminator such as a laminator, a vacuum laminator, or an autocut laminator, which can further increase productivity, can be used.

<Peeling Step of Peeling Temporary Support>

In a case in which a photosensitive transparent resin layer is provided using the transfer film of the invention in the arrangement step, it is preferable that the method for forming a protective film for a touch panel electrode of the invention further includes a peeling step of peeling the temporary support after the arrangement step.

The method for peeling the temporary support is not particularly limited, and any known method can be used. Furthermore, the peeling step may be carried out prior to the exposure step that will be described below, or may be carried out between the exposure step and the developing step.

<Step of Surface Treating Base Material>

Furthermore, the method for producing a laminate of the invention may include a step of surface-treating the base material, by which the non-contact surface of the substrate (transparent film substrate or front face plate) is subjected to a surface treatment, before the arrangement step, in order to increase the adhesiveness of the various layers formed during the arrangement step. Regarding the surface treatment, it is preferable to perform a surface treatment using a silane compound (silane coupling treatment). It is preferable that the silane coupling agent has a functional group capable of interacting with a photosensitive resin. For example, a silane coupling liquid (0.3 mass % aqueous solution of N-β(aminoethyl)-γ-aminopropyltrimethoxysilane, trade name: KBM603, manufactured by Shin-Etsu Chemical Co., Ltd.) is sprayed by showering for 20 seconds, and the surface is washed by showering pure water. Subsequently, the laminate is allowed to react by heating. A heating bath may be used, and the reaction can also be accelerated by preliminary heating of the substrate of the laminator.

A preferred embodiment of the base material is similar to the preferred embodiment of the base material for the laminate of the invention.

<Step of Forming Transparent Electrode Pattern>

The method for manufacturing a laminate of the invention may also include a step of forming a transparent electrode pattern.

The transparent electrode pattern can be formed on a base material, or on the transparent film having a refractive index of 1.60 to 1.78 and a film thickness of 55 to 110 nm, using the methods for forming a first transparent electrode pattern 3, a second transparent electrode pattern 4 and a metal wiring section 6 described in the explanation for the capacitive input device of the invention that will follow. A method of using a photosensitive film is preferred. It is preferable that the step of forming a transparent electrode pattern is carried out prior to the arrangement step.

<Exposure Step>

It is preferable that the method for forming a protective film for a touch panel electrode of the invention further includes an exposure step of exposing at least a portion of the photosensitive transparent resin layer to active light rays.

Regarding an example of the exposure step, the step of performing developing, and other processes, the method described in paragraphs 0035 to 0051 of JP2006-23696A can be suitably used.

If necessary, it is also acceptable to perform the exposure step and the developing step on layers other than the photosensitive transparent resin layer.

The exposure step is a step of exposing the photosensitive transparent resin layer arranged on the transparent electrode pattern.

In regard to the arrangement step, in a case in which a second transparent resin layer is formed, it is preferable that the exposure step is a step of exposing the photosensitive transparent resin layer and the second transparent resin layer.

Specifically, a method of disposing a predetermined mask above the photosensitive transparent resin layer and/or the second transparent resin layer that have been formed on the transparent electrode pattern, and subsequently exposing the photosensitive transparent resin layer and/or the second transparent resin layer from above the mask through the mask; or a method of exposing the entire surface of the photosensitive transparent resin layer and/or the second transparent resin layer without using a mask, may be used.

Here, regarding the light source for exposure, any light source that can emit light having a wavelength range capable of curing the photosensitive transparent resin layer and/or the second transparent resin layer (for example, 365 nm or 405 nm) can be appropriately selected and used. Specific examples include an ultrahigh pressure mercury lamp, a high pressure mercury lamp, and a metal halide lamp. The amount of exposure is usually about 5 to 200 $mJ/cm^2$, and preferably about 10 to 100 $mJ/cm^2$.

<Developing Step>

It is preferable that the method for forming a protective film for a touch panel electrode of the invention further includes a developing step of developing the exposed photosensitive transparent resin layer.

In regard to the arrangement step, in a case in which the second transparent resin layer is formed, it is preferable that the developing step is a step of developing the exposed photosensitive transparent resin layer and/or the second transparent resin layer.

The developing step is not intended to mean a developing step in a narrow sense, by which the photosensitive transparent resin layer and the second transparent resin layer that have been exposed patternwise are developed patternwise using a developer, but is meant to also include the case in which only the thermoplastic resin layer or the interlayer is removed after exposure of the entire surface, and the photosensitive transparent resin layer and the second transparent resin layer themselves do not have any pattern formed therein.

The developing process can be carried out using a developer. The developer is not particularly limited, and any known developer, such as the developers described in JP1993-72724A (JP-H05-72724A), can be used. The developer is preferably a developer which exhibits a developing behavior of a type in which the photosensitive transparent resin layer is dissolved, and for example, a developer including a compound having a pKa of 7 to 13 at a concentration of 0.05 to 5 mol/L is preferred. The developer may also include a small amount of an organic solvent that is miscible with water. Examples of the organic solvent that is miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethyl phosphoramide, ethyl lactate, methyl lactate, ε-caprolactam, and N-methylpyrrolidone. The concentration of the organic solvent is preferably 0.1% by mass to 30% by mass. Also, known surfactants can be further added to the developer. The concentration of the surfactants is preferably 0.01% by mass to 10% by mass.

Regarding the method for developing, any of methods such as puddle developing, shower developing, shower and spinning developing, dip developing and the like may be used. Here, to explain the shower developing method, an uncured part can be removed by spraying a developer by showering to the photosensitive transparent resin layer and the second transparent resin layer after exposure. Furthermore, in a case in which a thermoplastic resin layer or an interlayer is provided on a photosensitive film having a photosensitive transparent resin layer that is used for etching of the transparent electrode pattern, it is preferable to have the thermoplastic resin layer, the interlayer and the like removed in advance before developing, by spraying an alkaline liquid having low dissolubility for the photosensitive transparent resin layer, by showering or the like. Furthermore, it is preferable to remove a developing residue after developing, by spraying a detergent or the like by showering and scrubbing with a brush or the like. The liquid temperature of the developer is preferably 20° C. to 40° C., and the pH of the developer is preferably 8 to 13.

Furthermore, the exposure step may be carried out after peeling the temporary support, or exposure may be performed before the temporary support is peeled off, and then the temporary support may be peeled off. The exposure may be exposure through a mask, or may be digital exposure using a laser or the like.

<Other Steps>

The method for producing a laminate described above may also include other steps such as a post-exposure process and a post-bake process. In a case in which the photosensitive transparent resin layer (and the second transparent resin layer) is a transparent resin layer(s) having thermosetting properties, it is preferable to carry out a post-bake process after the developing step.

<Step of Forming Transparent Film>

It is preferable that the method for producing a laminate of the invention includes a step of forming a transparent film.

In regard to the step of forming a transparent film, in a case in which the laminate has a transparent film having a refractive index of 1.60 to 1.78 and a film thickness of 55 to 110 nm on the transparent electrode pattern on the side opposite to the side where the second transparent resin layer is formed, the transparent film is formed directly on the transparent electrode pattern, or with another layer such as the above-described additional transparent film interposed between the transparent film and the transparent electrode pattern.

The method for forming the transparent film is not particularly limited; however, it is preferable to form the transparent film by transfer or sputtering.

Above all, the step of forming a transparent film is preferably a step of forming a transparent film by transferring a transparent curable resin film formed on a temporary support onto the transparent substrate and forming a film and more preferably a step of forming a transparent film by curing the transparent curable resin film after transfer, and forming a film. Regarding the method for transfer and curing, there may be mentioned a method of performing transfer, exposure, developing and other processes similarly to the method of transferring the photosensitive transparent resin layer and the second transparent resin layer in connection to the method for producing a laminate of the invention using a photosensitive film, in the explanation for the capacitive input device of the invention that will be described below. In that case, it is preferable to adjust the refractive index of the transparent film to the range described above, by dispersing the metal oxide fine particles in the photocurable resin layer in the photosensitive film.

On the other hand, in a case in which the transparent film is an inorganic film, it is preferable that the transparent film is formed by sputtering. That is, in regard to the laminate of the invention, it is also preferable that the transparent film is formed by sputtering.

Regarding the sputtering method, the methods used in JP2010-86684A, JP2010-152809A, and JP2010-257492A can be preferably used, the disclosures of which are incorporated herein.

<Step of Forming Additional Transparent Film>

It is preferable that the method for producing a laminate of the invention includes a step of forming an additional transparent film.

The step of forming an additional transparent film is a step similar to the step of forming a transparent film.

(Protective Film for Touch Panel Electrode)

The protective film for a touch panel electrode of the invention is produced by the method for forming a protective film for a touch panel electrode of the invention.

(Capacitive Input Device)

The capacitive input device of the invention includes the laminate of the invention, or the protective film for a touch panel electrode of the invention.

It is preferable that the capacitive input device of the invention has a photosensitive transparent resin layer (and the second transparent resin layer) in which at least a portion has been exposed and developed. Since the capacitive input device of the invention needs to be connected to another wiring member (flexible printed substrate or the like) at a terminal of a lead wiring, it is preferable that the terminal of the lead wiring is not covered by the photosensitive transparent resin layer (and the second transparent resin layer).

Figure 13:
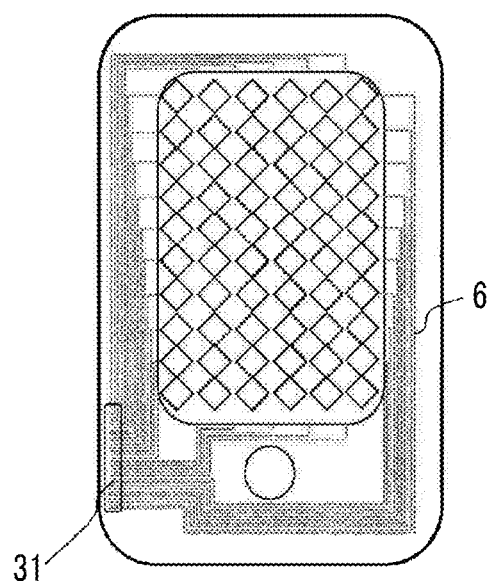
FIG. 13 is a top view illustrating another example of the configuration of the capacitive input device of the invention, and a schematic view illustrating an embodiment including a terminal (end portion) of a lead wiring that is not covered by a photosensitive transparent resin layer after patterning.

The above-described embodiment is illustrated in FIG. 13. FIG. 13 illustrates a capacitive input device having the following configuration, which includes a lead wiring (metal wiring section 6) of the transparent electrode pattern and a terminal 31 of the lead wiring.

The photosensitive transparent resin layer (and the second transparent resin layer) on the terminal 31 of the lead wiring has been removed through the patterning step (exposure step and developing step), and the terminal 31 of the lead wiring is exposed.

Figure 14:
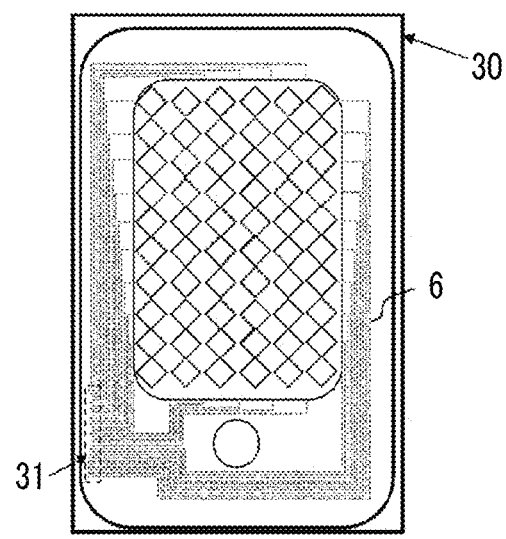
FIG. 14 is a schematic view illustrating an example of the transfer film of the invention having a photosensitive transparent resin layer and a second transparent resin layer, in a state of having been laminated on a transparent electrode pattern of a capacitive input device by a lamination process but before being patterned.
Figure 15:
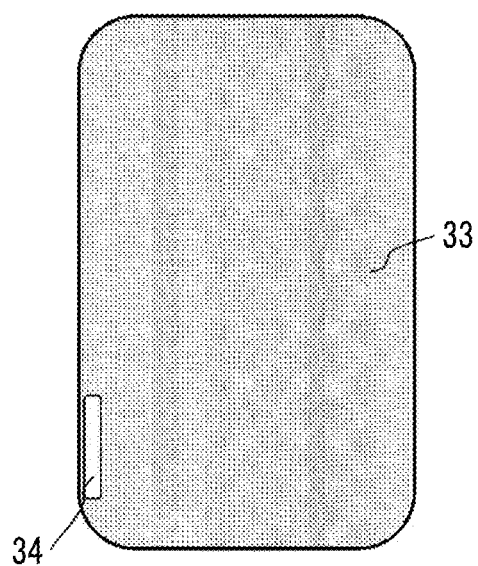
FIG. 15 is a schematic view illustrating an example of a desired pattern formed by a photosensitive transparent resin layer and a second transparent resin layer that have been cured.

Specific embodiments of exposure and developing are illustrated in FIG. 14 and FIG. 15. FIG. 14 illustrates a state in which the transfer film 30 of the invention having a photosensitive transparent resin layer and a second transparent resin layer has been laminated on a transparent electrode pattern of a capacitive input device by lamination, and a state before the laminated material is cured by exposure to light or the like. In the case of utilizing photolithography, that is, in the case of performing curing by exposure to light, the cured area (exposed portion) 33 of the photosensitive transparent resin layer and the second transparent resin layer having the shape illustrated in FIG. 15 can be obtained by performing patternwise exposure using a mask and developing of unexposed portions. Specifically, in FIG. 15, there are obtained an opening 34 that is an uncured area of the photosensitive transparent resin layer and the second transparent resin layer and corresponds to the terminal of the lead wiring; and cured areas (desired patterns) of the photosensitive transparent resin layer and the second transparent resin layer, which are intended not to cover the terminal (wiring lead-out portion) of the lead wiring, from which edges of the transfer film of the invention having the photosensitive transparent resin layer and the second transparent resin layer protruding outward from the contour of the frame part of the capacitive input device, have been eliminated.

As a result, another wiring member can be directly connected to the terminal 31 of the lead wiring, and thereby, signals of a sensor can be transmitted to an electrical circuit.

In the following description, the details of a preferred embodiment of the capacitive input device of the invention will be explained.

It is preferable that the capacitive input device of the invention has a base material (corresponding to the base material of the laminate of the invention), and at least the following elements of (3) and (6) to (8) on one side or on both sides of the base material, and also has the laminate of the invention:

(3) multiple first transparent electrode patterns formed by multiple pad parts extending in a first direction through connection parts;

(6) a metal wiring section electrically connected to the first transparent electrode patterns:

(7) a second transparent resin layer formed so as to cover the entirety or a portion of the elements (3) and (6); and (8) a photosensitive transparent resin layer formed so as to cover the element (7).

Here, the (8) photosensitive transparent resin layer corresponds to the photosensitive transparent resin layer in the laminate of the invention. It is preferable that the (8) photosensitive transparent resin layer is formed on the (6) metal wiring section, and it is preferable that a portion or the entirety of the photosensitive transparent resin layer in a region on the metal wiring section has been removed by patterning.

Furthermore, the (7) second transparent resin layer corresponds to the second transparent resin layer in the laminate of the invention. Meanwhile, it is preferable that the photosensitive transparent resin layer is a so-called transparent protective layer for capacitive input devices that are conventionally known.

The capacitive input device of the invention may have the following elements (4) and (5) between the (3) first transparent electrode patterns and/or the (6) metal wiring section and the (8) photosensitive transparent resin layer. Particularly, in a case in which the elements of (3) and (6) to (8) exist only on one side of the transparent substrate, it is preferable that the capacitive input device has the following elements (4) and (5):

(4) multiple second electrode patterns that are electrically insulated from the first transparent electrode patterns, and consist of multiple pad parts formed by extending in a direction perpendicularly intersecting the first direction; and (5) an insulating layer that electrically insulates the first transparent electrode patterns and the second electrode patterns.

The capacitive input device of the invention is preferably such that the (4) second electrode patterns are transparent electrode patterns.

Between the (3) first transparent electrode patterns and the (4) second electrode patterns, transparent ones correspond to the transparent electrode pattern in the laminate of the invention. In a case in which both of them are transparent, both of them correspond to the transparent electrode pattern in the laminate of the invention.

It is preferable that the capacitive input device of the invention further has the (2) transparent film disposed between the (3) first transparent electrode patterns and the base material; between the (4) second electrode patterns and the base material; or between the (6) metal wiring section and the base material. Here, it is preferable that the (2) transparent film corresponds to the transparent film having a refractive index of 1.60 to 1.78 and a film thickness of 55 to 110 nm in the laminate of the invention, from the viewpoint of further ameliorating visibility of the transparent electrode patterns.

The capacitive input device of the invention may further have (1) a mask layer and/or a decorative layer, if necessary. The mask layer is provided as a black frame around the region that is touched by a finger, a touch pen or the like, in order to make the lead wiring of the transparent electrode pattern invisible from the contact side, or to provide decoration. The decorative layer is provided for the purpose of decoration, and for example, a white decorative layer is provided.

In a case in which the (1) mask layer and/or decorative layer exists, it is preferable that the capacitive input device has the (1) mask layer and/or decorative layer disposed between the (2) transparent film and the base material, between the (3) first transparent electrode patterns and the base material; between the (4) second electrode patterns and the base material; or between the (6) metal wiring section and the base material. It is more preferable that the (1) mask layer and/or decorative layer is provided adjacently to the base material.

In a case in which the base material is a transparent film substrate, it is preferable that the (1) mask layer and/or decorative layer is further integrated with a cover glass that is disposed on the visible side of the base material. In the case of such an embodiment, it is preferable that the laminate of the invention does not have the (1) mask layer and/or decorative layer, from the viewpoint that in a case in which the second transparent resin layer and the photosensitive transparent resin layer are transferred from the transfer film of the invention, a level difference that may cause incorporation of air bubbles can be reduced.

In regard to the capacitive input device of the invention, even in a case in which the capacitive input device includes such various members, the transparent electrode pattern can be made invisible by including the second transparent resin layer that is disposed on the transparent electrode pattern, and the photosensitive transparent resin layer that is disposed on the second transparent resin layer. Thus, the problem of visibility of the transparent electrode pattern can be ameliorated. Furthermore, as described above, by adopting a configuration in which the transparent film having a refractive index of 1.60 to 1.78 and a film thickness of 55 to 110 nm and the second transparent resin layer described above are used, and a transparent electrode pattern is interposed therebetween, the problem of visibility of the transparent electrode pattern can be further ameliorated.

<Configuration of Capacitive Input Device>

First, a preferred configuration of the capacitive input device of the invention will be explained together with the method for producing the various members that constitute the device. FIG. 1A is a cross-sectional view illustrating an exemplary preferred configuration of the laminate or capacitive input device of the invention, the configuration of the capacitive input device having a transparent electrode pattern provided as a single layer on both sides of the base material. FIG. 1A illustrates an embodiment in which the capacitive input device 10 is configured to include a transparent substrate (transparent film substrate) 1, and symmetrically provided on both surfaces of the transparent substrate 1, a transparent film 11 having a refractive index of 1.60 to 1.78 and a film thickness of 55 to 110 nm: a transparent electrode pattern 4; a metal wiring section 6; a second transparent resin layer 12: and a photosensitive transparent resin layer 7. The laminate or capacitive input device of the invention is not intended to be limited to the configuration of FIG. 1A, and an embodiment in which the transparent film 11: the transparent electrode pattern 4: the metal wiring section 6; the second transparent resin layer 12; and the photosensitive transparent resin layer 7 are provided on only one surface of the transparent substrate 1 is also preferable.

Figure 1B:
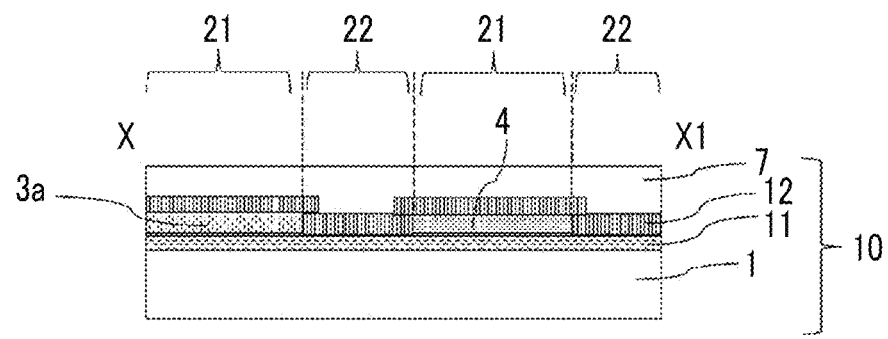
FIG. 1B is a schematic cross-sectional view illustrating another example of the configuration of the capacitive input device of the invention.

Furthermore, FIG. 1B, which illustrates a X-X1 cross-section shown in FIG. 3 that will be described below, is also a cross-sectional view illustrating an exemplary preferred configuration of the capacitive input device of the invention. FIG. 1B illustrates an example of a capacitive input device in which a first transparent electrode pattern and a second transparent electrode pattern are provided in two directions that are approximately orthogonal to each other, namely, a transverse direction and a longitudinal direction, as a transparent electrode pattern on one side of a transparent substrate. FIG. 1B shows an embodiment in which the capacitive input device 10 is configured to include a transparent substrate 1: a transparent film 11 having a refractive index of 1.60 to 1.78 and a film thickness of 55 to 110 nm; a first transparent electrode pattern 3; a second transparent electrode pattern 4; a second transparent resin layer 12: and a photosensitive transparent resin layer 7.

Regarding the transparent substrate (transparent film substrate or front face plate) 1, the materials mentioned as the material for the transparent electrode pattern of the laminate of the invention can be used.

Figure 2:
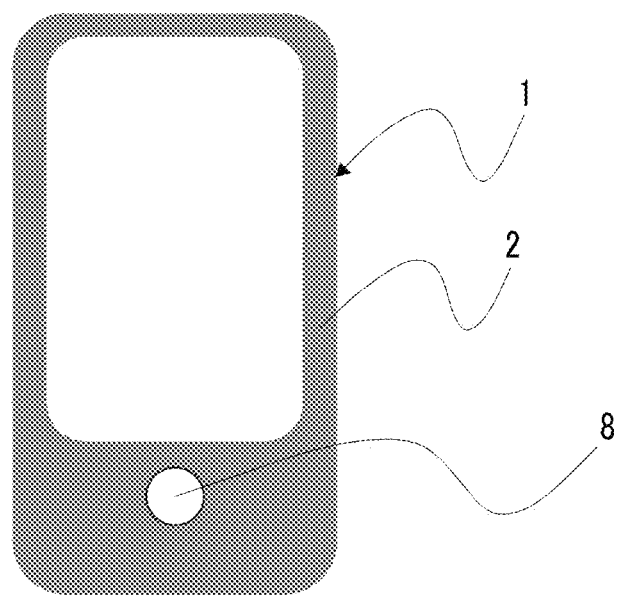
FIG. 2 is an explanatory diagram illustrating an example of a laminate according to the invention.

An example of the capacitive input device of the invention having a mask layer is illustrated in FIG. 2. The mask layer 2 is a frame-shaped pattern provided around the display region of the touch panel transparent substrate, and this is formed in order to make the lead wiring or the like invisible.

The capacitive input device 10 of the invention may be provided with, as illustrated in FIG. 2, a mask layer 2 so as to cover a partial region of the transparent substrate 1 (in FIG. 2, the region other than the input surface). Furthermore, the transparent substrate 1 may be provided with an opening 8 in a part, as illustrated in FIG. 2. A pressing-induced mechanical switch can be provided at the opening 8.

Figure 3:
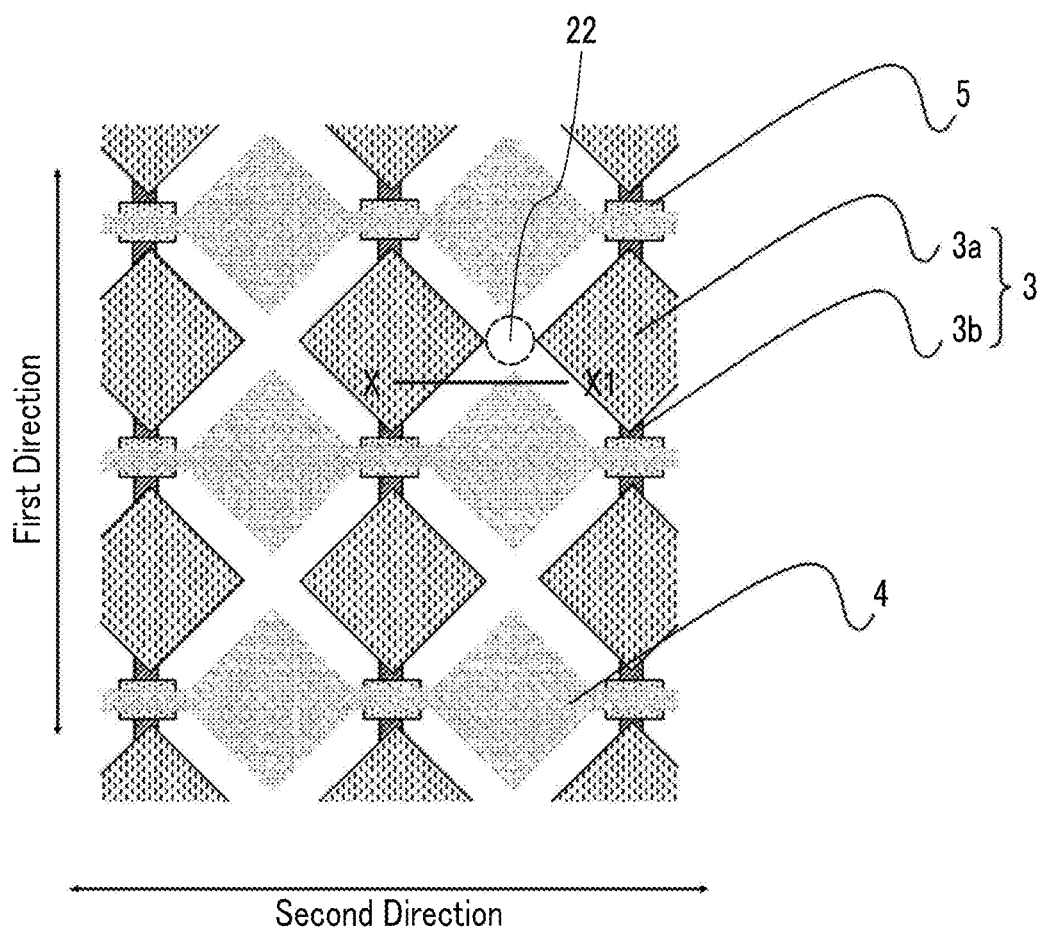
FIG. 3 is an explanatory diagram illustrating an example of the relationship between a transparent electrode pattern and a non-patterned region according to the invention.

An example of a capacitive input device having two layers of transparent electrode patterns on one side of a transparent substrate is illustrated in FIG. 3. Formed on the surface of the transparent substrate 1 are: multiple first transparent electrode patterns 3 formed by multiple pad parts extending in a first direction through connection parts; multiple second transparent electrode patterns 4, electrically insulated from the first transparent electrode patterns 3 and formed by multiple pad parts extending in a direction that perpendicularly intersects the first direction: and an insulating layer 5 electrically insulating the first transparent electrode patterns 3 and the second transparent electrode pattern 4. Regarding the first transparent electrode patterns 3, the second transparent electrode patterns 4, and the metal wiring section 6 described below, materials mentioned as the material for the transparent electrode pattern of the laminate of the invention can be used, and an ITO film is preferred.

The first transparent electrode patterns 3 and the second transparent electrode patterns 4 will be explained using FIG. 3. FIG. 3 is an explanatory diagram illustrating an example of the first transparent electrode pattern and the second transparent electrode pattern according to the invention. As illustrated in FIG. 3, the first transparent electrode patterns 3 are formed by pad parts 3a extending in a first direction through connection parts 3b. Furthermore, the second transparent electrode patterns 4 are electrically insulated from the first transparent electrode pattern 3 by means of the insulating layer 5, and are formed by multiple pad parts extending in a direction that perpendicularly intersects the first direction (second direction in FIG. 3). Here, in the case of forming the first transparent electrode patterns 3, the pad parts 3a and the connection parts 3b may be produced as integrated bodies, or only the connection parts 3b may be produced, while the pad parts 3a and the second transparent electrode patterns 4 may be produced (patterned) as integrated bodies. In a case in which the pad parts 3a and the second transparent electrode patterns 4 are produced (patterned) as integrated bodies, as illustrated in FIG. 3, various layers are formed such that portions of the connection parts 3b and portions of the pad parts 3a are connected, while the first transparent electrode patterns 3 and the second transparent electrode patterns 4 are electrically insulated by the insulating layer 5.

Furthermore, the region in FIG. 3 in which the first transparent electrode patterns 3, the second transparent electrode patterns 4, or the metal wiring section 6 that will be described below are not formed, corresponds to the non-patterned region 22 in the laminate of the invention.

It is preferable that the metal wiring section 6 is provided on the surface of the mask layer 2. The metal wiring section 6 is electrically connected to at least one of the first transparent electrode patterns 3 or the second transparent electrode patterns 4, and is an element different from the first transparent electrode pattern 3 and the second transparent electrode patterns 4.

Furthermore, it is preferable that the photosensitive transparent resin layer 7 is provided so as to cover all of the various constituent elements. The photosensitive transparent resin layer 7 may be configured so as to cover only a portion of the various constituent elements. The insulating layer 5 and the photosensitive transparent resin layer 7 may be formed of the same material, or may be formed of different materials. Regarding the material that constitute the insulating layer 5, the materials mentioned as the material for the photosensitive transparent resin layer or the second transparent resin layer of the laminate of the invention can be preferably used.

(Method for Manufacturing Capacitive Input Device)

Figure 4:
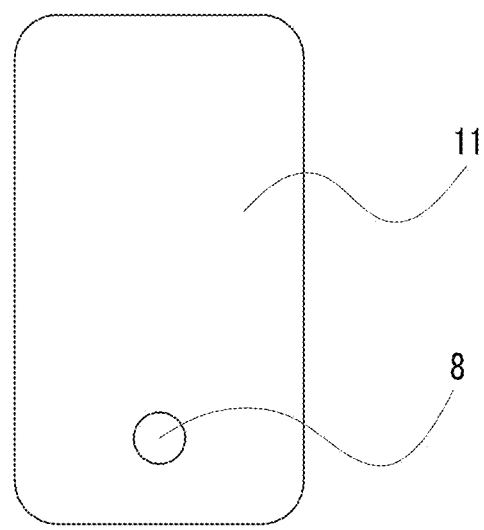
FIG. 4 is a top view illustrating an example of toughened glass having an opening formed therein.
Figure 5:
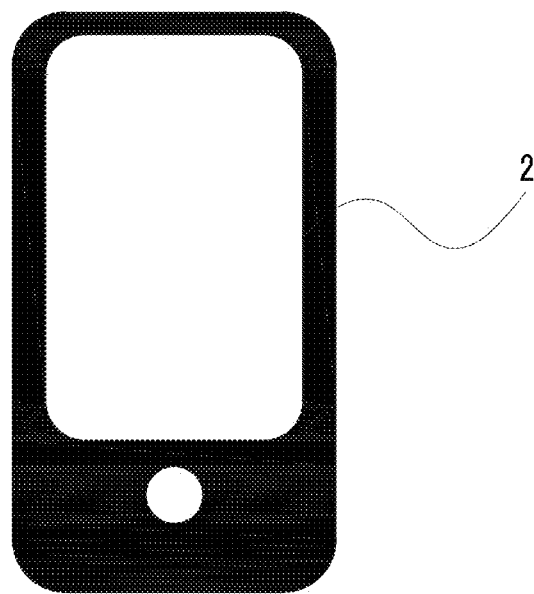
FIG. 5 is a top view illustrating an example of the laminate having a mask layer formed thereon.
Figure 6:
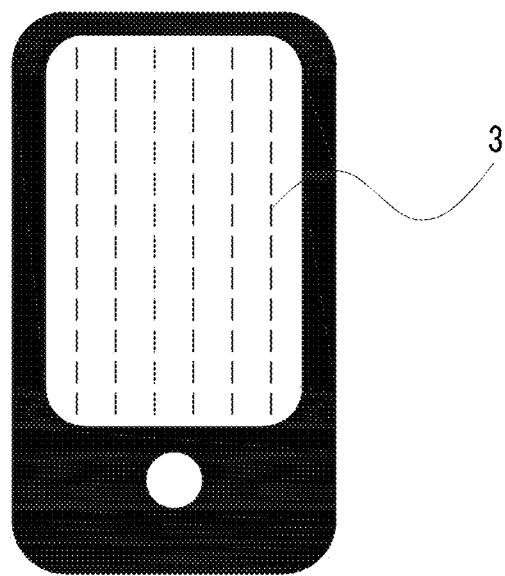
FIG. 6 is a top view illustrating an example of a laminate having a first transparent electrode pattern formed thereon.
Figure 7:
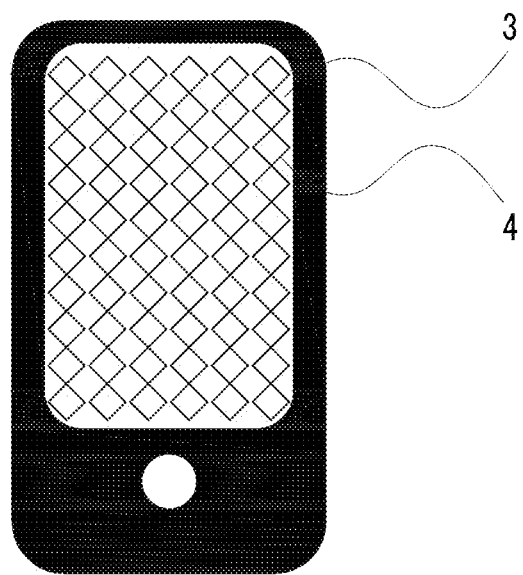
FIG. 7 is a top view illustrating an example of a laminate having first and second transparent electrode patterns formed thereon.
Figure 8:
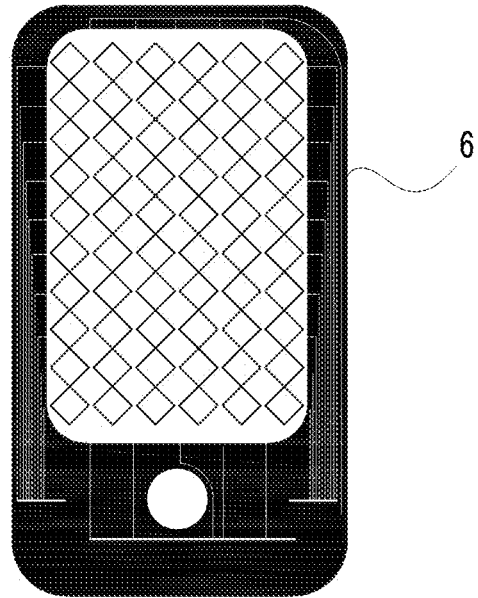
FIG. 8 is a top view illustrating an example of a laminate in which a conductive element other than first and second transparent electrode patterns is formed.

As exemplary embodiments that are formed during the process for manufacturing the capacitive input device of the invention, the embodiments illustrated in FIG. 4 to FIG. 8 may be mentioned. FIG. 4 is a top view illustrating an example of a toughened glass having an opening 8 formed thereon. FIG. 5 is a top view illustrating an example of a base material having a mask layer 2 formed thereon. FIG. 6 is a top view illustrating an example of a transparent substrate having a first transparent electrode pattern 3 formed thereon. FIG. 7 is a top view illustrating an example of a base material having a first transparent electrode pattern 3 and a second transparent electrode pattern 4 formed thereon. FIG. 8 is a top view illustrating an example of a base material having a photosensitive transparent resin layer, a second transparent electrode pattern, and a metal wiring section 6 formed thereon. These illustrate examples that specifically embody the following description, and the scope of the invention is not intended to be limitedly interpreted due to these drawings.

In regard to the method for manufacturing a capacitive input device, in a case in which the second transparent resin layer 12 and the photosensitive transparent resin layer 7 are formed, the second transparent resin layer 12 and the photosensitive transparent resin layer 7 can be formed by transferring the second transparent resin layer and the photosensitive transparent resin layer onto the surface of the transparent substrate 1 on which various elements have been arbitrarily formed, using the transfer film of the invention.

In regard to the method for manufacturing a capacitive input device, the mask layer 2, the first transparent electrode pattern 3, the second transparent electrode pattern 4, the insulating layer 5, and metal wiring section 6 can also be formed using a photosensitive film having a temporary support and a photocurable resin layer as this layer configuration.

In a case in which permanent materials such as the mask layer, the insulating layer, the first transparent electrode pattern, the second transparent electrode pattern and the metal wiring section are formed using the above-mentioned photosensitive film, the photosensitive film is laminated on an optional transfer-receiving member, and then is exposed to light patternwise as necessary. Then, a pattern can be obtained by eliminating the unexposed parts in the case of a negative type material, and by eliminating the exposed parts in the case of a positive type material, through a developing treatment. Regarding the developing, thermoplastic resin layers and photocurable resin layers may be developed and removed using different liquids, or may be removed using the same liquid. If necessary, a known developing facility such as a brush or a high-pressure jet may be used in combination. After the developing, if necessary, post-exposure and post-bake treatments may be implemented.

<Photosensitive Film>

The photosensitive film other than the transfer film of the invention, which is preferably used in the case of manufacturing the capacitive input device of the invention, will be explained. The photosensitive film has a temporary support and a photocurable resin layer, and it is preferable that the photosensitive film has a thermoplastic resin layer between the temporary support and the photocurable resin layer. When a mask layer and the like are formed using the aforementioned photosensitive film having a thermoplastic resin layer, air bubbles are not easily generated in the element formed by transferring the photocurable resin layer, image unevenness or the like does not easily occur in the image display device, and excellent display characteristics can be obtained.

The photosensitive film may be formed of a negative type material, or may be formed of a positive type material.

—Method for Producing Layers Other than Photocurable Resin Layer—

Regarding the temporary support for the photosensitive film, a temporary support similar to that used for the transfer film of the invention can be used. Regarding the thermoplastic resin layer used for the photosensitive film, the thermoplastic resin layer described in paragraph 0056 to 0060 of JP2014-10814A can be used. It is also acceptable to use a known interlayer or oxygen barrier layer together with the thermoplastic resin layer. Also, regarding the method for producing the photosensitive film, a method similar to the method for manufacturing a transfer film of the invention can be used.

—Photocurable Resin Layer—

In the photosensitive film, additives are added to the photocurable resin layer according to the use applications. That is, in the case of using the photosensitive film for forming a mask layer, a colorant is incorporated into the photocurable resin layer.

In a case in which the photosensitive film is formed of a negative type material, it is preferable that the photocurable resin layer includes an alkali-soluble resin, a polymerizable compound, and a polymerization initiator or a polymerization initiator system. Furthermore, a colorant, other additives, and the like are used: however, the invention is not intended to be limited to these.

—Alkali-Soluble Resin, Polymerizable Compound, and Polymerization Initiator—

Regarding the alkali-soluble resin, the polymerizable compound, and the polymerization initiator or polymerization initiator system to be included in the photosensitive film, an alkali-soluble resin, a polymerizable compound, a polymerization initiator or a polymerization initiator system that are similar to those used for the transfer film of the invention can be used.

—Colorant (in Case of being Used as Mask Layer)—

Furthermore, in a case in which the photosensitive film is used as a mask layer, a colorant can be used for the photocurable resin layer. Regarding the colorant that is used for the invention, known colorants (organic pigments, inorganic pigments, dyes, and the like) can be suitably used. According to the invention, in addition to a black colorant, a mixture of pigments of red, blue and green colors and the like can be used.

In a case in which the photocurable resin layer is used as a black mask layer, from the viewpoint of the optical density, it is preferable that the photocurable resin layer includes a black colorant. Examples of the black colorant include carbon black, titanium carbon, iron oxide, titanium oxide, and graphite, and among them, carbon black is preferred.

In a case in which the photocurable resin layer is used as a white mask layer, the white pigments described in paragraph 0015 or 0114 of JP2005-7765A can be used. In order to use the photocurable resin layer as a mask layer having another color, mixtures of the pigments described in paragraphs 0183 to 0185 of JP4546276B, or mixtures of dyes may be used. Specifically, the pigments and dyes described in paragraphs 0038 to 0054 of JP2005-17716A; the pigments described in paragraphs 0068 to 0072 of JP2004-361447A; the colorants described in paragraphs 0080 to 0088 of JP2005-17521A; and the like can be suitably used.

It is desirable that the colorant (preferably a pigment, and more preferably carbon black) is used in the form of a dispersion liquid. This dispersion liquid can be prepared by adding a composition that is obtainable by mixing in advance a colorant and a dispersing agent, to the organic solvent (or vehicle) that will be described below, and dispersing the composition therein. The term vehicle means the portion of a medium in which a pigment is dispersed, when a coating material is in a liquid state. The vehicle includes a component (binder) that is liquid and binds with the pigment to form a coating film, and a component (organic solvent) that dissolves and dilutes the aforementioned component.

The dispersing machine that is used at the time of dispersing the pigment is not particularly limited, and examples thereof include known dispersing machines such as a kneader, a roll mill, an attritor, a SUPERMILL, a DISSOLVER, a HOMOMIXER, and a SANDMILL, as described in Asakura. Kunizo. "Ganryo no Jiten (Dictionary of Pigments)", 1$^{st}$ Edition, Asakura Publishing Co., Ltd., 2000, p. 438. Furthermore, the pigment may also be finely pulverized by utilizing frictional force, by means of the mechanical attrition described in page 310 of the above-described document.

Regarding the colorant, from the viewpoint of dispersion stability, a colorant having a number average particle size of 0.001 µm to 0.1 µm is preferred, and a colorant having a number average particle size of 0.01 µm to 0.08 µm is more preferred. The "particle size" as used herein refers to the diameter obtainable when an electron microscopic photograph image of a particle is considered as a circle having the same area. Regarding the "number average particle size", the particle sizes of a large number of particles are determined, and the average value of any 100 particle sizes selected from among these is designated as the number average particle size.

The layer thickness of the photocurable resin layer including a colorant is preferably 0.5 to 10 µm, more preferably 0.8 to 5 µm, and particularly preferably 1 to 3 µm, from the viewpoint of the difference in the dried film thickness between the resin layer and other layers. The percentage content of the colorant in the solid content of the above-described colored photosensitive resin composition is not particularly limited: however, from the viewpoint of sufficiently shortening the developing time, the percentage content is preferably 15% to 70% by mass, more preferably 20% to 60% by mass, and even more preferably 25% to 50% by mass.

The total solid content as used in the present specification means the total mass of nonvolatile components excluding solvents and the like from the colored photosensitive resin composition.

Furthermore, in a case in which an insulating layer is formed using the photosensitive film, the layer thickness of the photocurable resin layer is preferably 0.1 to 5 μm, more preferably 0.3 to 3 μm, and particularly preferably 0.5 to 2 μm, form the viewpoint of maintaining insulating properties.

—Other Additives—

The photocurable resin layer may also use other additives. Regarding the additives, additives similar to those used for the transfer film of the invention can be used. Regarding the solvent used for producing the photosensitive film by application, a solvent similar to that used for the transfer film of the invention can be used.

Thus, a case in which the photosensitive film is formed of a negative type material has been mainly described: however, the photosensitive film may also be formed of a positive type material. In a case in which the photosensitive film is a positive type material, for example, the materials described in JP2005-221726A and the like are used for the photocurable resin layer; however, the invention is not intended to be limited thereto.

—Viscosity of Thermoplastic Resin Layer and Photocurable Resin Layer—

It is preferable that the viscosity of the thermoplastic resin layer measured at 100° C. is in the range of 1,000 to 10,000 Pa·sec, the viscosity of the photocurable resin layer measured at 100° C. is in the range of 2,000 to 50,000 Pa·sec, and the viscosities satisfy the following Expression (A):

$$\text{Viscosity of thermoplastic resin layer} < \text{viscosity of photocurable resin layer} \quad \text{Expression (A):}$$

Here, the viscosity of each layer can be measured as follows. A measurement sample is produced by removing the solvent from a coating liquid for a thermoplastic resin layer or a coating liquid for a photocurable resin layer by drying under atmospheric pressure or reduced pressure. The viscosity is measured using, for example, a VIBRON (Model DD-III; manufactured by Toyo Baldwin Co., Ltd.) as an analyzer, under the conditions of a measurement initiation temperature of 50° C., a measurement completion temperature of 150° C., a rate of temperature increase of 5° C./min, and a frequency of vibration of 1 Hz/deg. The measurement value obtained at 100° C. can be used.

(Formation of Mask Layer and Insulating Layer Using Photosensitive Film)

The mask layer 2 and the insulating layer 5 can be formed by transferring the photocurable resin layer onto the transparent substrate 1 or the like using the photosensitive film. For example, in the case of forming a black mask layer 2, the mask layer can be formed by using a photosensitive film such as described above, which has a black photocurable resin layer as the photocurable resin layer, and transferring the black photocurable resin layer onto the surface of the transparent substrate 1. In the case of forming the insulating layer 5, the insulating layer can be formed by using a photosensitive film such as described above, which has an insulating photocurable resin layer as the photocurable resin layer, and transferring the photocurable resin layer onto the surface of the transparent substrate 1 having a first transparent electrode pattern formed thereon.

Furthermore, when a photosensitive film such as described above, which has a particular layer configuration including a thermoplastic resin layer between a photocurable resin layer and a temporary support, is used for the formation of a mask layer 2 that needs light shielding properties, air bubble generation at the time of photosensitive film lamination is prevented, and thus a high-quality mask layer 2 and the like, which are free from light leakage, can be formed.

<Formation of First Transparent Electrode Pattern, Second Transparent Electrode Pattern and Metal Wiring Section Using Photosensitive Film>

The first transparent electrode pattern 3, the second transparent electrode pattern 4, and the metal wiring section 6 can be formed using an etching treatment or a photosensitive film having a conductive photocurable resin layer that will be described below, or by using the photosensitive film as a lift-off material.

—Etching Treatment—

In a case in which the first transparent electrode pattern 3, the second transparent electrode pattern 4, and the metal wiring section 6 are formed by an etching treatment, first, a transparent electrode layer such as ITO is formed by sputtering on the non-contact surface of a transparent substrate 1 having a mask layer 2 and the like formed thereon. Subsequently, an etching pattern is formed by exposure and developing, using a photosensitive film such as described above, which has a photocurable resin layer for etching as the photocurable resin layer on the transparent electrode layer. Thereafter, the transparent electrode layer is etched, thus the transparent electrode is patterned, and by eliminating the etching pattern, a first transparent electrode pattern 3 or the like can be formed.

Even in a case in which the photosensitive film is used as an etching resist (etching pattern), a resist pattern can be obtained in the same manner as the above-described method. Regarding the etching, etching and resist peeling can be applied by the known method described in paragraphs 0048 to 0054 of JP2010-152155A.

For example, regarding the method for etching, a wet etching method of immersing in an etching solution, which is generally practiced, may be used. Regarding the etching solution used for wet etching, an etching solution of an acidic type or an alkaline type may be selected as appropriate in accordance with the object of etching. Examples of the acidic type etching solution include an aqueous solution of an acidic component alone, such as hydrochloric acid, sulfuric acid, hydrofluoric acid, or phosphoric acid; and a mixed aqueous solution of an acidic component and a salt such as ferric chloride, ammonium fluoride, or potassium permanganate. Regarding the acidic component, a combination of multiple acidic components may also be used. Furthermore, examples of the alkaline type etching solution include an aqueous solution of an alkali component alone, such as sodium hydroxide, potassium hydroxide, ammonia, an organic amine, or a salt of an organic amine, such as tetramethylammonium hydroxide; and a mixed aqueous solution of an alkali component and a salt such as potassium permanganate. Regarding the alkali component, a combination of multiple alkali components may also be used.

The temperature of the etching solution is not particularly limited; however, the temperature is preferably 45° C. or lower. The resin pattern used as the etching mask (etching pattern) in the invention is a resin pattern formed using the photocurable resin layer described above, and exhibits especially excellent resistance to acidic and alkaline etching solutions in such a temperature range. Therefore, the resin pattern is prevented from being peeled off during the etching step, and the parts where the resin pattern does not exist are selectively etched.

After the etching, in order to prevent line contamination, a washing step and a drying step may be carried out as necessary. The washing step may be carried out by, for example, washing a base material on which various layers have been formed, using pure water at room temperature for 10 to 300 seconds. The drying step may be carried out using air blowing, and by adjusting the air blow pressure (about 0.1 to 5 kg/cm$^2$) as appropriate.

Next, the method for peeling the resin pattern is not particularly limited; however, for example, a method of immersing a base material on which various layers have been formed, for 5 to 30 minutes in a peeling solution that is being stirred at 30° C. to 80° C., and preferably at 50° C. to 80° C., may be used. The resin pattern used as an etching mask in the invention exhibits excellent chemical resistance at 45° C. or lower as explained above. However, when the chemical agent temperature rises to 50° C. or higher, the resin pattern exhibits a property of being swollen by an alkaline peeling solution. Due to such a property, when a peeling step is carried out using a peeling solution at 50° C. to 80° C., there is obtained an advantage that the duration of the process is shortened, and the amount of peeling residue of the resin pattern is reduced. That is, by providing a difference in the chemical agent temperature between the etching step and the peeling step, the resin pattern used as the etching mask in the invention exhibits satisfactory chemical resistance during the etching step, and exhibits satisfactory peeling properties during the peeling step. Thus, contrasting characteristics such as chemical resistance and peeling properties can be both satisfied.

Examples of the peeling solution include peeling solutions obtained by dissolving an inorganic alkali component such as sodium hydroxide or potassium hydroxide, or an organic alkali component such as a tertiary amine or a quaternary ammonium salt, in water, dimethyl sulfoxide, N-methylpyrrolidone, or a mixed solution thereof. Peeling may be carried out using the peeling solution, by means of a spraying method, a showering method, a paddling method or the like.

—Photosensitive Film Having Conductive Photocurable Resin Layer—

In a case in which the first transparent electrode pattern 3, the second transparent electrode pattern 4, and the metal wiring section 6 are formed using a photosensitive film such as described above, which has a conductive photocurable resin layer, these elements can be formed by transferring the conductive photocurable resin layer onto the surface of the transparent substrate 1.

When the first transparent electrode pattern 3 and the like are formed using the photosensitive film having a conductive photocurable resin layer, even on a transparent substrate having an opening, leakage of resist components through the opening portion does not occur, and a touch panel having advantages of being a thin layer and being lightweight can be produced by a simple process, without contaminating the backside of the substrate.

Furthermore, when a photosensitive film such as described above, which has a particular layer configuration having a thermoplastic resin layer between a conductive photocurable resin layer and a temporary support, is used for forming the first transparent electrode pattern 3 and the like, air bubble generation at the time of photosensitive film lamination is prevented, and a first transparent electrode pattern 3, a second transparent electrode pattern 4, and a metal wiring section 6, all of which have excellent electrical conductivity and low resistance, can be formed.

—Use of Photosensitive Film as Lift-Off Material—

A first transparent electrode layer, a second transparent electrode layer, and other conductive members can also be formed using the photosensitive film as a lift-off material. In this case, patterning is performed using the photosensitive film, subsequently a transparent conductive layer is formed over the entire surface of a base material on which various layers have been formed, and then dissolution and removal of the photocurable resin layer together with the deposited transparent conductive layer is carried out. Thus, a desired transparent conductive layer pattern can be obtained (lift-off method).

(Image Display Device)

The image display device of the invention comprises the capacitive input device of the invention as a constituent element.

In regard to the capacitive input device of the invention and an image display device comprising this capacitive input device, the configurations disclosed in "Saishin Tatchipaneru Gijutsu (Latest Touch panel Technologies)" (published by Techno Times Co., Ltd., on Jul. 6, 2009): Mitani, Yuji, reviewed. "Tatchipaneru no Gijutsui to Kaihatsu (Technology and Development of Touch panels)", published by CMC Publishing Co., Ltd. (December, 2004); FPD International 2009 Forum T-11, Lecture textbook: and Cypress Semiconductor Corporation Application Note AN2292; and the like can be applied.

EXAMPLES

Hereinafter, the invention will be more specifically described by way of Examples. The materials, the use amounts, proportions, details of treatments, treatment procedures, and the like described in the following Examples can be appropriately modified, as long as the gist of the invention is maintained. Therefore, the scope of the invention is not intended to be limited to the specific examples described below. Meanwhile, unless particularly stated otherwise, the units "parts" and "%" are on a mass basis.

Examples 1 to 31 and Comparative Examples 1 to 5

1. Preparation of Materials for Transfer Film

<Production of Composition for Forming Touch Panel Electrode Protective Film>

Composition 1 to Composition 28 for forming a touch panel electrode protective film were produced using the various components described in the following Table 1 to Table 3.

In Table 1 to Table 3, the numerical values described in the columns for the various compositions represent the contents (parts by mass) of the relevant compounds, and description of the symbol "–" represents that the relevant component is not included.

TABLE 1

| Component | | Composition 1 | Composition 2 | Composition 3 | Composition 4 | Composition 5 | Composition 6 | Composition 7 | Composition 8 | Composition 9 | Composition 10 | Composition 11 |
|---|---|---|---|---|---|---|---|---|---|---|---|---|
| Component A | A-1 | 3.30 | 3.95 | 5.27 | 5.93 | 6.59 | — | — | — | 5.27 | 5.27 | 5.27 |
| | A-2 | — | — | — | — | — | 3.95 | — | — | — | — | — |
| | A-3 | — | — | — | — | — | — | 3.95 | — | — | — | — |
| | A-4 | — | — | — | — | — | — | — | 3.95 | — | — | — |
| | A-5 | — | — | — | — | — | — | — | — | — | — | — |
| | A-6 | — | — | — | — | — | — | — | — | — | — | — |
| | A-7 | — | — | — | — | — | — | — | — | — | — | — |
| | A-8 | — | — | — | — | — | — | — | — | — | — | — |
| Component D | D-1 | 3.30 | 2.64 | 1.32 | 0.66 | — | 2.64 | 2.64 | 2.64 | — | — | 1.32 |
| | D-2 | — | — | — | — | — | — | — | — | 1.32 | — | — |
| | D-3 | — | — | — | — | — | — | — | — | — | 1.32 | — |
| Component B | B-1 | 29.30 | 29.30 | 29.30 | 29.30 | 29.30 | 29.30 | 29.30 | 29.30 | 29.30 | 29.30 | — |
| | B-2 | — | — | — | — | — | — | — | — | — | — | 29.30 |
| Component C | C-1 | 0.16 | 0.16 | 0.16 | 0.16 | 0.16 | 0.16 | 0.16 | 0.16 | 0.16 | 0.16 | 0.16 |
| | C-2 | — | — | — | — | — | — | — | — | — | — | — |
| | C-3 | — | — | — | — | — | — | — | — | — | — | — |
| | C-4 | — | — | — | — | — | — | — | — | — | — | — |
| Additive | F-1 | 0.07 | 0.07 | 0.07 | 0.07 | 0.07 | 0.07 | 0.07 | 0.07 | 0.07 | 0.07 | 0.07 |
| | F-2 | — | — | — | — | — | — | — | — | — | — | — |
| | F-3 | 0.01 | 0.01 | 0.01 | 0.01 | 0.01 | 0.01 | 0.01 | 0.01 | 0.01 | 0.01 | 0.01 |
| Component E | E-1 | 27.70 | 27.70 | 27.70 | 27.70 | 27.70 | 27.70 | 27.70 | 27.70 | 27.70 | 27.70 | 27.70 |
| | E-2 | 36.20 | 36.20 | 36.20 | 36.20 | 36.20 | 36.20 | 36.20 | 36.20 | 36.20 | 36.20 | 36.20 |
| Total (parts by mass) | | 100.0 | 100.0 | 100.0 | 100.0 | 100.0 | 100.0 | 100.0 | 100.0 | 100.0 | 100.0 | 100.0 |

TABLE 2

| Component | | Composition 12 | Composition 13 | Composition 14 | Composition 15 | Composition 16 | Composition 17 | Composition 18 | Composition 19 | Composition 20 | Composition 21 | Composition 22 |
|---|---|---|---|---|---|---|---|---|---|---|---|---|
| Component A | A-1 | 5.27 | 5.27 | 4.74 | 1.32 | 2.64 | 2.64 | — | — | — | — | — |
| | A-2 | — | — | — | — | — | — | — | — | — | — | — |
| | A-3 | — | — | — | — | — | — | — | — | — | — | — |
| | A-4 | — | — | — | — | — | — | — | — | — | — | — |
| | A-5 | — | — | — | — | — | — | 3.95 | 5.93 | — | — | — |
| | A-6 | — | — | — | — | — | — | — | — | 5.93 | — | — |
| | A-7 | — | — | — | — | — | — | — | — | — | 3.95 | — |
| | A-8 | — | — | — | — | — | — | — | — | — | — | 3.95 |
| Component D | D-1 | 1.32 | 1.32 | 1.19 | 5.27 | 3.95 | — | 2.64 | 0.66 | 0.66 | 2.64 | 2.64 |
| | D-2 | — | — | — | — | — | 3.95 | — | — | — | — | — |
| | D-3 | — | — | — | — | — | — | — | — | — | — | — |
| Component B | B-1 | 29.30 | 29.30 | 26.40 | 29.30 | 29.30 | 29.30 | 29.30 | 29.30 | 29.30 | 29.30 | 29.30 |
| | B-2 | — | — | — | — | — | — | — | — | — | — | — |
| Component C | C-1 | — | — | — | 0.16 | 0.16 | 0.16 | 0.16 | 0.16 | 0.16 | 0.16 | 0.16 |
| | C-2 | — | — | — | — | — | — | — | — | — | — | — |
| | C-3 | 0.16 | — | 0.15 | — | — | — | — | — | — | — | — |
| | C-4 | — | 0.16 | — | — | — | — | — | — | — | — | — |
| Additive | F-1 | 0.07 | 0.07 | 0.06 | 0.07 | 0.07 | 0.07 | 0.07 | 0.07 | 0.07 | 0.07 | 0.07 |
| | F-2 | — | — | 2.50 | — | — | — | — | — | — | — | — |
| | F-3 | 0.01 | 0.01 | 0.01 | 0.01 | 0.01 | 0.01 | 0.01 | 0.01 | 0.01 | 0.01 | 0.01 |
| Component E | E-1 | 27.70 | 27.70 | 28.10 | 27.70 | 27.70 | 27.70 | 27.70 | 27.70 | 27.70 | 27.70 | 27.70 |
| | E-2 | 36.20 | 36.20 | 36.88 | 36.20 | 36.20 | 36.20 | 36.20 | 36.20 | 36.20 | 36.20 | 36.20 |
| Total (parts by mass) | | 100.0 | 100.0 | 100.0 | 100.0 | 100.0 | 100.0 | 100.0 | 100.0 | 100.0 | 100.0 | 100.0 |

TABLE 3

| Component | | Composition 23 | Composition 24 | Composition 25 | Composition 26 | Composition 27 | Composition 28 |
|---|---|---|---|---|---|---|---|
| Component A | A-1 | — | 56.26 | — | 84.39 | 56.36 | 56.26 | 56.26 |
| | A-2 | — | — | 56.26 | — | — | — | — |
| Component D | D-2 | 28.13 | 28.13 | — | 28.18 | 28.13 | 28.13 |
| | D-4 | 9.38 | 9.38 | 9.38 | 9.39 | 9.38 | 9.38 |
| Component B | B-3 | — | 430.50 | 430.50 | 431.20 | 430.50 | 430.50 |
| | B-4 | 430.50 | — | — | — | — | — |

TABLE 3-continued

| Component | | Composition 23 | Composition 24 | Composition 25 | Composition 26 | Composition 27 | Composition 28 |
|---|---|---|---|---|---|---|---|
| Component C | C-4 | 2.15 | 2.15 | 2.15 | 2.16 | 2.15 | 2.15 |
| | C-5 | 1.08 | 1.08 | 1.08 | 1.08 | 1.08 | 1.08 |
| Additive | F-2 | 45.31 | — | — | 45.31 | 45.31 | — |
| | F-3 | — | — | — | 0.16 | — | — |
| | F-4 | — | 48.33 | 48.33 | — | — | 48.33 |
| | F-5 | 1.56 | 1.56 | 1.56 | — | 1.56 | 1.56 |
| Component E | E-2 | 425.6 | 422.6 | 422.6 | 426.1 | 425.6 | 422.6 |
| Total (parts by mass) | | 1000 | 1000 | 1000 | 1000 | 1000 | 1000 |

The compounds represented by the reference numerals in the tables are as follows.

[Component A]

A-1: Tricyclodecanedimethanol diacrylate (bifunctional, A-DCP, manufactured by Shin Nakamura Chemical Co., Ltd.)

A-2: 1,9-Decanediol diacrylate (bifunctional, A-DOD-N, manufactured by Shin Nakamura Chemical Co., Ltd.)

A-3: 1,9-Nonanediol dimethacrylate (bifunctional, NOD-N, manufactured by Shin Nakamura Chemical Co., Ltd.)

A-4: Neopentyl glycol dimethacrylate (bifunctional, NPG, manufactured by Shin Nakamura Chemical Co., Ltd.)

A-5: Dipropylene glycol diacrylate (bifunctional, APG-100, manufactured by Shin Nakamura Chemical Co., Ltd.)

A-6: Polypropylene glycol #400 dimethacrylate (bifunctional, 9PG, manufactured by Shin Nakamura Chemical Co., Ltd.)

A-7: Tetraacrylate of pentaerythritol ethylene oxide adduct (tetrafunctional, KAYARAD RP-1040, manufactured by Nippon Kayaku Co., Ltd.)

A-8: DPHA solution (hexafunctional, dipentaerythritol hexaacrylate: 38%, dipentaerythritol pentaacrylate: 38%, 1-methoxy-2-propyl acetate: 24%)

[Component D]

D-1: Polybasic acid-modified acrylic oligomer M-520 (pentafunctional to hexafunctional, manufactured by Toagosei Co., Ltd.)

D-2: Urethane acrylate 8UX-015A (pentadecafunctional, manufactured by Taisei Fine Chemical Co., Ltd.)

D-3: Ethoxylated isocyanuric acid triacrylate (trifunctional, A-9300S, manufactured by Shin Nakamura Chemical Co., Ltd.)

D-4: Polybasic acid-modified acrylic oligomer TO-2349 (pentafunctional to hexafunctional, manufactured by Toagosei Co., Ltd.)

[Component B]

B-1: Polymer solution 1 (Structural Formula P-25 described in paragraph 0058 of JP2008-146018A; weight-average molecular weight=35,000, acid value: 56 mg KOH/g)

B-2: Polymer solution 2 (copolymer of methacrylic acid/methyl methacrylate/butyl methacrylate; molecular weight 60,000, compositional ratio=30/30/40, acid value 106 mg KOH)

B-3: Polymer solution 3 (polymer solution containing a compound represented by the following Formula B; where x, l, y and z represent the percentage contents (mol %) of various monomer units, and x:l:y:z=51.5:2:26.5:20. Weight-average molecular weight=30,000, PGMEA solution solid content 36%)

B-4: Polymer solution 4 (polymer solution containing a compound represented by the following Formula B; where x, l, y and z represent the percentage contents (mol %) of various monomer units, and x:l:y:z=43:2:20:35. Weight-average molecular weight=40,000, PGMEA solution solid content 36%)

[Component C]

C-1: 2-Benzyl-2-dimethylamino-1-(4-morpholinophenyl)-butanone (IRGACURE 379, manufactured by BASF SE)

C-2: KAYACURE DETX-S (manufactured by Nippon Kayaku Co., Ltd., alkylthioxanthone)

C-3: 1,2-Octanedione, 1-[4-(phenylthio)-, 2-(O-benzoyloxime)] (IRGACURE OXE-01, manufactured by BASF SE)

C-4: 2-Methyl-1-(4-methylthiophenyl)-2-morpholinopropan-1-one (IRGACURE 907, manufactured by BASF SE)

C-5: Ethanone, 1-[9-ethyl-6-(2-methylbenzoyl)-9H-carbazol-3-yl]-, 1-(O-acetyloxime) (IRGACURE OXE-02, manufactured by BASF SE)

[Additives]

F-1: Phenothiazine (manufactured by Wako Pure Chemical Industries, Ltd.)

F-2: DURANATE TPA-B80E (manufactured Asahi Kasei Chemicals Corporation)

F-3: MEGAFACE F780 (manufactured by DIC Corporation)

F-4: Synthetic product caused by the following Synthesis Example (aqueous block polyisocyanate compound) F-5: MEGAFACE F551 (manufactured by DIC Corporation)

[Component E]

E-1: 1-Methoxy-2-propyl acetate

E-2: Methyl ethyl ketone

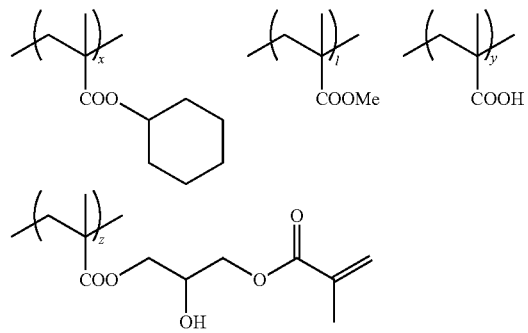

Formula B

[Synthesis of Aqueous Block Polyisocyanate Compound F-4]

A four-necked flask equipped with a stirrer, a thermometer, a reflux cooling tube, a nitrogen blowing tube, and a dropping funnel was purged to have a nitrogen atmosphere, 600 parts of HDI (hexamethylene diisocyanate) was added to the four-necked flask, and while the content was stirred, the temperature inside the reactor vessel was maintained at 70° C. Tetramethylammonium caprylate was added thereto as an isocyanurating catalyst, and at a time point at which the yield reached 40%, phosphoric acid was added to the reactor vessel to terminate the reaction. The reaction liquid was filtered, and then unreacted HDI was removed using a thin film evaporator can. Thus, a polyisocyanate compound was obtained.

The viscosity at 25° C. of the obtained polyisocyanate was 3,000 mPa·s, the isocyanate group concentration was 23.0%, the number average molecular weight was 670, the average number of isocyanate groups was 3.3, and the unreacted HDI concentration was 0.2% by mass.

100 parts of the obtained polyisocyanate compound and 50 parts of propylene glycol monomethyl ether acetate were added to a four-necked flask in a nitrogen atmosphere using an apparatus such as described above, and the mixture was mixed at 50° C. until the mixture became a uniform solution. Subsequently, 52.7 parts of methoxypolyethylene glycol (number average molecular weight 680, resin content hydroxyl number 82 mg KOH/g) was added thereto, subsequently the temperature was raised to 120° C. and the mixture was retained for 2 hours. Subsequently, the reaction liquid was adjusted to 70° C., and 40.2 parts of methyl ethyl keto oxime was added thereto. After one hour, the infrared spectrum of this reaction liquid was measured, and it was confirmed that absorption of isocyanate groups did not occur. Thus, an aqueous block polyisocyanate compound F-4 was obtained. The obtained solution was subjected to concentration adjustment, and the polymer concentration was adjusted to 75% by mass. The initial Tg of the aqueous block polyisocyanate compound F-4 was measured, and as a result, the initial Tg was −20° C. to 0° C.

<Production of Composition for Second Transparent Resin Layer>

Next, compositions B-1 to B-7 were produced as compositions for a second transparent resin layer, using the various components described in the following Table 4. In Table 4, the numerical values described in the columns for various compositions represent the contents (parts by mass) of the relevant compounds, and the description of the symbol "−" represents that the relevant component is not incorporated. The compositional ratios described in Table 4 represent molar ratios, and for example, the description of a copolymerized resin of methacrylic acid/methyl methacrylate (Mw: 15,000, compositional ratio=40/60, non-volatile content 99.8%) represents that the copolymer contains 40 mol % of a constitutional unit derived from methacrylic acid, and 60 mol % of a constitutional unit derived from methyl methacrylate.

TABLE 4

| Component | Composition B-1 | Composition B-2 | Composition B-3 | Composition B-4 | Composition B-5 | Composition B-6 | Composition B-7 |
|---|---|---|---|---|---|---|---|
| NANOUSE OZ-S30M: $ZrO_2$ particles methanol dispersion liquid (non-volatile fraction 30.5%) manufactured by Nissan Chemical Industries, Ltd. | 4.33 | 4.02 | 4.33 | 4.33 | 4.20 | — | 4.20 |
| Aqueous ammonia (25%) | 7.84 | 7.84 | 7.84 | 7.84 | 7.84 | — | 7.84 |
| $ZrO_2$: ZR-010 manufactured by Solar Co., Ltd. | — | — | — | — | — | 2.08 | — |
| Copolymerized resin of methacrylic acid/methyl methacrylate (Mw: 15,000, compositional ratio = 40/60, non-volatile fraction 99.8%) | — | — | 0.66 | — | — | — | — |
| Copolymerized resin of methacrylic acid/allyl methacrylate (Mw: 25,000, compositional ratio = 40/60, non-volatile fraction 99.8%) | 0.66 | 0.66 | — | — | — | — | 0.50 |
| Copolymerized resin of methacrylic acid/benzyl methacrylate (Mw: 30,000, compositional ratio = 30/70, non-volatile fraction 99.8%) | — | — | — | 0.66 | 0.66 | — | — |
| Phosphoric acid monomer (JPA-514, manufactured by Johoku Chemical Co., Ltd.) | — | 0.29 | — | — | — | — | — |
| Carboxylic acid-containing monomer ARONIX TO-2349 (manufactured by Toagosei Co., Ltd.) | — | — | — | — | — | — | 0.04 |
| Benzimidazole (manufactured by Wako Pure Chemical Industries, Ltd.) | — | — | — | 0.05 | — | — | — |
| Benzotriazole BT120 (manufactured by Johoku Chemical Co., Ltd.) | — | — | — | — | — | — | 0.04 |
| Water-soluble photopolymerization initiator IRGACURE 2959, manufactured by BASF SE | — | — | — | — | 0.04 | — | — |
| Ion exchanged water | 70.58 | 70.60 | 70.58 | 70.53 | 70.66 | — | 27.38 |
| Methanol | 16.59 | 16.59 | 16.59 | 16.59 | 16.59 | — | 60.00 |
| DPHA liquid (dipentaerythritol hexaacrylate: 38%, dipentaerythritol pentaacrylate: 38%, 1-methoxy-2-propyl acetate: 24%) | — | — | — | — | — | 0.29 | — |
| Urethane acrylate UA-32P (manufactured by Shin Nakamura Chemical Co., Ltd.) | — | — | — | — | — | 0.14 | — |
| Monomer mixture (polymerizable compound (b2-1) described in paragraph [0111] of JP2012-78528A, n = 1: tripentaerythritol octaacrylate percentage content 85%, sum of n = 2 and n = 3 as impurities is 15%) | — | — | — | — | — | 0.36 | — |
| Polymer solution 1 (structural formula P-25 described in paragraph [0058] of JP2008-146018A; weight-average molecular weight = 35,000, acid value = 56 mg KOH/g) | — | — | — | — | — | 1.89 | — |
| MEGAFACE F780 (manufactured by DIC Corporation) | — | — | — | — | — | 0.01 | — |
| MEGAFACE F444 (manufactured by DIC Corporation) | — | — | — | — | — | — | 0.01 |
| Photopolymerization initiator: 2-benzyl-2-dimethylamino-1-(4-morpholinophenyl)-butanone (Irgacure 379, manufactured by BASF SE) | — | — | — | — | — | 0.03 | — |

TABLE 4-continued

| Component | Composition B-1 | Composition B-2 | Composition B-3 | Composition B-4 | Composition B-5 | Composition B-6 | Composition B-7 |
|---|---|---|---|---|---|---|---|
| Photopolymerization initiator: KAYACURE-DETX-S (Alkylthioxanthone manufactured by Nippon Kayaku Co., Ltd.) | — | — | — | — | — | 0.03 | — |
| 1-Methoxy-2-propyl acetate | — | — | — | — | — | 38.73 | — |
| Methyl ethyl ketone | — | — | — | — | — | 56.80 | — |
| Total (parts by mass) | 100 | 100 | 100 | 100 | 100 | 100 | 100 |

2. Production of Transfer Film

Each of the composition for forming a protective film (Compositions 1 to 28) described in Table 1 to Table 3 was applied on a temporary support, which was a polyethylene terephthalate film having a thickness of 16 μm, using a slit-like nozzle, while changing the coating amount so as to obtain the film thickness described in the following Table 6 or Table 7. In Table 1 to Table 3, the numerical values described in the columns for the various compositions represent the contents (parts by mass) of the relevant compounds, and the description of the symbol "–" represents that the relevant component is not incorporated.

After the solvent was volatilized in a dry zone at 120° C. each of the compositions for a second transparent resin layer B-1 to B-7 was applied using a slit-like nozzle while changing the coating amount so as to obtain a film thickness of 0.1 μm, and the composition was dried. After drying, a polyethylene terephthalate film of 16 μm was pressure-bonded as a protective film on the second transparent resin layer. A laminate thus obtained, in which the temporary support, the photosensitive transparent resin layer, and the second transparent resin layer were formed in this layer configuration, was used as the transfer film of each of various Examples and Comparative Examples. In Table 4, the numerical values described in the columns for the various compositions represent the contents (parts by mass) of the relevant compounds, and the description of the symbol "–" represents that the relevant component is not incorporated.

<Refractive Index, and Dried Film Thickness of Photosensitive Transparent Resin Layer>

$n_1$, $n_2$, $T_2$, $\sigma_1$ and $H_1$ were determined as follows, using a reflection spectroscopic thickness meter, FE-3000 (manufactured by Otsuka Electronics Co., Ltd.). The following measurement was carried out under the conditions of 25° C.

(1) A temporary support to be used for each of various Examples and Comparative Examples was cut into a piece having a size of 10 cm in length×10 cm in width. A black polyethylene terephthalate (PET) material was contacted with one surface of the cut temporary support, with a transparent adhesive tape (OCA tape 8171CL: manufactured by 3M Company) interposed therebetween, and thus a laminate (first laminate) was produced. The reflective spectrum (wavelength: 430 to 800 nm) of the first laminate was evaluated using a reflection spectroscopic thickness meter. FE-3000, and the refractive indices no of the temporary support at various wavelengths were determined.

(2) Similarly to the various Examples and Comparative Examples, a sample having only a photosensitive transparent resin layer formed on a temporary support was prepared, and this was cut into a piece having a size of 10 cm in length×10 cm in width. A laminate (second laminate) was produced, in which a black PET material was contacted with the temporary support surface of the cut sample, with a transparent adhesive tape (OCA tape 8171CL; manufactured by 3M Company) interposed therebetween. The second laminate was subjected to a structural analysis using transmission electron microscopy (TEM). The dried film thickness of the photosensitive transparent resin layer was measured at 10 sites, the average value was determined, and a first prospective value $T_1(I)$ of the average value of dried film thicknesses of the photosensitive transparent resin layer was determined. The reflective spectrum (wavelength: 430 to 800 nm) of the second laminate was evaluated using a reflection spectroscopic thickness meter, FE-3000. The refractive indices $n_1$ of the photosensitive transparent resin layer at various wavelengths and a second prospective value $T_1(II)$ of the average value of the dried film thicknesses of the photosensitive transparent resin layer were determined. The refractive index $n_1$ of the photosensitive transparent resin layer at a wavelength of 550 nm is described in the following table. At this time, in order to take account of the reflection at the interface between the photosensitive transparent resin layer and the temporary support, the refractive index $n_1$ and the second prospective value $T_1(II)$ of the second laminate were determined from the reflective spectrum of the second laminate by fitting based on simulation calculation, while having the value of the refractive index no determined in section (1), and the first prospective value $T_1(I)$ inserted into the calculation formula.

(3) The protective film was peeled off from the transfer film of each of the Examples and Comparative Examples, and this was cut into a piece having a size of 10 cm in length×10 cm in width. A sample piece (third laminate) was produced in which a black PET material was contacted with the temporary support surface of the cut transfer film, with a transparent adhesive tape (OCA tape 8171CL; manufactured by 3M Company) interposed therebetween. The sample piece was subjected to a structural analysis using transmission electron microscopy (TEM). The dried film thickness of the second transparent resin layer was measured at 10 sites, the average value was determined, and a prospective value $T_2(I)$ of the average value of the dried film thicknesses of the second transparent resin layer was determined. In regard to the sample piece, the reflective spectrum at 200 measurement points on a straight line in an arbitrary direction at an interval of 0.2 mm at a measurement spot: diameter ϕ 40 μm (that is, 4 cm in length) was evaluated using a reflection spectroscopic thickness meter. FE-3000. This was repeated in five rows at an interval of 1 cm in a direction orthogonal to the direction of the straight line described above, at 1,000 points in total. At this time, in order to take account of the reflection at the interface between the photosensitive transparent resin layer and the temporary support, and the interface between the photosensitive transparent resin layer and the second transparent resin layer, the refractive index $n_2$ of the second transparent resin layer, and the dried film thicknesses of the photosensitive transparent resin layer and the second transparent resin layer at the 1,000 measurement points were determined from the reflective spectrum of the third laminate by fitting based on simulation calculation, while having the refractive index no determined in section (1), the refractive index $n_1$ and the second prospective value $T_1(II)$ determined in section (2), and the first prospective value $T_1(I)$ inserted into the calculation formula. Furthermore, the average values, maximum values, minimum values and standard deviations of the dried film thicknesses of the photosensitive transparent resin layer and the second transparent resin layer were calculated, and $n_2$, $n_1$, $T_2$, $T_1$, $\sigma_2$ and $H_2$ were determined.

In regard to the dried film thickness of the photosensitive transparent resin layer and the dried film thickness of the second transparent resin layer, the accuracy of fitting of the simulation can be increased by inputting the prospective values obtained by performing the structural analysis by TEM, into the reflection spectroscopic thickness meter.

The dried film thickness (thickness) of the photosensitive transparent resin layer, and the refractive index of the second transparent resin layer in the transfer film used for each of the various Examples and Comparative Examples are described in Table 6 and Table 7.

TABLE 5

| Component | Composition C |
|---|---|
| $ZrO_2$: ZR-010 manufactured by Solar Co., Ltd. | 2.08 |
| DPHA liquid (dipentaerythritol hexaacrylate: 38%, dipentaerythritol pentaacrylate: 38%, 1-methoxy-2-propyl acetate: 24%) | 0.29 |
| Monomer mixture (polymerizable compound (b2-1) described in paragraph [0111] of JP2012-78528A, n = 1: tripentaerythritol octaacrylate percentage content 85%, sum of n = 2 and n = 3 as impurities is 15%) | 0.14 |
| Urethane acrylate UA-32P (manufactured by Shin Nakamura Chemical Co., Ltd.) | 0.36 |
| Polymer solution 1 (structural formula P-25 described in paragraph [0058] of JP2008-146018A; weight-average molecular weight: 35,000, acid value = 56 mg KOH/g) | 1.89 |
| Photopolymerization initiator: 2-benzyl-2-dimethylamino-1-(4-morpholinophenyl)-butanone (Irgacure 379, manufactured by BASF SE) | 0.03 |
| Photopolymerization initiator: KAYACURE-DETX-S (Alkylthioxanthone manufactured by Nippon Kayaku Co., Ltd.) | 0.03 |
| MEGAFACE F780 (manufactured by DIC Corporation) | 0.01 |
| 1-Methoxy-2-propyl acetate | 38.73 |
| Methyl ethyl ketone | 56.8 |
| Total (parts by mass) | 100 |

3. Production of Transparent Electrode Pattern Film Used for Production of Transparent Laminate <Formation of Transparent Film>

A cycloolefin resin film having a film thickness of 38 μm and a refractive index of 1.53 was subjected to a corona discharge treatment for 3 seconds at an output voltage of 100% and an output power of 250 W, using a wire electrode having a diameter of 1.2 mm under the conditions of an electrode length of 240 mm and a working electrode distance of 1.5 mm, using a high frequency oscillator. Thus, surface modification was performed, and thereby a transparent film substrate was obtained.

Next, Composition C indicated in Table 5 shown above was applied on the transparent film substrate using a slit-like nozzle, and then Composition C was irradiated with ultraviolet radiation (cumulative amount of light 300 mJ/cm$^2$) and dried at about 110° C. Thus, a transparent film having a refractive index of 1.60 and a film thickness of 80 nm was produced.

<Formation of Transparent Electrode Pattern>

The film having a transparent film laminated on a transparent film substrate obtained as described above was introduced into a vacuum chamber, and an ITO thin film having a thickness of 40 nm and a refractive index of 1.82 was formed by DC Magnetron sputtering (conditions: temperature of transparent film substrate 150° C., argon pressure 0.13 Pa, and oxygen pressure 0.01 Pa) using an ITO target (indium:tin—95:5 (molar ratio)) having a $SnO_2$ percentage content of 10% by mass. Thus, a film in which a transparent film and a transparent electrode layer were formed on a transparent film substrate was obtained. The surface electrical resistance of the ITO thin film was 80 Ω/□.

(Production of Photosensitive Film for Etching E1)

On a polyethylene terephthalate film temporary support having a thickness of 75 μm, a coating liquid for a thermoplastic resin layer composed of Formulation H1 described below was applied using a slit-like nozzle and was dried. Next, a coating liquid for an interlayer composed of Formulation P1 described below was applied similarly to the coating liquid for a thermoplastic resin layer and was dried, and thus a base material having a thermoplastic resin layer and an interlayer on a temporary support was obtained. Furthermore, a coating liquid for a photocurable resin layer for etching composed of Formulation E1 described below was applied and dried similarly to the coating liquid for a thermoplastic resin layer. In this manner, a laminate in which a thermoplastic resin layer having a dried film thickness of 15.1 μm, an interlayer having a dried film thickness of 1.6 μm, and a photocurable resin layer for etching having a film thickness of 2.0 μm were formed on a temporary support, was obtained, and at the end, a protective film (polypropylene film having a thickness of 12 μm) was pressure bonded thereto. Thus, a photosensitive film for etching E1, which was a transfer material in which a temporary support, a thermoplastic resin layer, an interlayer (oxygen barrier film), a photocurable resin layer for etching, and a protective film were integrated, was produced.

—Coating Liquid for Photocurable Resin Layer for Etching: Formulation E1—

Methyl methacrylate/styrene/methacrylic acid copolymer (copolymer composition (mass %): 31/40/29, mass average molecular weight 60,000, acid value 163 mg KOH/g): 16 parts Monomer 1 (trade name: BPE-500, manufactured by Shin Nakamura Chemical Co., Ltd.): 5.6 parts Tetraethylene oxide monomethacrylate 0.5 mol-adduct of hexamethylene diisocyanate: 7 parts Cyclohexanedimethanol monoacrylate as compound having one polymerizable group in molecule: 2.8 parts 2-Chloro-N-butylacridone: 0.42 parts 2,2-Bis(o-chlorophenyl)-4,4',5,5'-tetraphenylbiimidazole: 2.17 parts Malachite Green oxalate: 0.02 parts Leuco Crystal Violet: 0.26 parts Phenothiazine: 0.013 parts Surfactant (trade name: MEGAFACE F-780F, manufactured by DIC Corporation): 0.03 parts Methyl ethyl ketone: 40 parts 1-Methoxy-2-propanol: 20 parts The viscosity at 100° C. after solvent removal of the coating liquid for a photocurable resin layer for etching E1 was 2,500 Pa·sec.

—Coating Liquid for Thermoplastic Resin Layer: Formulation H1—
Methanol: 11.1 parts
Propylene glycol monomethyl ether acetate: 6.36 parts
Methyl ethyl ketone: 52.4 parts
Methyl methacrylate/2-ethylhexyl acrylate/benzyl methacrylate/methacrylic acid copolymer (copolymerization compositional ratio (molar ratio)=55/11.7/4.5/28.8, molecular weight=100,000, Tg≈70° C.): 5.83 parts
Styrene/acrylic acid copolymer (copolymerization compositional ratio (molar ratio)=63/37, weight-average molecular weight=10,000, Tg a 100° C.): 13.6 parts
Monomer-1 (trade name: BPE-500, manufactured by Shin Nakamura Chemical Co., Ltd.): 9.1 parts
Fluorine-based polymer: 0.54 parts
The fluorine-based polymer was a copolymer of 40 parts of $C_6F_{13}CH_2CH_2OCOCH=CH_2$, 55 parts of $H(OCH(CH_3)CH_2)_7OCOCH=CH_2$, and 5 parts of $H(OCH_2CH_2)_7OCOCH=CH_2$, having a weight-average molecular weight of 30,000, in the form of a 30 mass % solution in methyl ethyl ketone (trade name: MEGAFACE F780F, manufactured by DIC Corporation).

—Coating Liquid for Interlayer: Formulation P1—
Polyvinyl alcohol: 32.2 parts by mass
(trade name: PVA205, manufactured by Kuraray Co., Ltd., degree of saponification=88/%, degree of polymerization 550)
Polyvinylpyrrolidone: 14.9 parts by mass
(trade name: K-30, manufactured by ISP Japan, Ltd.)
Distilled water: 524 parts by mass
Methanol: 429 parts by mass (Formation of Transparent Electrode Pattern)
A film having a transparent film and a transparent electrode layer formed on a transparent film substrate was washed, and the photosensitive film for etching E1, from which the protective film had been removed, was laminated such that the surface of the transparent electrode layer and the surface of the photocurable resin layer for etching would face each other (temperature of transparent film substrate 130° C., rubber roller temperature 120° C., linear pressure 100 N/cm, conveyance speed 2.2 m/min). Next, the temporary support was peeled off, and then the photosensitive film was patternwise exposed at an amount of exposure of 50 mJ/cm² (i-ray) by setting the distance between an exposure mask (quartz exposure mask having a transparent electrode pattern) surface and the photocurable resin layer for etching to 200 μm.

Next, the resultant was subjected to a developing treatment for 100 seconds at 25° C. using a triethanolamine-based developer (containing 30% by mass of triethanolamine, liquid obtained by diluting trade name: T-PD2 (manufactured by Fujifilm Corporation) 10 times with pure water), and to a washing treatment for 20 seconds at 33° C. using a surfactant-containing washing liquid (liquid obtained by diluting trade name: T-SD3 (manufactured by Fujifilm Corporation) 10 times with pure water), and residue removal was carried out using a rotating brush by spraying ultrapure water through an ultrahigh pressure washing nozzle. The resultant was further subjected to a post-bake treatment for 30 minutes at 130° C. Thus, a film having a transparent film, a transparent electrode layer and a photocurable resin layer pattern for etching formed on a transparent film substrate was obtained.

The film having a transparent film, a transparent electrode layer and a photocurable resin layer pattern for etching formed on a transparent film substrate was immersed in an etching tank containing an ITO etchant (hydrochloric acid, aqueous solution of potassium chloride, liquid temperature: 30° C.) and treated for 100 seconds (etching treatment). Thus, the transparent electrode layer in an exposed region that was not covered by the photocurable resin layer for etching was dissolved and removed. In this manner, a transparent electrode pattern-attached film having a photocurable resin layer pattern for etching was obtained.

Next, the transparent electrode pattern-attached film having a photocurable resin layer pattern for etching was immersed in a resist peeling tank containing a resist peeling solution (N-methyl-2-pyrrolidone, monoethanolamine, and a surfactant (trade name: SURFYNOL 465, manufactured by Air Products & Chemicals, Inc.), liquid temperature 45° C.) and was subjected to a peeling treatment for 200 seconds. Thus, the photocurable resin layer for etching was removed. In this manner, a film having a transparent film and a transparent electrode pattern formed on a transparent film substrate was obtained.

4. Production of Transparent Laminates of Various Examples and Comparative Examples Each of the transfer films of various Examples and Comparative Examples, from which the protective film had been peeled off, was used, and each of the transfer films of various Examples and Comparative Examples was transferred such that the second transparent resin layer would cover the transparent film and the transparent electrode pattern of the film having a transparent film and a transparent electrode pattern formed on a transparent film substrate (temperature of transparent film substrate: 40° C., rubber roller temperature: 110° C., linear pressure: 3 N/cm, conveyance speed: 2 m/min).

Subsequently, the laminate was patternwise exposed at an amount of exposure of 100 mJ/cm² (i-ray) through the temporary support, using a proximity type exposure machine (manufactured by Hitachi High-Tech Electronics Engineering Co., Ltd.) having an ultrahigh pressure mercury lamp, by setting the distance between the exposure mask (quartz exposure mask having a pattern for forming an overcoat) and the temporary support to 125 μm. After the temporary support was peeled off, the laminate was subjected to a washing treatment for 60 seconds using a 2% aqueous solution of sodium carbonate at 32° C. Ultrapure water was sprayed onto the transparent film substrate after the washing treatment, through an ultrahigh pressure washing nozzle, and thus residue was removed. Subsequently, air was blown to remove water on the transparent film substrate, and the laminate was subjected to a post-bake treatment for 30 minutes at 145° C. In this manner, each of the transparent laminates of various Examples and Comparative Examples, in which a transparent film, a transparent electrode pattern, a second transparent resin layer and a photosensitive transparent resin layer were laminated on a transparent film substrate in this layer configuration, was formed.

<Evaluation of Resistance to Moist Heat after Salt Water Application>

Using each of the transfer films of various Examples and Comparative Examples, from which the protective film had been peeled off, the second transparent resin layer and the photosensitive transparent resin layer were transferred onto a PET film having a copper foil laminated thereon (manufactured by Geomatec Co., Ltd.) in the same manner as in the case of transfer onto a transparent electrode pattern base material, and post-processes were performed. 5 cc of salt water having a concentration of 50 g/L was added dropwise onto the film surface and was spread uniformly over 50 cm², and then water was volatilized at room temperature. The resultant was left for 24 hours in a high temperature and high humidity environment (85° C., relative humidity 85%). Subsequently, the salt water was wiped out, the sample surface state was observed, and thus the resistance to moist heat after salt water application was evaluated according to the following evaluation criteria. Grades A to C are required for practical use, and Grade A or B is preferred, while Grade A is more preferred. The evaluation results are described in Table 6 or Table 7.

As the result for the evaluation of the resistance to moist heat after salt water application is good, it means that the sample has excellent perspiration resistance.

[Evaluation Criteria]

A: No change at all in both the copper surface and the protective film surface

B: Slight marks are seen on the protective film surface, but no change in copper C: Marks are seen on the protective film surface, but no change in copper D: Copper has undergone color change.

(Evaluation of Transparent Laminate)

<Evaluation of Chipping after Developing>

Each of the transparent laminates of various Examples and Comparative Examples obtained after patternwise exposure and a washing treatment with a 2% aqueous solution of sodium carbonate was subjected to observation with a microscope to see the presence or absence of chipping in the pattern. Grade A or B is required for practical use, and Grade A is more preferred. The evaluation results are described in Table 6 or Table 7.

[Evaluation Criteria]

A: Chipping in the pattern is not observed at all.

B: Chipping in the pattern is not observed, but lifting is observed around the pattern.

C: Chipping in the pattern is observed.

<Evaluation of Adhesiveness>

A 100-square grid cross-cut test was carried out by making reference to the JIS standards (K 5400). Incisions were inserted in a lattice pattern such that each side measured 1 mm, using a cutter knife, on the photosensitive transparent resin layer that was the test surface of each of the transparent laminates of various Examples and Comparative Examples, and transparent adhesive tape #600 (manufactured by 3M Company) was strongly pressure-bonded thereto. The tape was peeled off in the 180° direction, and then the state of the lattice pattern was observed. Thus, adhesiveness was evaluated according to the following criteria. Grade A. B or C is required for practical use, and Grade A or B is preferred, while Grade A is more preferred. The evaluation results are described in Table 6 or Table 7.

[Evaluation Criteria]

A: Almost 100% of the entire area is closely adhered.

B: 95% or more and less than 100% of the entire area remains closely adhered.

C: 65% or more and less than 95% of the entire area remains closely adhered.

D: 35% or more and less than 65% of the entire area remains closely adhered.

E: The portion remaining closely adhered is less than 35% of the entire area.

<Evaluation of Developability>

Each of the transfer films of various Examples and Comparative Examples was transferred onto a transparent film substrate, and then the transfer film was patternwise exposed at an amount of exposure of 100 mJ/cm$^2$ (i-ray) through the temporary support, using a proximity type exposure machine (manufactured by Hitachi High-Tech Electronics Engineering Co., Ltd.) having an ultrahigh pressure mercury lamp, by setting the distance between the exposure mask (quartz exposure mask having a pattern for forming an overcoat) and the temporary support to 125 μm. After the temporary support was peeled off, the laminate was subjected to a washing treatment for 60 seconds using a 2% aqueous solution of sodium carbonate at 32° C. Subsequently, visual inspection and observation with an optical microscope were implemented. Grade A, B, C or D is preferred: Grade A. B or C is more preferred; Grade A or B is particularly preferred: and Grade A is more particularly preferred. The evaluation results are described in Table 6 or Table 7.

[Evaluation Criteria]

A: Residue is not recognized in the unexposed area even with a microscope.

B: Residue is not recognized in the unexposed area by visual inspection.

C: Residue is recognizable by visual inspection in the unexposed area.

D: Undeveloped parts exist in the unexposed area, and a large amount of residue is recognizable by visual inspection.

E: The temporary support cannot be peeled off from the substrate, and developability cannot be evaluated.

<Evaluation of Transparent Electrode Pattern Concealability>

Each of the transparent laminates of various Examples and Comparative Examples, in which a transparent film, a transparent electrode pattern, a second transparent resin layer and a photosensitive transparent resin layer were laminated in this layer configuration on a transparent film substrate, was adhered to a black PET material, with a transparent adhesive tape (manufactured by 3M Company, trade name: OCA Tape 8171CL) being interposed therebetween. The entire substrate was shielded from light.

Transparent electrode pattern concealability was carried out by causing light to enter through the glass surface side of a substrate thus produced using a fluorescent lamp (light source) in a dark room, and visually observing the light reflected at the glass surface from an oblique direction. Grade A. B. C or D is preferred; Grade A. B or C is more preferred: Grade A or B is particularly preferred; and Grade A is more particularly preferred. The evaluation results are described in Table 6 or Table 7.

[Evaluation Criteria]

A: The transparent electrode pattern is not at all seen.

B: The transparent electrode pattern is slightly seen but almost invisible.

C: The transparent electrode pattern is seen (hard to recognize).

D: The transparent electrode pattern is seen but to an acceptable level.

E: The transparent electrode pattern is clearly seen (easily recognizable).

TABLE 6

| | | Photosensitive transparent resin layer | | | Second transparent resin layer | | Resistance to moist heat after salt water application | Chipping after developing | Adhesiveness | Developability | Transparent electrode pattern concealability |
|---|---|---|---|---|---|---|---|---|---|---|---|
| | Base material | Material | Thickness | Refractive index | Material | Refractive index | | | | | |
| Example 1 | PET film (16 μm) | Composition 1 | 7 μm | 1.51 | Composition B-1 | 1.65 | B | A | B | A | A |

TABLE 6-continued

| | Base material | Photosensitive transparent resin layer | | | Second transparent resin layer | | Resistance to moist heat after salt water application | Chipping after developing | Adhesiveness | Developability | Transparent electrode pattern concealability |
|---|---|---|---|---|---|---|---|---|---|---|---|
| | | Material | Thickness | Refractive index | Material | Refractive index | | | | | |
| Example 2 | PET film (16 μm) | Composition 2 | 7 μm | 1.52 | Composition B-1 | 1.65 | A | A | A | A | A |
| Example 3 | PET film (16 μm) | Composition 3 | 7 μm | 1.52 | Composition B-1 | 1.65 | A | A | A | A | A |
| Example 4 | PET film (16 μm) | Composition 4 | 7 μm | 1.51 | Composition B-1 | 1.65 | A | A | A | A | A |
| Example 5 | PET film (16 μm) | Composition 5 | 7 μm | 1.52 | Composition B-1 | 1.65 | A | B | A | A | A |
| Example 6 | PET film (16 μm) | Composition 6 | 7 μm | 1.52 | Composition B-1 | 1.65 | A | A | A | A | A |
| Example 7 | PET film (16 μm) | Composition 7 | 7 μm | 1.51 | Composition B-1 | 1.65 | A | A | B | A | A |
| Example 8 | PET film (16 μm) | Composition 8 | 7 μm | 1.52 | Composition B-1 | 1.65 | B | A | B | A | A |
| Example 9 | PET film (16 μm) | Composition 9 | 7 μm | 1.52 | Composition B-1 | 1.65 | A | A | C | A | A |
| Example 10 | PET film (16 μm) | Composition 10 | 7 μm | 1.52 | Composition B-1 | 1.65 | A | A | C | A | A |
| Example 11 | PET film (16 μm) | Composition 11 | 7 μm | 1.51 | Composition B-1 | 1.65 | A | A | B | A | A |
| Example 12 | PET film (16 μm) | Composition 12 | 7 μm | 1.51 | Composition B-1 | 1.65 | A | A | A | A | A |
| Example 13 | PET film (16 μm) | Composition 13 | 7 μm | 1.52 | Composition B-1 | 1.65 | A | A | A | A | A |
| Example 14 | PET film (16 μm) | Composition 14 | 7 μm | 1.51 | Composition B-1 | 1.65 | A | A | A | A | A |
| Example 15 | PET film (16 μm) | Composition 2 | 7 μm | 1.52 | None | — | A | A | A | A | D |
| Example 16 | PET film (16 μm) | Composition 2 | 7 μm | 1.52 | Composition B-2 | 1.65 | A | A | A | A | A |
| Example 17 | PET film (16 μm) | Composition 2 | 7 μm | 1.52 | Composition B-3 | 1.65 | A | A | A | A | A |
| Example 18 | PET film (16 μm) | Composition 2 | 7 μm | 1.52 | Composition B-4 | 1.65 | A | A | A | A | A |

TABLE 7

| | Base material | Photosensitive transparent resin layer | | | Second transparent resin layer | | Resistance to moist heat after salt water application | Chipping after developing | Adhesiveness | Developability | Transparent electrode pattern concealability |
|---|---|---|---|---|---|---|---|---|---|---|---|
| | | Material | Thickness | Refractive index | Material | Refractive index | | | | | |
| Example 19 | PET film (16 μm) | Composition 2 | 7 μm | 1.52 | Composition B-5 | 1.65 | A | A | A | A | A |
| Example 20 | PET film (16 μm) | Composition 2 | 7 μm | 1.52 | Composition B-6 | | | | | | |

TABLE 7-continued

| | Base material | Photosensitive transparent resin layer | | | Second transparent resin layer | | Resistance to moist heat after salt water application | Chipping after developing | Adhesiveness | Developability | Transparent electrode pattern concealability |
|---|---|---|---|---|---|---|---|---|---|---|---|
| | | Material | Thickness | Refractive index | Material | Refractive index | | | | | |
| Example 21 | PET film (16 μm) | Composition 15 | 7 μm | 1.52 | Composition B-1 | 1.65 | C | A | B | A | A |
| Example 22 | PET film (16 μm) | Composition 16 | 7 μm | 1.52 | Composition B-1 | 1.65 | C | A | C | A | A |
| Example 23 | PET film (16 μm) | Composition 17 | 7 μm | 1.52 | Composition B-1 | 1.65 | C | A | C | A | A |
| Example 24 | PET film (16 μm) | Composition 23 | 7 μm | 1.52 | Composition B-7 | 1.65 | A | A | A | B | A |
| Example 25 | PET film (16 μm) | Composition 23 | 9 μm | 1.52 | Composition B-7 | 1.65 | A | A | A | C | A |
| Example 26 | PET film (16 μm) | Composition 23 | 12 μm | 1.52 | Composition B-7 | 1.65 | A | A | B | D | A |
| Example 27 | PET film (16 μm) | Composition 24 | 9 μm | 1.52 | Composition B-7 | 1.65 | A | A | A | A | A |
| Example 28 | PET film (16 μm) | Composition 25 | 9 μm | 1.52 | Composition B-7 | 1.65 | A | A | A | A | A |
| Example 29 | PET film (16 μm) | Composition 26 | 9 μm | 1.52 | Composition B-7 | 1.65 | A | A | A | B | A |
| Example 30 | PET film (16 μm) | Composition 27 | 9 μm | 1.51 | Composition B-7 | 1.65 | A | A | A | B | A |
| Example 31 | PET film (16 μm) | Composition 28 | 9 μm | 1.52 | Composition B-7 | 1.65 | A | A | A | A | A |
| Comparative Example 1 | PET film (16 μm) | Composition 18 | 7 μm | 1.52 | Composition B-1 | 1.65 | D | A | B | A | A |
| Comparative Example 2 | PET film (16 μm) | Composition 19 | 7 μm | 1.51 | Composition B-1 | 1.65 | D | A | B | A | A |
| Comparative Example 3 | PET film (16 μm) | Composition 20 | 7 μm | 1.51 | Composition B-1 | 1.65 | D | A | C | A | A |
| Comparative Example 4 | PET film (16 μm) | Composition 21 | 7 μm | 1.51 | Composition B-1 | 1.65 | D | A | E | A | A |
| Comparative Example 5 | PET film (16 μm) | Composition 22 | 7 μm | 1.51 | Composition B-1 | 1.65 | D | A | E | A | A |

From Table 6 and Table 7 described above, it was understood that the transfer films of the invention exhibited satisfactory adhesiveness after post-bake of the photosensitive transparent resin layer after transfer, and exhibited satisfactory resistance to moist heat after salt water application after the photosensitive transparent resin layer after transfer had been post-baked.

In Comparative Examples 1 to 5 that did not contain the compound represented by Formula 1, the results of the test for resistance to moist heat were inferior.

The thicknesses and the refractive indices of the photosensitive resin layer and the second transparent resin layer in the transparent laminate were measured for various Examples and Comparative Examples by the methods for measuring the thickness and the refractive index in a laminate as described above. As a result, the measured values of the thicknesses and the refractive indices of the photosensitive resin layer and the second transparent resin layer had the same values as the thicknesses and the refractive indices of the photosensitive resin layer and the second transparent resin layer in the transfer film.

Furthermore, in Example 5 that did not contain Component D, slightly poor results in terms of chipping after developing were obtained.

In regard to the results of Example 15 that did not have a second transparent resin layer, results with poor concealability of the transparent electrode pattern were obtained.

Furthermore, in Examples 21 to 23 in which the content of Component A was not in the range of 50% to 90% by mass with respect to the total mass of monomer components, slightly poor results in the moist heat test results were obtained.

(Production of Image Display Device (Touch Panel))

A film including each of the transparent laminates of various Examples produced previously was bonded to a liquid crystal display device produced by the method described in paragraphs 0097 to 0119 of JP2009-47936A, and a front glass plate was adhered thereto. Thus, image display devices including the transparent laminates of various Examples, which included a capacitive input device as a constituent element, were produced by a known method.

<Evaluation of Capacitive Input Device and Image Display Device>

In the capacitive input devices and image display devices including the transparent laminates of various Examples, warpage occurred to a reduced extent even after curing of the photosensitive transparent resin layer, there was no problem with lifting or peeling because of satisfactory adhesiveness to the substrate, and the resistance to moist heat after salt water application was observed.

In the capacitive input devices and the image display devices including the transparent laminates of Examples 1 to 14 and 16 to 31, which were preferred embodiments of the invention, there was no problem of the transparent electrode pattern being visually recognized.

The photosensitive transparent resin layer, the second transparent resin layer and the like did not have defects such as air bubbles, and image display devices having excellent display characteristics were obtained.

EXPLANATION OF REFERENCES

1: transparent substrate (transparent film substrate or front face plate)
2: mask layer
3: transparent electrode pattern (first transparent electrode pattern)
3a: pad part
3b: connection part
4: transparent electrode pattern (second transparent electrode pattern)
5: insulating layer
6: metal wiring section
7: photosensitive transparent resin layer
8: opening
9: metal wiring section
10: capacitive input device
11: transparent film
12: second transparent resin layer
13: laminate
14: partial region on metal wiring section
21: region in which transparent electrode pattern, second transparent resin layer, and photosensitive transparent resin layer are laminated in this layer configuration
22: non-patterned region
26: temporary support
29: protective release layer (protective film)
30: transfer film
31: terminal of lead wiring
33: cured area of photosensitive transparent resin layer and second transparent resin layer
34: opening corresponding to terminal of lead wiring (uncured area of photosensitive transparent resin layer and second transparent resin layer)
α: taper angle

What is claimed is:

1. A composition for forming a touch panel electrode protective film, the composition comprising:
a compound represented by Formula 1 as Component A;
a binder polymer as Component B;
a photopolymerization initiator as Component C, and
two or more of polymerizable compounds having three or more polymerizable groups as Component D:

$$Q^2\text{-}R^1\text{-}Q^1 \qquad (1)$$

in Formula 1, $Q^1$ and $Q^2$ each independently represent a (meth)acryloyloxy group or a (meth)acryloyloxyalkyl group; and $R^1$ represents a divalent hydrocarbon group,
wherein the content of Component A is 55% to 90% by mass with respect to the total mass of the monomer components in the composition.

2. The composition for forming a touch panel electrode protective film according to claim 1, wherein the I/O value of Component A is 0.6 or less.

3. The composition for forming a touch panel electrode protective film according to claim 1, wherein $R^1$ represents a hydrocarbon group having 1 to 12 carbon atoms.

4. The composition for forming a touch panel electrode protective film according to claim 1, wherein the content of Component A is 55% to 80% by mass with respect to the total mass of the monomer components in the composition.

5. The composition for forming a touch panel electrode protective film according to claim 1,
wherein the I/O value of Component A is 0.6 or less,
$R^1$ represents a hydrocarbon group having 1 to 12 carbon atoms, and
the content of Component A is 55% to 90% by mass with respect to the total mass of the monomer components in the composition.

6. A transfer film comprising:
a temporary support; and
a photosensitive transparent resin layer formed of the composition for forming a touch panel electrode protective film according to claim 1.

7. The transfer film according to claim 6, further comprising:
a second transparent resin layer on the photosensitive transparent resin layer,
wherein the refractive index of the second transparent resin layer is higher than the refractive index of the photosensitive transparent resin layer.

8. A method for forming a protective film for a touch panel electrode, the method comprising:
providing a photosensitive transparent resin layer on a base material having a touch panel electrode, using the transfer film according to claim 6;
exposing at least a portion of the photosensitive transparent resin layer to active light rays; and
developing the exposed photosensitive transparent resin layer, in this order.

9. A protective film for a touch panel electrode, which is produced by the method for forming a protective film for a touch panel electrode according to claim 8.

10. A capacitive input device comprising:
the protective film for a touch panel electrode according to claim 9.

11. An image display device comprising:
the capacitive input device according to claim 10 as a constituent element.

12. A laminate comprising:
a base material;
a touch panel electrode disposed on the base material;

a second transparent resin layer disposed on the touch panel electrode; and a photosensitive transparent resin layer disposed on the second transparent resin layer, wherein the photosensitive transparent resin layer is a layer obtained by curing the composition for forming a touch panel electrode protective film according to claim 1, and the refractive index of the second transparent resin layer is higher than the refractive index of the photosensitive transparent resin layer.

13. A capacitive input device comprising:
the laminate according to claim 12.

14. An image display device comprising:
the capacitive input device according to claim 13 as a constituent element.

15. A method for forming a protective film for a touch panel electrode, the method comprising:
providing a photosensitive transparent resin layer formed of the composition for forming a touch panel electrode protective film according to claim 1, on a base material having a touch panel electrode;
exposing at least a portion of the photosensitive transparent resin layer to active light rays; and
developing the exposed photosensitive transparent resin layer, in this order.

16. A protective film for a touch panel electrode, which is produced by the method for forming a protective film for a touch panel electrode according to claim 15.

17. A capacitive input device comprising:
the protective film for a touch panel electrode according to claim 16.

18. An image display device comprising:
the capacitive input device according to claim 17 as a constituent element.

19. The composition for forming a touch panel electrode protective film according to claim 1, wherein the photopolymerization initiator is an oxime ester compound.

20. The composition for forming a touch panel electrode protective film according to claim 1, wherein the binder polymer is an acrylic polymer having an acidic group.

21. A composition for forming a touch panel electrode protective film, the composition comprising:
a compound represented by Formula 1 as Component A;
a binder polymer as Component B;
a photopolymerization initiator as Component C, and
a polymerizable compound having five or more polymerizable groups as Component D:

$$Q^2\text{-}R^1\text{-}Q^1 \qquad (1)$$

in Formula 1, $Q^1$ and $Q^2$ each independently represent a (meth)acryloyloxy group or a (meth)acryloyloxyalkyl group; and $R^1$ represents a divalent hydrocarbon group,
wherein the content of Component A is 55% to 80% by mass with respect to the total mass of the monomer components in the composition.

22. A composition for forming a touch panel electrode protective film, the composition comprising:
a compound represented by Formula 1 as Component A;
an acrylic polymer having an acidic group as Component B;
a photopolymerization initiator as Component C, and
a polymerizable compound having three or more polymerizable groups as Component D:

$$Q^2\text{-}R^1\text{-}Q^1 \qquad (1)$$

in Formula 1, $Q^1$ and $Q^2$ each independently represent a (meth)acryloyloxy group or a (meth)acryloyloxyalkyl group; and $R^1$ represents a divalent hydrocarbon group,
wherein the content of Component A is 55% to 90% by mass with respect to the total mass of the monomer components in the composition.

* * * * *